US012593524B2

(12) United States Patent
Ohira et al.

(10) Patent No.: US 12,593,524 B2
(45) Date of Patent: Mar. 31, 2026

(54) SEMICONDUCTOR PACKAGE

(71) Applicant: SONY SEMICONDUCTOR SOLUTIONS CORPORATION, Kanagawa (JP)

(72) Inventors: Hikaru Ohira, Kanagawa (JP); Ninao Sato, Kanagawa (JP); Yiochiro Fujinaga, Kanagawa (JP); Atsushi Tsukada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 701 days.

(21) Appl. No.: 17/626,444

(22) PCT Filed: May 22, 2020

(86) PCT No.: PCT/JP2020/020224
§ 371 (c)(1),
(2) Date: Jan. 11, 2022

(87) PCT Pub. No.: WO2021/014731
PCT Pub. Date: Jan. 28, 2021

(65) Prior Publication Data
US 2022/0246665 A1      Aug. 4, 2022

(30) Foreign Application Priority Data
Jul. 23, 2019      (JP) ................................. 2019-135043

(51) Int. Cl.
*H10F 39/00*          (2025.01)
(52) U.S. Cl.
CPC ......... *H10F 39/811* (2025.01); *H10F 39/026* (2025.01); *H10F 39/804* (2025.01); *H10F 39/809* (2025.01); *H10F 39/018* (2025.01)

(58) Field of Classification Search
CPC ......... H01L 27/14636; H01L 27/14634; H01L 23/3128; H10F 39/811; H10F 39/026; H10F 39/804; H10F 39/809; H10F 39/8023
See application file for complete search history.

(56) References Cited

U.S. PATENT DOCUMENTS

| | | |
|---|---|---|
| 2007/0029582 A1 | 2/2007 | Minamio et al. |
| 2007/0241451 A1 | 10/2007 | Koizumi et al. |
| | (Continued) | |

FOREIGN PATENT DOCUMENTS

| | | |
|---|---|---|
| CN | 1909237 A | 2/2007 |
| CN | 101064329 A | 10/2007 |
| | (Continued) | |

OTHER PUBLICATIONS

International Search Report and Written Opinion of PCT Application No. PCT/JP2020/020224, issued on Aug. 11, 2020, 13 pages of ISRWO.

*Primary Examiner* — Jessica S Manno
*Assistant Examiner* — Ricky Verdes
(74) *Attorney, Agent, or Firm* — CHIP LAW GROUP

(57) ABSTRACT

A yield drop of a semiconductor package including a via is reduced. The semiconductor package includes a solid-state imaging element, a circuit layer, a wiring layer, and a support substrate. The solid-state imaging element in the semiconductor package generates image data. A signal processing circuit that performs predetermined signal processing on the image data is disposed in the circuit layer. An output side via the other end of which is connected to an external terminal penetrates the support substrate. The wiring layer is disposed between the support substrate and the
(Continued)

circuit layer. A signal line that connects the signal processing circuit and one end of the output side via is wired in the wiring layer.

21 Claims, 48 Drawing Sheets

(56)                    References Cited

U.S. PATENT DOCUMENTS

| | | |
|---|---|---|
| 2007/0252227 A1 | 11/2007 | Fukuda et al. |
| 2008/0308928 A1 | 12/2008 | Chang |
| 2011/0304008 A1* | 12/2011 | Yang ........................ H01L 24/11 |
| | | 257/737 |
| 2012/0273908 A1 | 11/2012 | Kinsman |
| 2014/0197506 A1 | 7/2014 | Watanabe |
| 2018/0145104 A1* | 5/2018 | Kim .................... H01L 27/1462 |
| 2018/0158860 A1 | 6/2018 | Roy |
| 2018/0286902 A1 | 10/2018 | Hokari et al. |
| 2019/0074399 A1 | 3/2019 | Masuda |
| 2020/0020733 A1 | 1/2020 | Fujii et al. |
| 2020/0105813 A1 | 4/2020 | Hashiguchi |
| 2020/0177829 A1 | 6/2020 | Takahashi et al. |

FOREIGN PATENT DOCUMENTS

| | | |
|---|---|---|
| CN | 108140648 A | 6/2018 |
| CN | 108701698 A | 10/2018 |
| CN | 110476228 A | 11/2019 |
| CN | 110914993 A | 3/2020 |
| EP | 1848034 A2 | 10/2007 |
| EP | 2657971 A2 | 10/2013 |
| JP | 07-204162 A | 8/1995 |
| JP | 2000-253203 A | 9/2000 |
| JP | 2001-320036 A | 11/2001 |
| JP | 2007-042879 A | 2/2007 |
| JP | 2007-287967 A | 11/2007 |
| JP | 2007-299929 A | 11/2007 |
| JP | 2008-160648 A | 7/2008 |
| JP | 2014-099582 A | 5/2014 |
| JP | 2016-086091 A | 5/2016 |
| JP | 2017-175004 A | 9/2017 |
| JP | 2019-029979 A | 2/2019 |
| TW | 201909440 A | 3/2019 |
| WO | 2017/061296 A1 | 4/2017 |
| WO | 2017/163927 A1 | 9/2017 |
| WO | 2018/186027 A1 | 10/2018 |
| WO | WO-2018186196 A1 | 10/2018 |
| WO | 2019/021705 A1 | 1/2019 |
| WO | 2019/026717 A1 | 2/2019 |
| WO | WO-2019087764 A1 | 5/2019 |
| WO | WO-2019131965 A1 | 7/2019 |

* cited by examiner

F I G . 1
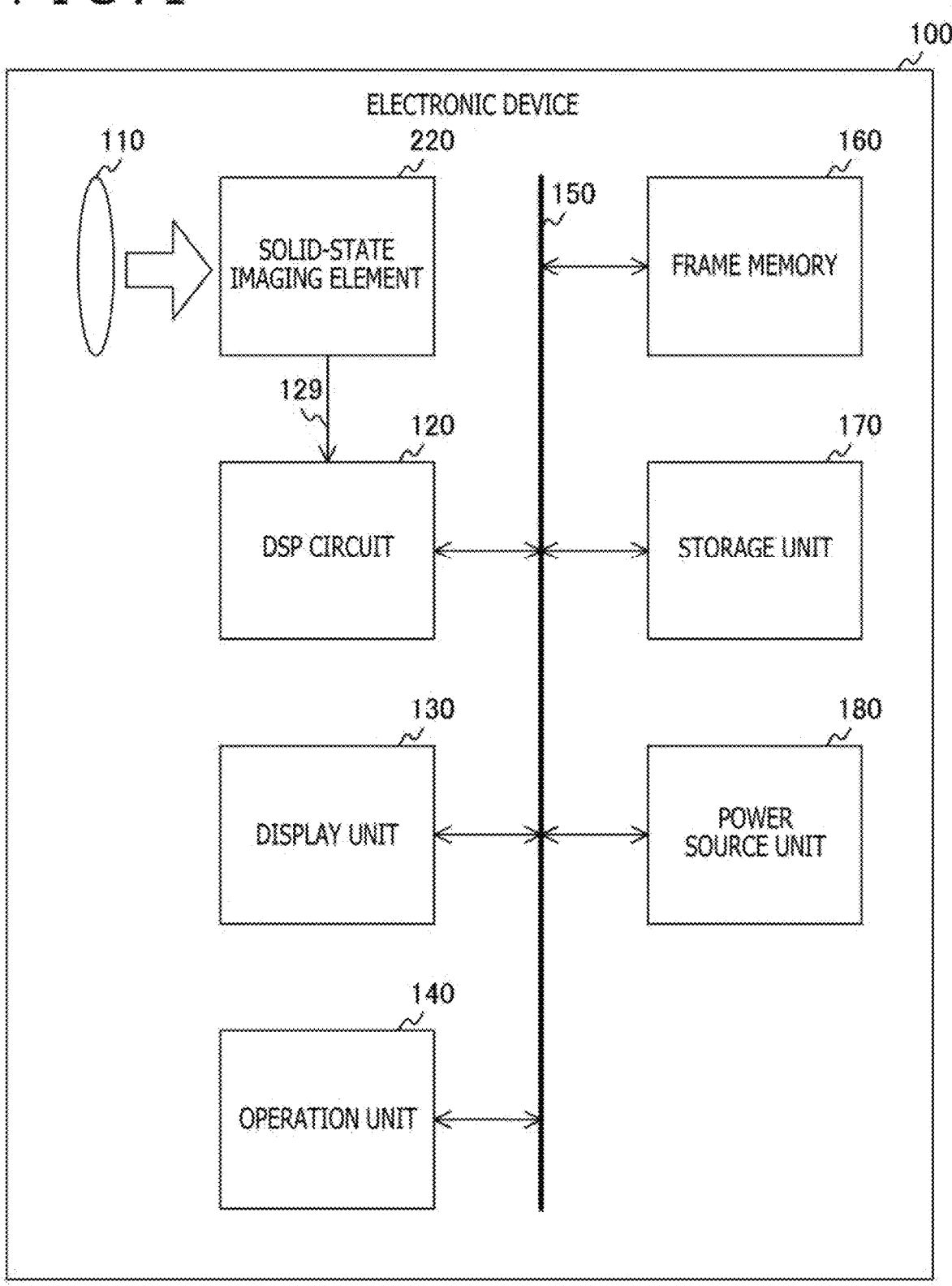

F I G . 5
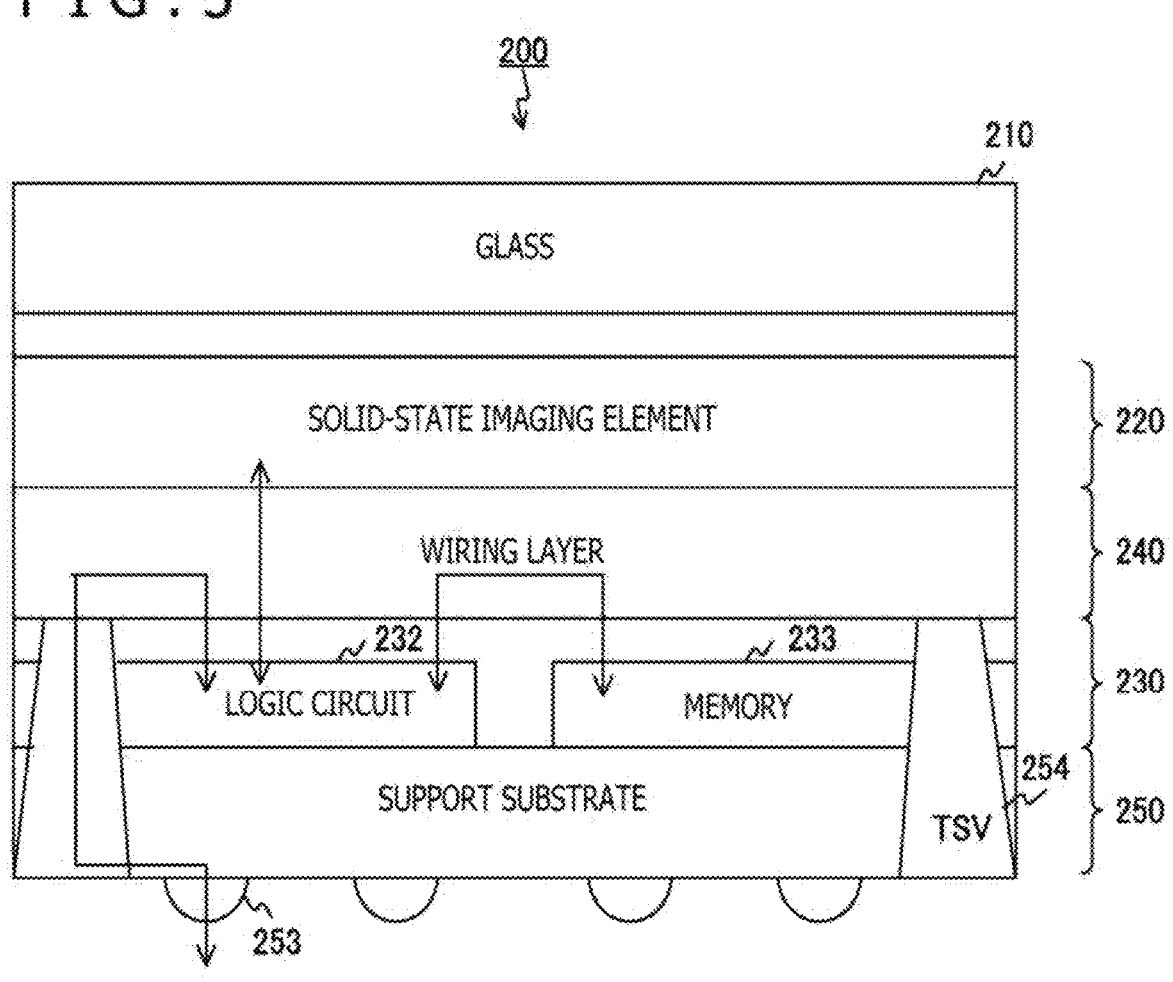

230

230

231                   234

F I G . 9
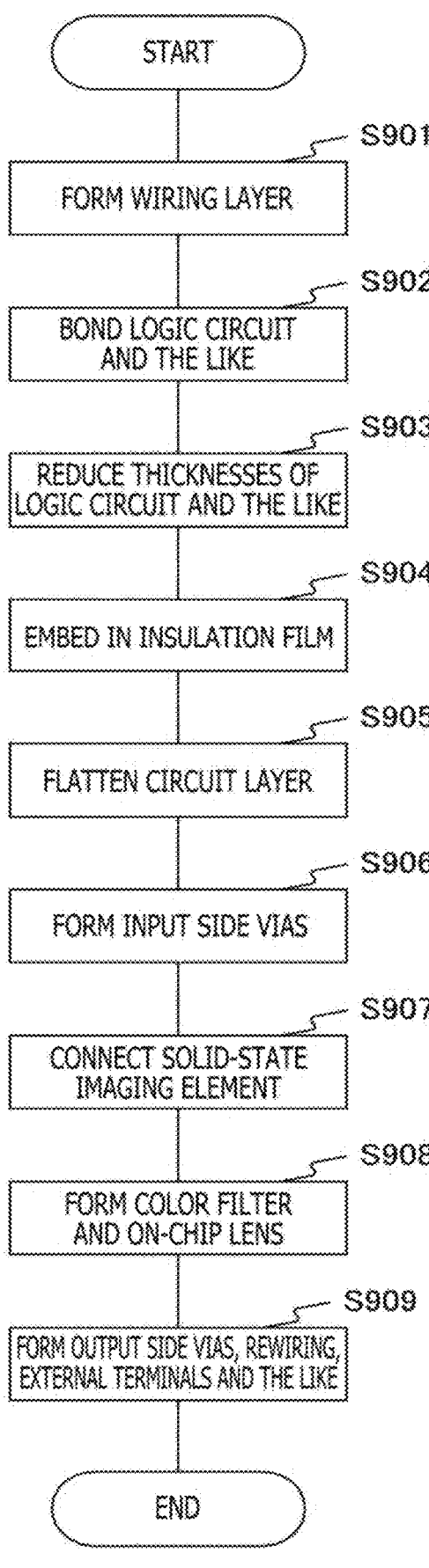
START
FORM WIRING LAYER — S901
BOND LOGIC CIRCUIT AND THE LIKE — S902
REDUCE THICKNESSES OF LOGIC CIRCUIT AND THE LIKE — S903
EMBED IN INSULATION FILM — S904
FLATTEN CIRCUIT LAYER — S905
FORM INPUT SIDE VIAS — S906
CONNECT SOLID-STATE IMAGING ELEMENT — S907
FORM COLOR FILTER AND ON-CHIP LENS — S908
FORM OUTPUT SIDE VIAS, REWIRING, EXTERNAL TERMINALS AND THE LIKE — S909
END

F I G . 1 4
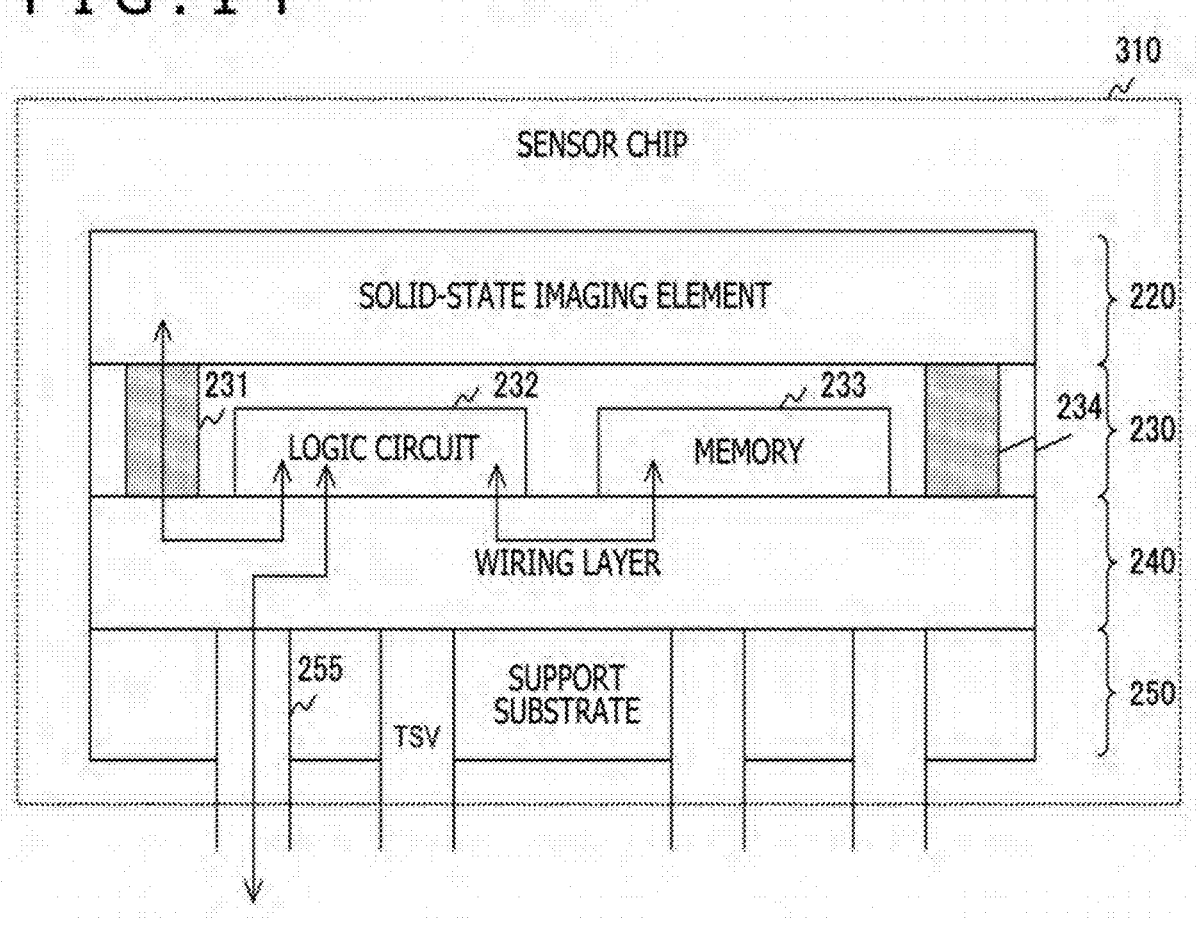

351

253

FIG.25
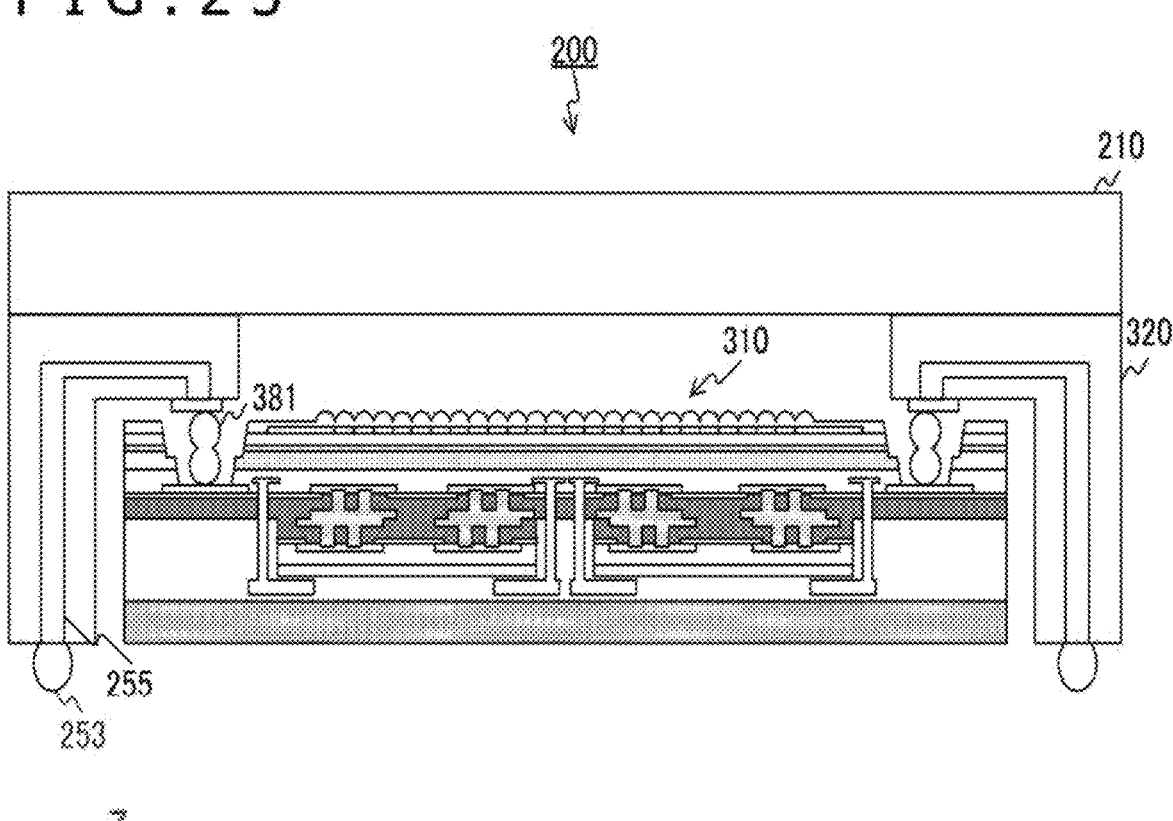
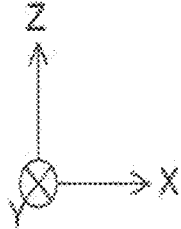

F I G . 2 6
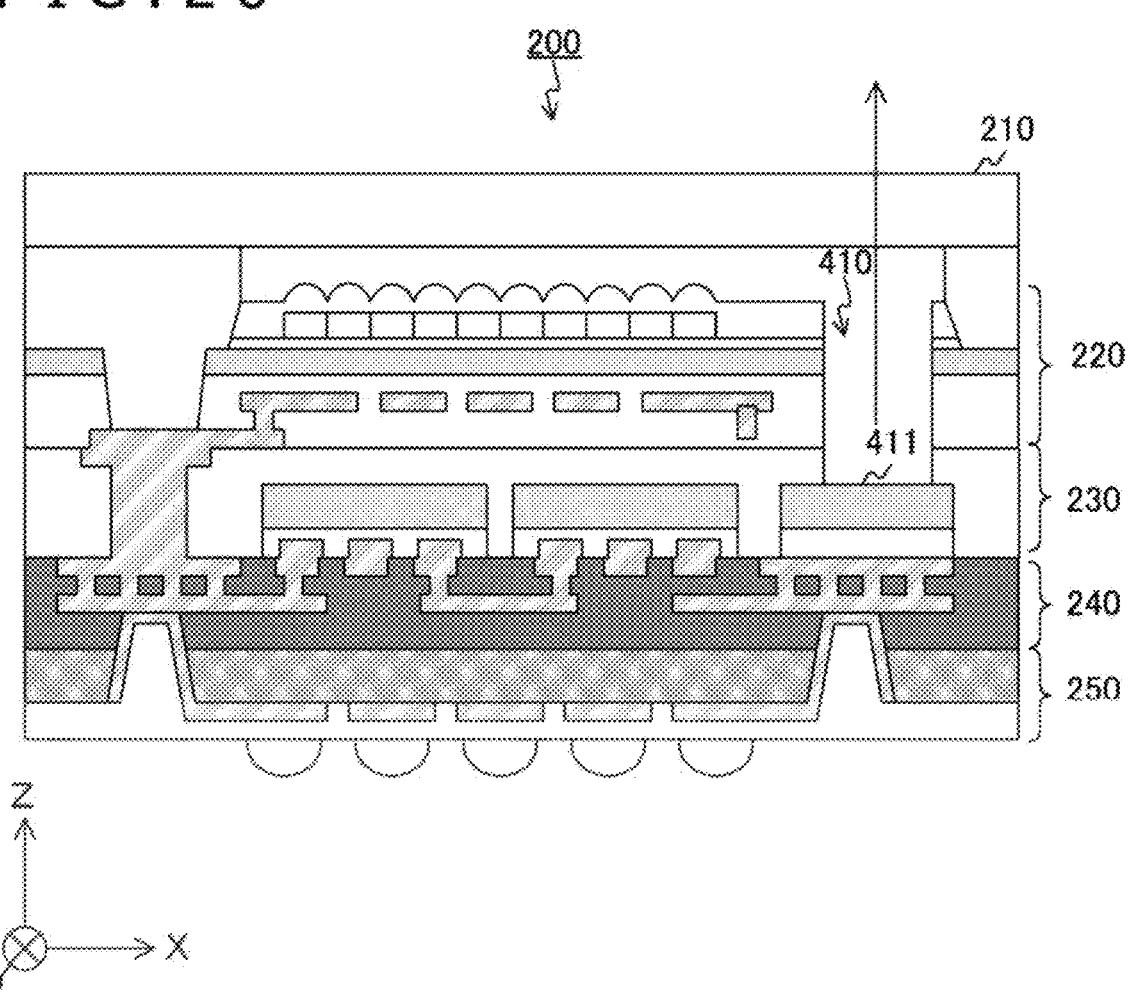

230

230

540

230

540

230

540

222　221

220

230

540

521                                    522
540
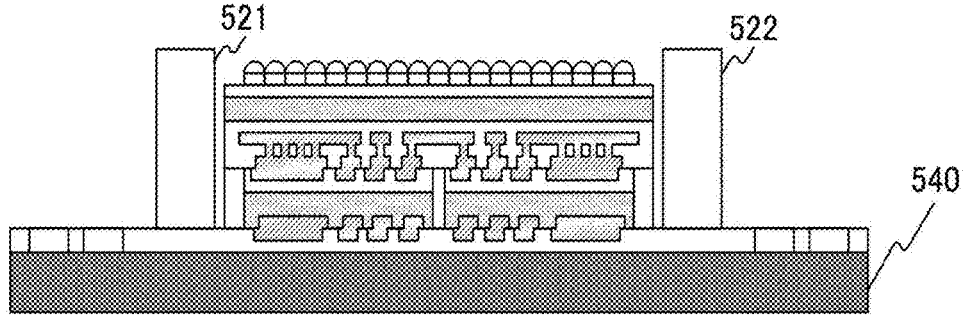
FIG. 41A
531
532
540
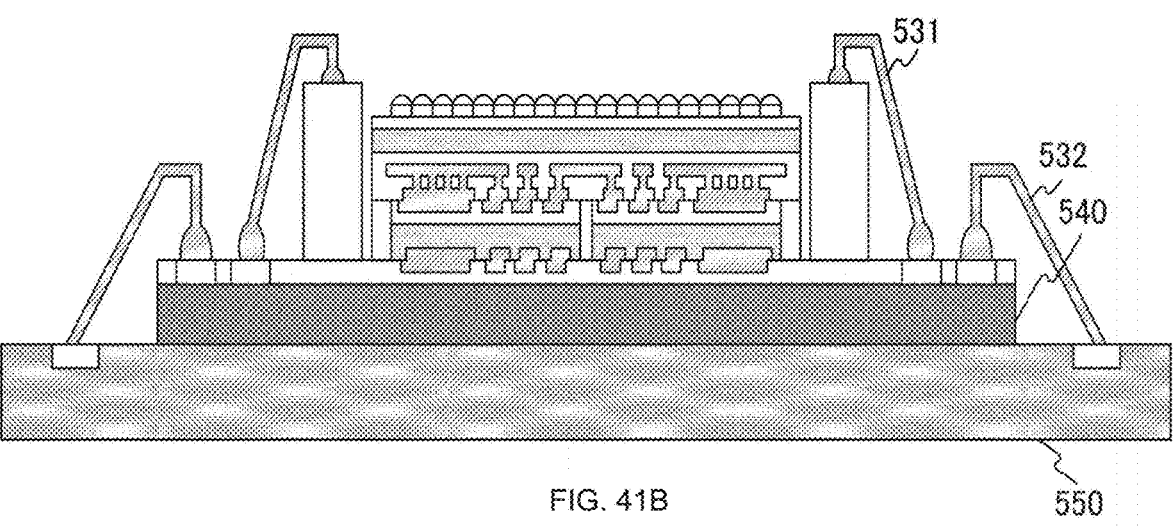
FIG. 41B                                    550

FIG.42
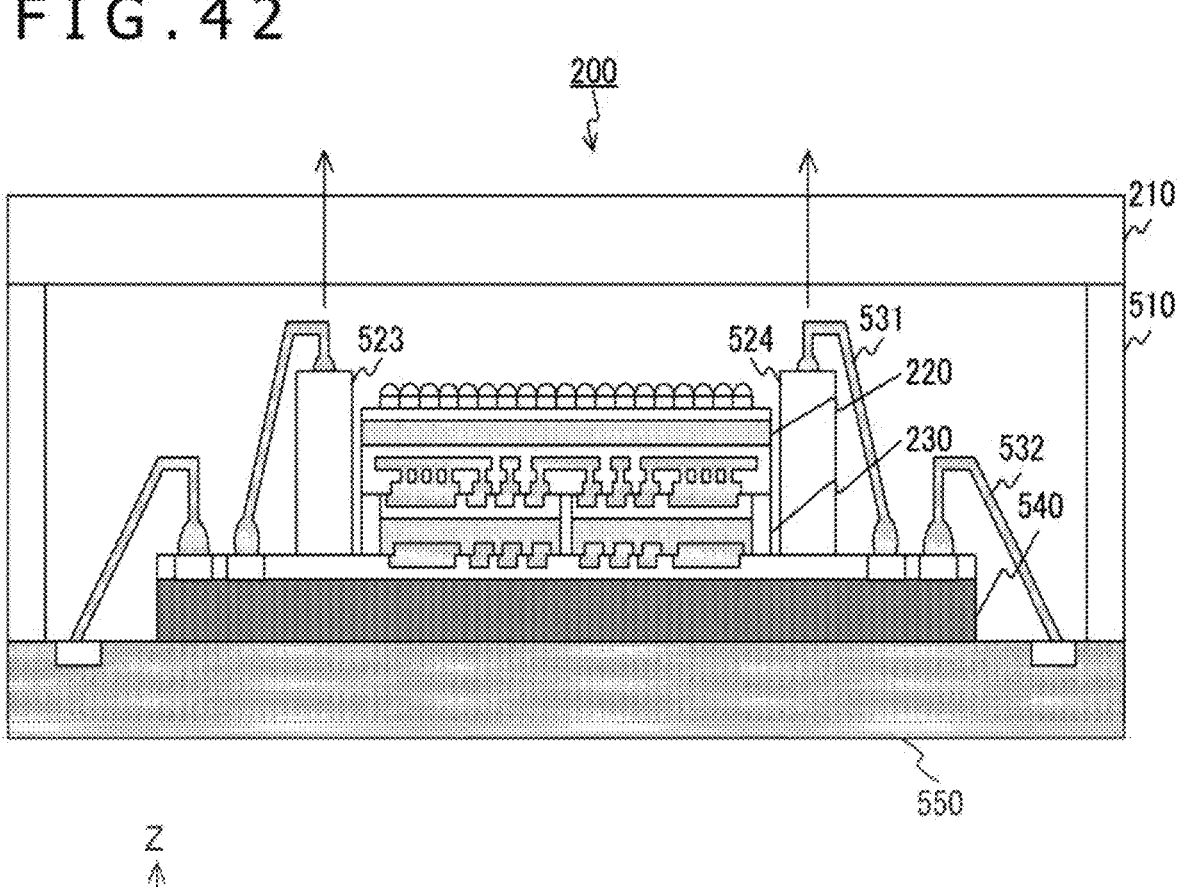
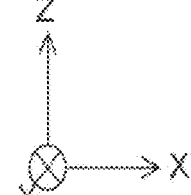

FIG.46
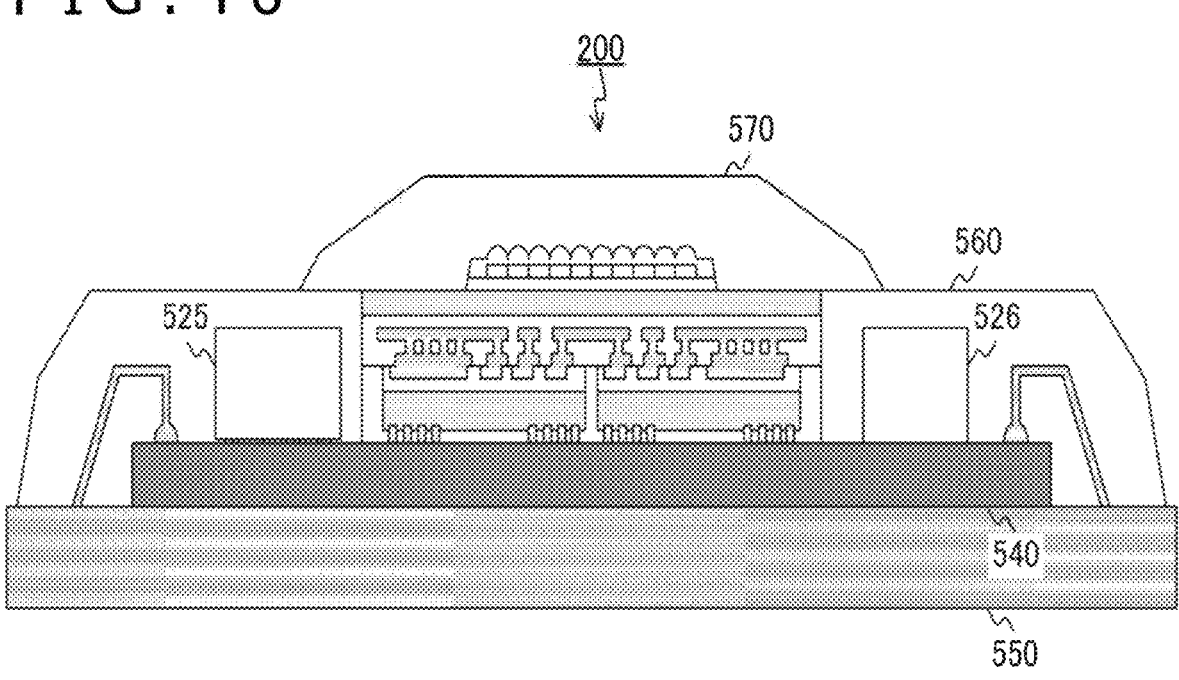
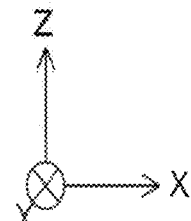

SEMICONDUCTOR PACKAGE

CROSS REFERENCE TO RELATED APPLICATIONS

This application is a U.S. National Phase of International Patent Application No. PCT/JP2020/020224 filed on May 22, 2020, which claims priority benefit of Japanese Patent Application No. JP 2019-135043 filed in the Japan Patent Office on Jul. 23, 2019. Each of the above-referenced applications is hereby incorporated herein by reference in its entirety.

TECHNICAL FIELD

The present technology relates to a semiconductor package. Specifically, the present technology relates to a semiconductor package equipped with a solid-state imaging element.

BACKGROUND ART

A semiconductor package which includes a semiconductor integrated circuit mounted on a substrate and sealed thereon is conventionally used for a purpose of easy handling of the semiconductor integrated circuit or for other purposes. For example, currently proposed is such a semiconductor package which includes a solid-state imaging element mounted as a semiconductor integrated circuit, and has a lamination of the solid-state imaging element, a wiring layer, a logic circuit, and a support substrate disposed in this order from the light reception side (e.g., see PTL 1). According to this semiconductor package, the logic circuit and the solid-state imaging element are connected to each other through use of wiring provided in the wiring layer, and data is output from the wiring layer to an external terminal through a via penetrating the support substrate and the logic circuit.

CITATION LIST

Patent Literature

[PTL 1]
JP 2014-99582 A

SUMMARY

Technical Problem

The conventional technology described above attempts to improve a function of the semiconductor package by providing the logic circuit in addition to the solid-state imaging element. According to the semiconductor package described above, however, the via penetrates the support substrate and the logic circuit. This configuration complicates a process for forming the via in comparison with a via penetrating only the support substrate. Accordingly, a yield of the semiconductor package may drop during mass production of the semiconductor package.

The present technology has been developed in consideration of the aforementioned circumstances. It is an object of the present technology to reduce a yield drop of a semiconductor package which has a via.

Solution to Problem

The present technology has been developed for solving the aforementioned problems. A first aspect of the present technology is directed to a semiconductor package including a solid-state imaging element which generates image data, a circuit layer in which a signal processing circuit that performs predetermined signal processing on the image data is disposed, a support substrate through which an output side via penetrates, one end of the output side via being connected to an external terminal, and a wiring layer disposed between the support substrate and the circuit layer and in which a signal line that connects the signal processing circuit and the other end of the output side via is wired. This configuration produces an advantageous effect of a yield increase of the semiconductor package.

In addition, the configuration of the first aspect may further include glass, and a resin dam formed in a light reception surface of the solid-state imaging element between a periphery of a pixel array unit and the glass. This configuration produces an advantageous effect of forming a cavity.

In addition, the configuration of the first aspect may further include glass, and transparent resin filled between the solid-state imaging element and the glass. This configuration produces an advantageous effect of eliminating a cavity.

In addition, in the first aspect, the output side via may be disposed in a surface of the support substrate in a region corresponding to the signal processing circuit and in a region not corresponding to the signal processing circuit. This configuration produces an advantageous effect of preventing insufficiency of external terminals.

In addition, the configuration of the first aspect may further include a ceramic substrate, and the output side via may penetrate the support substrate and the ceramic substrate. This configuration produces an advantageous effect of a yield increase of the ceramic package.

In addition, in the first aspect, an embedded element may further be disposed in the circuit layer, and an opening penetrating from a light reception surface of the solid-state imaging element to the embedded element may be formed in the solid-state imaging element and the circuit layer. This configuration produces an advantageous effect of functional improvement of the semiconductor package.

In addition, a second aspect of the present technology is directed to a semiconductor package including a solid-state imaging element which generates image data and inputs the image data to one end of an input side via, a wiring layer in which a signal line that connects a signal processing circuit performing predetermined signal processing on the image data and the other end of the input side via is wired, and a circuit layer disposed between the solid-state imaging element and the wiring layer and in which the input side via and the signal processing circuit are provided. This configuration produces an advantageous effect of a yield increase of the semiconductor package.

In addition, the configuration of the second aspect may further include a ceramic substrate through which an output side via one end of which is connected to an external terminal penetrates. This configuration produces an advantageous effect of a yield increase of the ceramic package.

In addition, in the second aspect, the ceramic substrate and the wiring layer may be connected to each other with a wire. This configuration produces an advantageous effect of a yield increase of the semiconductor package having wire bonding.

In addition, in the second aspect, the ceramic substrate and the wiring layer may be connected to each other with a bump. This configuration produces an advantageous effect of a yield increase of the semiconductor package having flip chip connection.

In addition, the configuration of the second aspect may further include glass, spacer resin formed between a periphery of a pixel array unit of the solid-state imaging element and the glass, and an interposer, in which the interposer and the wiring layer may be connected to each other with a wire. This configuration produces an advantageous effect of a yield increase of the semiconductor package having wire bonding.

In addition, the configuration of the second aspect may further include a rewiring layer in which a signal line that connects a bonding bump and an external terminal is wired, in which the wiring layer may be connected to the rewiring layer with the bump. This configuration produces an advantageous effect of a yield increase of the semiconductor package having flip chip connection.

In addition, the configuration of the second aspect may further include a frame, and an interposer bonded to the frame, in which the interposer and the wiring layer may be connected to each other with a wire. This configuration produces an advantageous effect of a yield increase of the semiconductor package having wire bonding.

In addition, in the second aspect, an embedded element may be further disposed in the circuit layer, and an opening penetrating from a light reception surface of the solid-state imaging element to the embedded element may be formed in the solid-state imaging element and the circuit layer. This configuration produces an advantageous effect of functional improvement of the semiconductor package.

In addition, the configuration of the second aspect may further include a frame-attached substrate that has a frame on an outer circumference of the frame-attached substrate, in which the wiring layer and the frame-attached substrate may be connected to each other with a wire. This configuration produces an advantageous effect of a yield increase of the semiconductor package having wire bonding.

In addition, the configuration of the second aspect may further include a ceramic substrate, in which the ceramic substrate and the wiring layer may be connected to each other with a wire. This configuration produces an advantageous effect of a yield increase of the ceramic package having wire bonding.

In addition, the configuration of the second aspect may further include an additional circuit provided on a light reception side surface of the wiring layer. This configuration produces an advantageous effect of functional improvement of the semiconductor package.

In addition, in the second aspect, the additional circuit may be embedded in sealing resin. This configuration produces an advantageous effect of reliability improvement of the semiconductor package.

In addition, the configuration of the second aspect may further include transparent resin which protects a light reception surface of the solid-state imaging element. This configuration produces an advantageous effect of reducing a thickness of the semiconductor package.

In addition, the configuration of the second aspect may further include glass connected to the sealing resin with a rib interposed between the sealing resin and the glass. This configuration produces an advantageous effect of protecting the light reception surface of the solid-state imaging element.

BRIEF DESCRIPTION OF DRAWINGS

FIG. 1 is a block diagram depicting a configuration example of an electronic device according to a first embodiment of the present technology.

FIG. 5 is a cross-sectional diagram schematically depicting a configuration of the semiconductor package according to the comparative example.

FIG. 9 is a flowchart presenting an example of a manufacturing method of the semiconductor package according to the first embodiment of the present technology.

FIG. 14 is a cross-sectional diagram schematically depicting a configuration of a sensor chip according to the second embodiment of the present technology.

FIG. 25 is a cross-sectional diagram depicting a configuration example of a semiconductor package according to a sixth modification of the second embodiment of the present technology.

FIG. 26 is a cross-sectional diagram depicting a configuration example of a semiconductor package according to a third embodiment of the present technology.

FIGS. 41A and 41B are diagrams for explaining steps until wire bonding is carried out, according to the fourth embodiment of the present technology.

FIG. 42 is a cross-sectional diagram depicting a configuration example of a semiconductor package according to a first modification of the fourth embodiment of the present technology.

DESCRIPTION OF EMBODIMENTS

Figure 2:
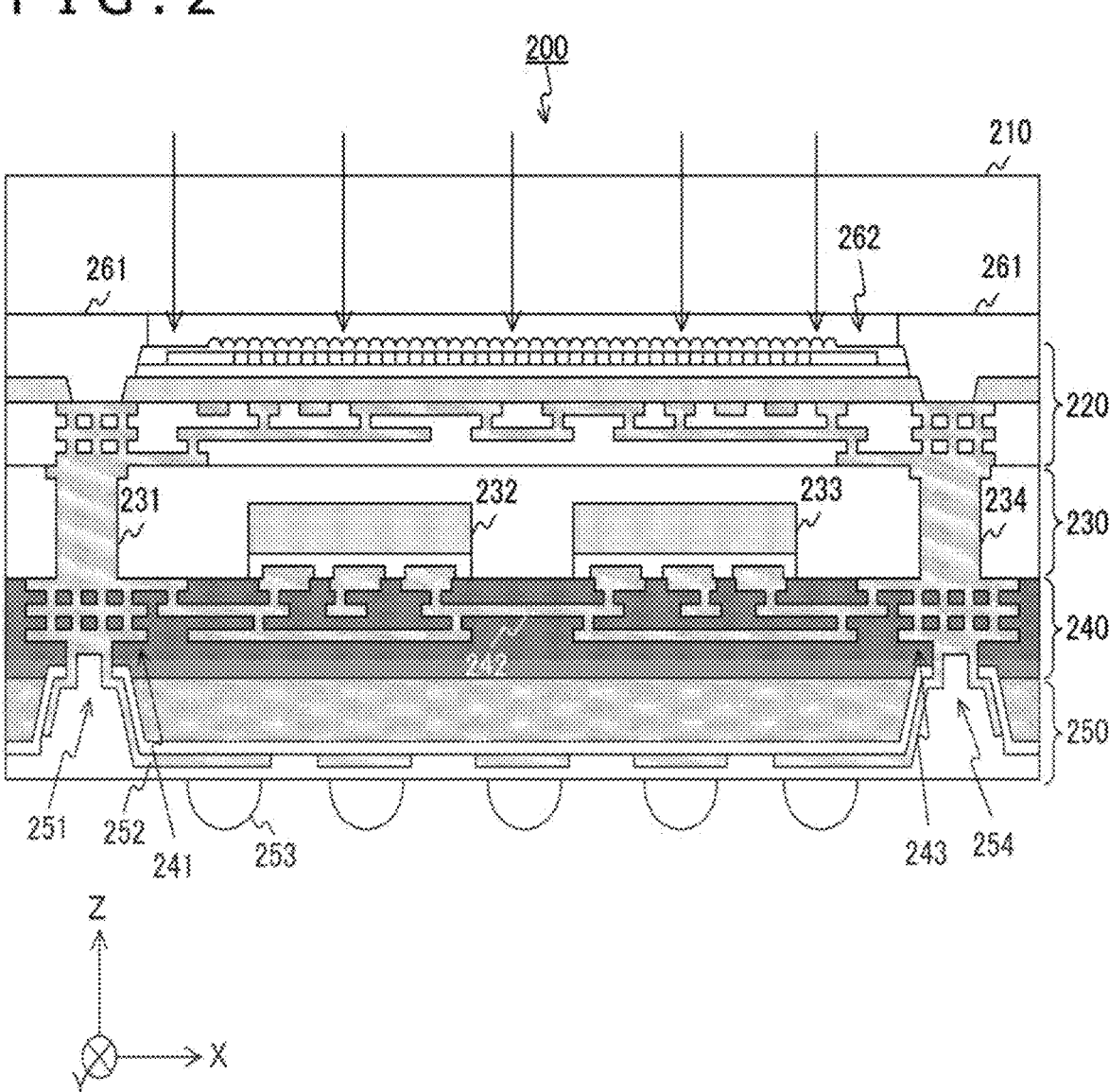
FIG. 2 is a cross-sectional diagram depicting a configuration example of a semiconductor package according to the first embodiment of the present technology.

Modes for carrying out the present technology (hereinafter referred to as embodiments) will be hereinafter described. The description will be presented in a following order.

1. First Embodiment (Example Including Via Penetrating Only Support Substrate)
2. Second Embodiment (Example Mounted on Ceramic Package or the Like with Via Penetrating Support Substrate)
3. Third Embodiment (Example Including Embedded Light Emitting Element)
4. Fourth Embodiment (Example Including Additional Circuit and Part)
5. Application Example to Mobile Body

1. First Embodiment

[Configuration Example of Electronic Device]

FIG. 1 is a block diagram depicting a configuration example of an electronic device according to a first embodiment of the present technology. An electronic device 100 in this example is a device for capturing image data, and includes an optical unit 110, a solid-state imaging element 220, and a DSP (Digital Signal Processing) circuit 120. The electronic device further includes a display unit 130, an operation unit 140, a bus 150, a frame memory 160, a storage unit 170, and a power source unit 180. Possible examples of the electronic device 100 include a digital camera such as a digital still camera, a smartphone, a personal computer, and an in-vehicle camera.

The optical unit 110 collects light from an object, and guides the light toward the solid-state imaging element 220. The solid-state imaging element 220 photoelectrically converts incident light in synchronization with a vertical synchronized signal to generate image data. The vertical synchronized signal here is a periodic signal which has a predetermined frequency and indicates an imaging timing.

The solid-state imaging element 220 supplies generated image data to the DSP circuit 120.

The DSP circuit 120 executes predetermined signal processing for image data received from the solid-state imaging element 220. The DSP circuit 120 outputs the processed image data to the frame memory 160 and the like via the bus 150.

The display unit 130 displays image data. Possible examples of the display unit 130 include a liquid crystal panel and an organic EL (Electric Luminescence) panel. The operation unit 140 generates operation signals in accordance with a user operation.

The bus 150 is a common path for mutual data exchange between the optical unit 110, the solid-state imaging element 220, the DSP circuit 120, the display unit 130, the operation unit 140, the frame memory 160, the storage unit 170, and the power source unit 180.

The frame memory 160 retains image data. The storage unit 170 stores various types of data such as image data. The power source unit 180 supplies power to the solid-state imaging element 220, the DSP circuit 120, the display unit 130, and others.

For example, the solid-state imaging element 220 and the DSP circuit 120 of the above configuration are mounted in a semiconductor package.

[Configuration Example of Semiconductor Package]

FIG. 2 is a cross-sectional diagram depicting a configuration example of a semiconductor package 200 according to the first embodiment of the present technology. Glass 210, the solid-state imaging element 220, a circuit layer 230, a wiring layer 240, and a support substrate 250 are disposed in the semiconductor package 200 in this order from the upper side on an assumption that the light reception side corresponds to the upper side.

The glass 210 protects the solid-state imaging element 220. Incident light coming from the optical unit 110 enters a light reception surface of the glass 210. Arrows in the figure each indicate an incident direction of the incident light.

An optical axis of the incident light will hereinafter be referred to as a "Z axis." In addition, a predetermined direction perpendicular to the Z axis will be referred to as an "X axis," while a direction perpendicular to the X axis and the Z axis will be referred to as a "Y axis." The figure is a cross-sectional diagram as viewed in the Y-axis direction.

The solid-state imaging element 220 generates image data by photoelectric conversion. A resin dam 261 made of photosensitive resin or the like is formed in a light reception surface of the solid-state imaging element 220 between the glass 210 and a periphery of a pixel array unit where pixels are arranged. The resin dam 261 forms a cavity 262 which is a space surrounded by the resin dam 261, a light reception surface of the solid-state imaging element 220, and the glass 210.

The circuit layer 230 is disposed between the solid-state imaging element 220 and the wiring layer 240, and constitutes a layer where a plurality of input side vias such as input side vias 231 and 234, a logic circuit 232, and a memory 233 is embedded in an insulation film. Each of the input side vias 231 and 234 is a TSV (Through Silicon Via) which extends in the Z axis and penetrates a portion of the circuit layer 230, the portion not having circuits such as the logic circuit 232 and the memory 233 provided. Moreover, one end of each of the input side vias 231 and 234 is connected to the solid-state imaging element 220.

The logic circuit 232 performs predetermined processing for image data. For example, the DSP circuit 120 is disposed to function as the logic circuit 232. The memory 233 temporarily retains image data. Note that the logic circuit 232 is an example of a signal processing circuit included in the claims.

The wiring layer 240 is disposed between the support substrate 250 and the circuit layer 230. A predetermined number of signal lines 242 are wired in the wiring layer 240. Moreover, pads 241 and 243 are disposed in the wiring layer 240. The signal lines 242 include signal lines connecting the other ends of the input side via 231 and the like to the logic circuit 232, and a signal line connecting the logic circuit 232 and the memory 233. Moreover, the signal lines 242 include signal lines connecting the logic circuit 232 and the pads 241 and 243.

The support substrate 250 is a substrate through which a plurality of output side vias such as output side vias 251 and 254 penetrates. The output side vias 251 and 254 extend in the support substrate 250 in the Z direction, and penetrate portions corresponding to the pads 241 and 243 (i.e., portions corresponding to peripheries of the logic circuit 232 and the like). Moreover, a predetermined number of external terminals 253 are provided on a lower surface of the support substrate 250 on an assumption that the light reception side corresponds to the upper side. For example, each of the external terminals 253 includes a solder ball.

Moreover, rewiring 252 is wired in the support substrate 250. One end of each of the output side vias 251 and 254 is connected to the corresponding external terminal 253 via the rewiring 252. The other end of each of the output side vias 251 and 253 is connected to the signal line 242 in the wiring layer 240 via the pad 241 or 243.

Figure 3:
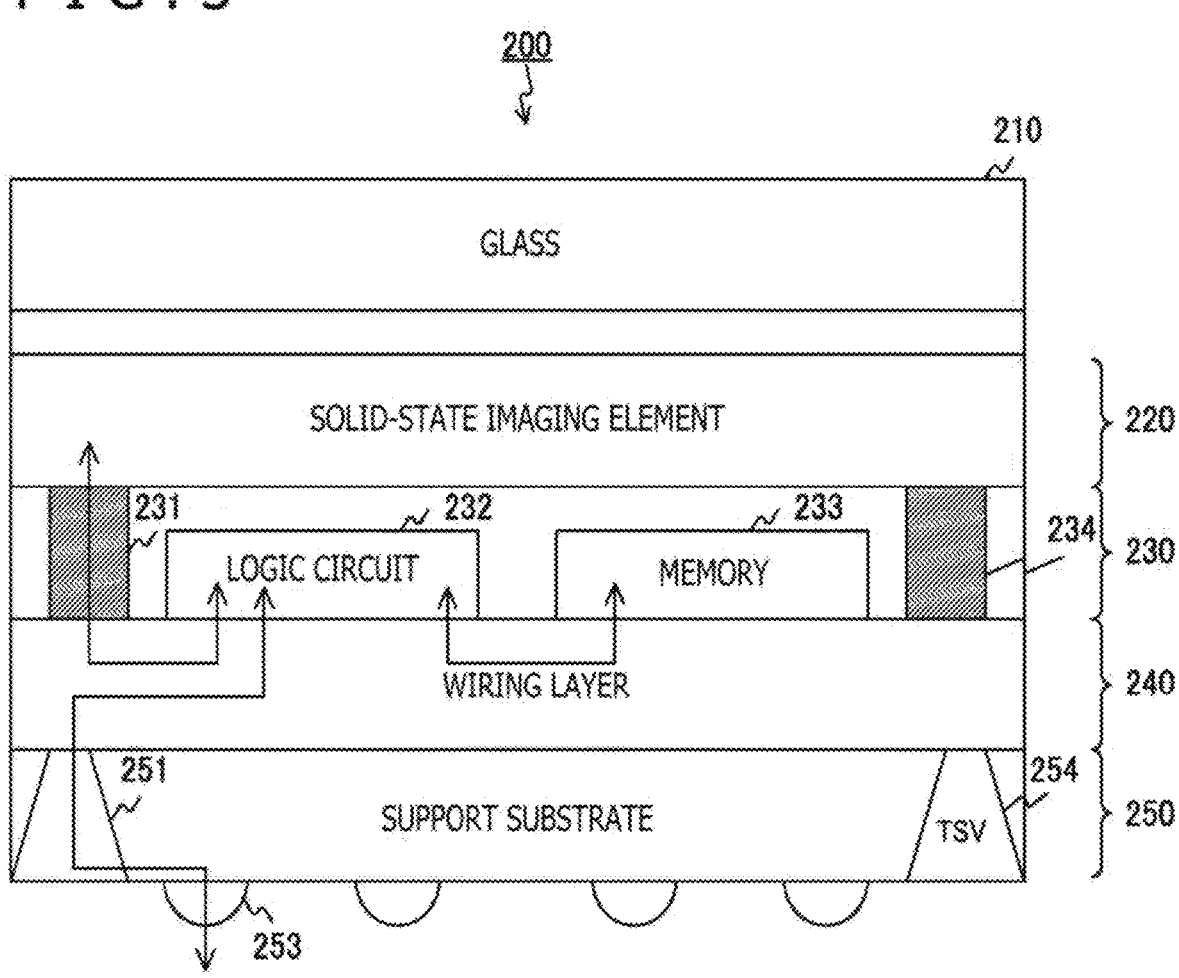
FIG. 3 is a cross-sectional diagram schematically depicting a configuration of the semiconductor package according to the first embodiment of the present technology.

FIG. 3 is a cross-sectional diagram schematically depicting a configuration of the semiconductor package 200 according to the first embodiment of the present technology. This figure does not depict the resin dam 261, the signal lines 242, and the rewiring 252.

As depicted in the figure by way of example, the glass 210, the solid-state imaging element 220, the circuit layer 230, the wiring layer 240, and the support substrate 250 are provided in this order from the upper side on an assumption that the light reception side corresponds to the upper side.

The solid-state imaging element 220 generates image data by photoelectric conversion, and inputs the generated image data to one end of each of the input side vias 231 and 234. The logic circuit 232 receives image data through the input side vias 231 and the like and the signal lines in the wiring layer 240, and performs signal processing on the image data. During this signal processing, the logic circuit 232 accesses the memory 233 via the wiring layer 240 to write or read the image data. Moreover, the logic circuit 232 outputs the processed data to the external terminals 253 through the wiring layer 240, the output side vias 251, and the like.

Suppose herein a semiconductor package in a comparative example including the glass 210, the solid-state imaging element 220, the wiring layer 240, the circuit layer 230, and the support substrate 250 disposed in this order from the upper side.

Figure 4:
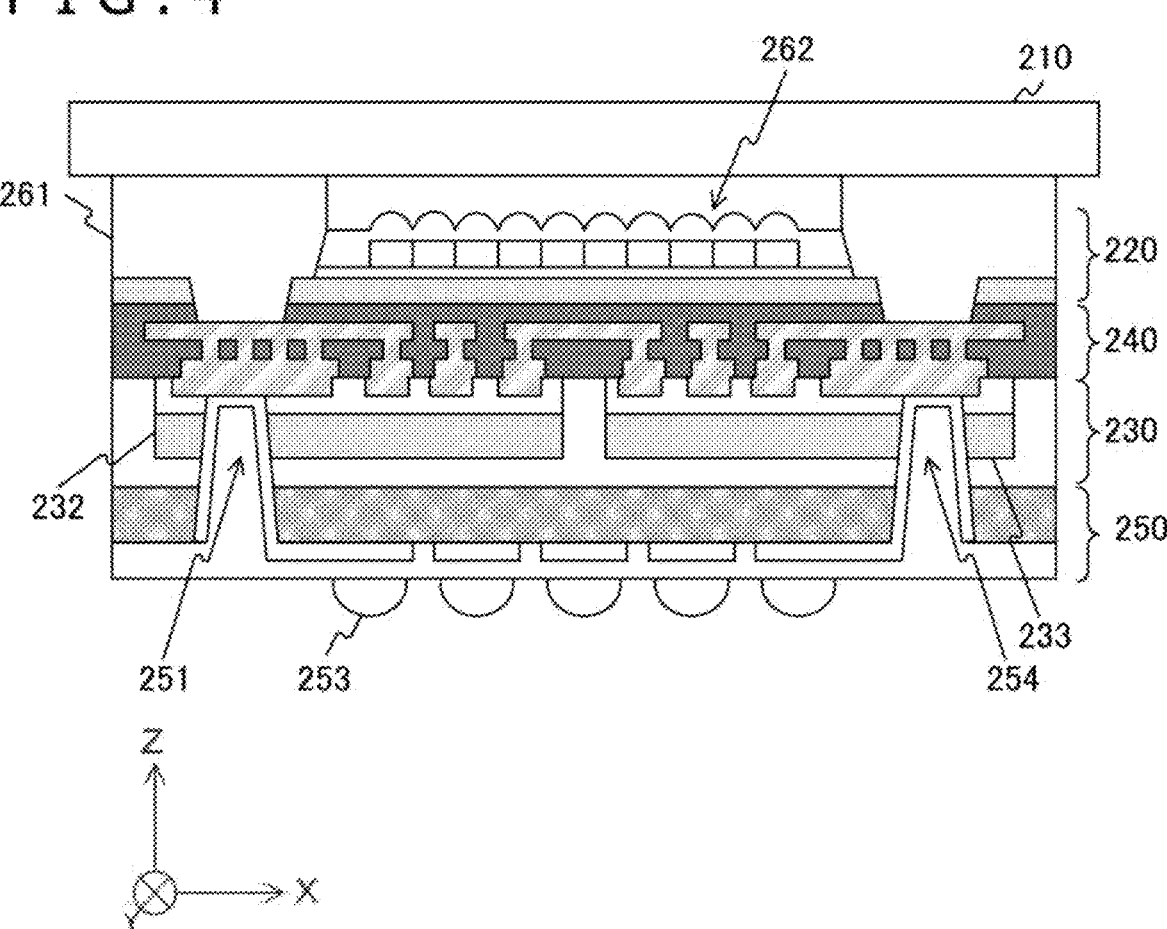
FIG. 4 is a cross-sectional diagram depicting a configuration example of a semiconductor package according to a comparative example.

FIG. 4 is a cross-sectional diagram depicting a configuration example of the semiconductor package according to the comparative example.

FIG. 5 is a cross-sectional diagram schematically depicting a configuration of the semiconductor package according to the comparative example.

As depicted in FIGS. 4 and 5 by way of example, the wiring layer 240 is disposed between the solid-state imaging element 220 and the circuit layer 230 in the comparative example. The wiring layer 240 is manufactured through use of wiring in the solid-state imaging element 220. Moreover, a signal line connecting the logic circuit 232 and the memory 233, and others are wired in the wiring layer 240. Accordingly, wiring in the solid-state imaging element 220 needs to be designed in accordance with the logic circuit 232 and the memory 233 to be mounted. In this case, the degree of design freedom of wiring of the solid-state imaging element 220 may be decreased.

On the other hand, according to the semiconductor package 200 depicted in FIGS. 2 and 3 by way of example, the circuit layer 230 is disposed between the solid-state imaging element 220 and the wiring layer 240. This configuration eliminates the necessity of changing wiring of the solid-state imaging element 220 in accordance with the logic circuit 232 and the memory 233 to be mounted. Accordingly, the degree of design freedom improves.

Moreover, according to the comparative example, vias penetrating the support substrate 250, the logic circuit 232, and the memory 233 are formed to output data from the external terminals 253. This configuration requires disposition of pads allowing for penetration of the vias in the logic circuit 232 and the memory 233, and therefore requires larger areas of the logic circuit 232 and the like to secure areas for the pads. Moreover, in a case where the logic circuit 232 and the like are procurement items provided from the outside, the pads may be difficult to be provided, in some cases. Furthermore, a process for forming the vias becomes more complicated than in a case where vias penetrate only the support substrate 250. In this case, a yield of mass production of the semiconductor package 200 may drop. Besides, characteristics of the logic circuit 232 and the like may be changed by penetration of the vias through the logic circuit 232 and the like. In this case, a yield drip may be produced by these characteristic changes.

On the other hand, according to the semiconductor package 200 depicted in FIGS. 2 and 3 by way of example, the output side via 251 and the like penetrating only the support substrate 250 are formed. This configuration eliminates the necessity of disposing pads allowing for penetration of the vias in the logic circuit 232 and the memory 233, and therefore reduces the areas of the logic circuit 232 and the like by the elimination of the pads. Moreover, procurement items from the outside can be more readily used to constitute the logic circuit 232 and the like without the necessity of providing the pads. Furthermore, the process for forming the output side via 251 and the like becomes simpler than in the case of via penetration through the support substrate 250, the logic circuit 232, and the memory 233. Accordingly, the yield improves. Besides, the output side via 251 and the like each of which does not penetrates the logic circuit 232 and the like do not change characteristics of the logic circuit 232 and the like. Accordingly, a yield drop produced by the characteristic changes can be reduced.

A manufacturing method of the semiconductor package 200 will be subsequently described.

[Manufacturing Method of Semiconductor Package]

Figure 6A:
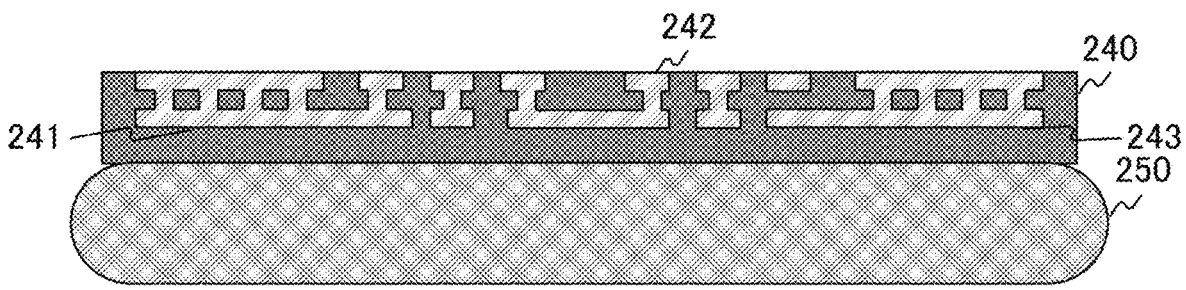
FIGS. 6A, 6B, and 6C are diagrams for explaining steps until reduction of thicknesses of a logic circuit and the like is carried out, according to the first embodiment of the present technology.
Figure 6B:
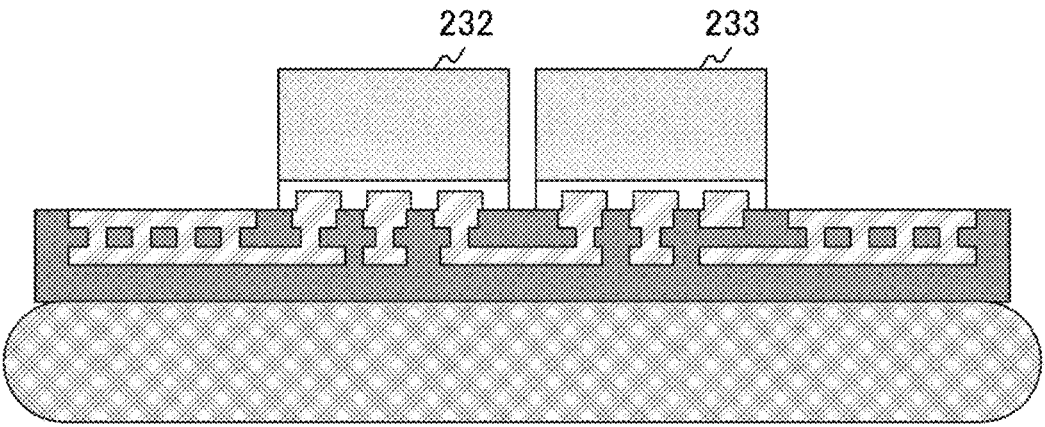
Figure 6C:
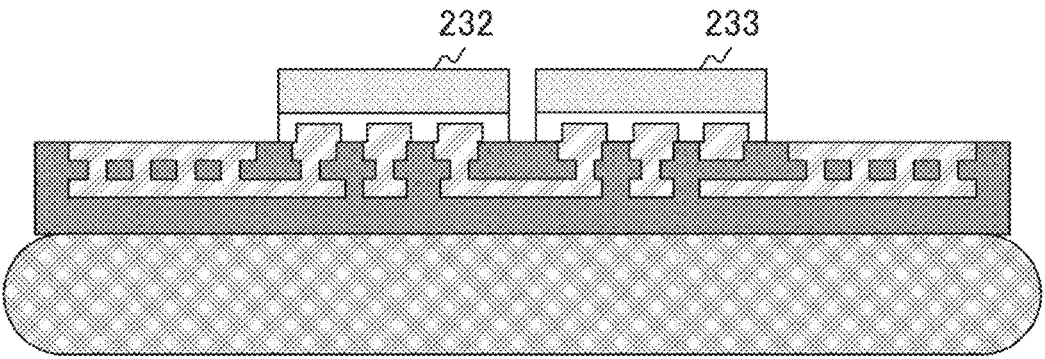

FIGS. 6A, 6B, and 6C are diagrams for explaining steps until reduction of thicknesses of the logic circuit 232 and the like according to the first embodiment of the present technology. FIG. 6A is a diagram for explaining a step of forming the wiring layer 240. FIG. 6B is a diagram for explaining a step of connecting the logic circuit 232 and the like. FIG. 6C is a diagram for explaining steps until reduction of the thicknesses of the logic circuit 232 and the like is carried out.

As depicted in the part "a" in the figure by way of example, a manufacturing system of the semiconductor package 200 initially forms the wiring layer 240 for each chip region of the support substrate 250 having a wafer shape and divided into a plurality of chip regions. Thereafter, as depicted in the part "b" in the figure by way of example, the manufacturing system connects the logic circuit 232 and the memory 233 to the wiring layer 240 by Cu—Cu bonding or other methods. This step is called a C2W (Chip to Wafer) connection. Subsequently, as depicted in the part "c" in the figure by way of example, the manufacturing system reduces the thicknesses of the logic circuit 232 and the memory 233 as necessary.

Figure 7A:
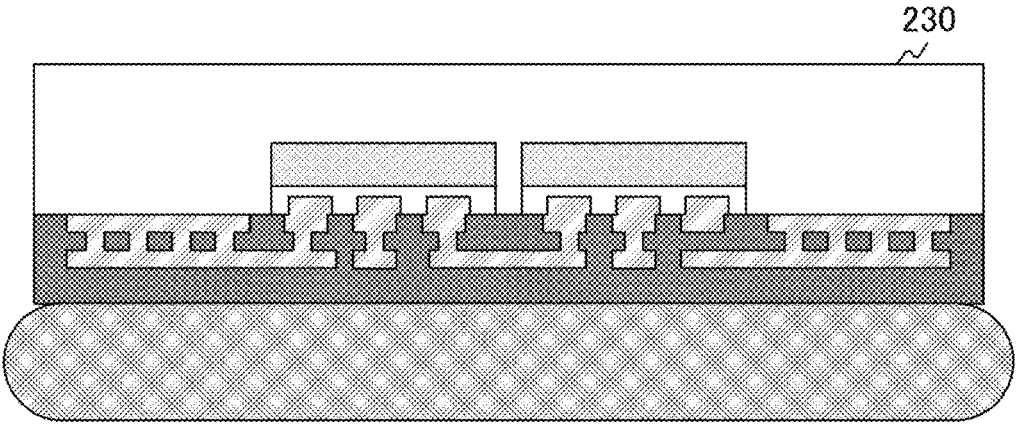
FIGS. 7A, 7B, and 7C are diagrams for explaining steps until formation of input side vias is carried out, according to the first embodiment of the present technology.
Figure 7B:
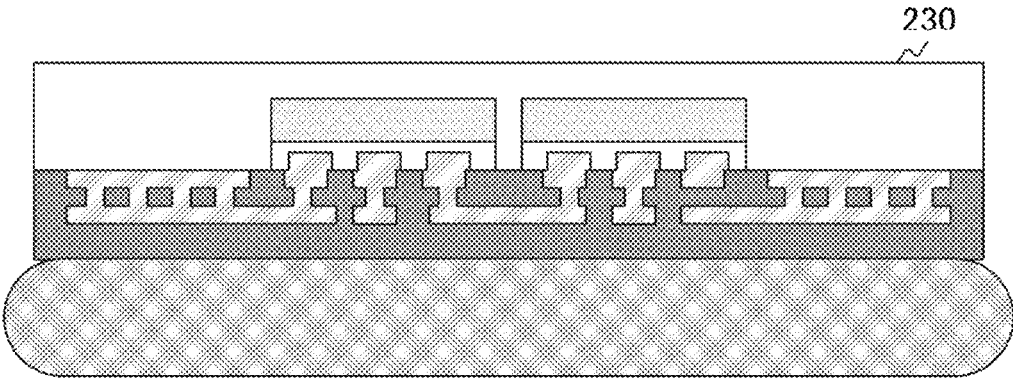
Figure 7C:
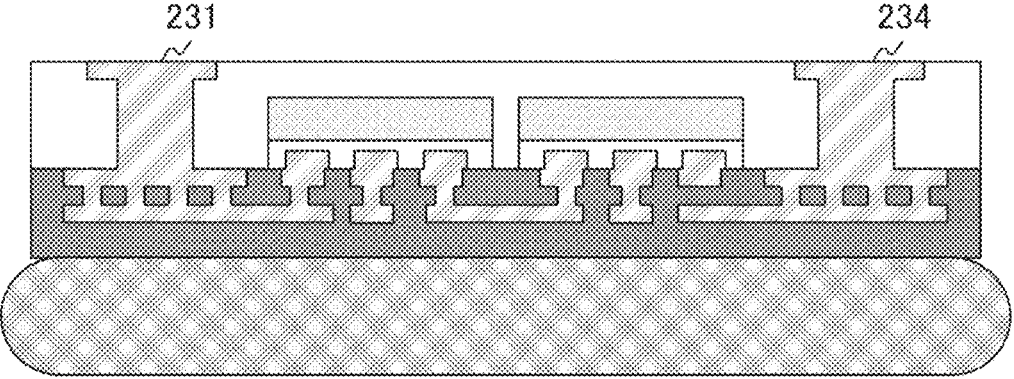

FIGS. 7A, 7B, and 7C are diagrams for explaining steps until formation of the input side via 231 and the like is carried out according to the first embodiment of the present technology. FIG. 7A is a diagram for explaining a step of embedding the logic circuit 232 and the like in an insulation film. A FIG. 7B is a diagram for explaining a step of flattening the circuit layer. FIG. 7C is a diagram for explaining a step of forming the input side via 231 and the like.

As depicted in FIG. 7A by way of example, the manufacturing system forms the circuit layer 230 by embedding the logic circuit 232 and the like in the insulation film. Thereafter, as depicted in FIG. 7B by way of example, the manufacturing system flattens the circuit layer 230. Subsequently, as depicted in FIG. 7C by way of example, the manufacturing system forms the input side vias 231 and 234 each penetrating the circuit layer 230 in a region where logic circuit 232 and the like are not disposed.

Figures 8A, 8B, 8C:
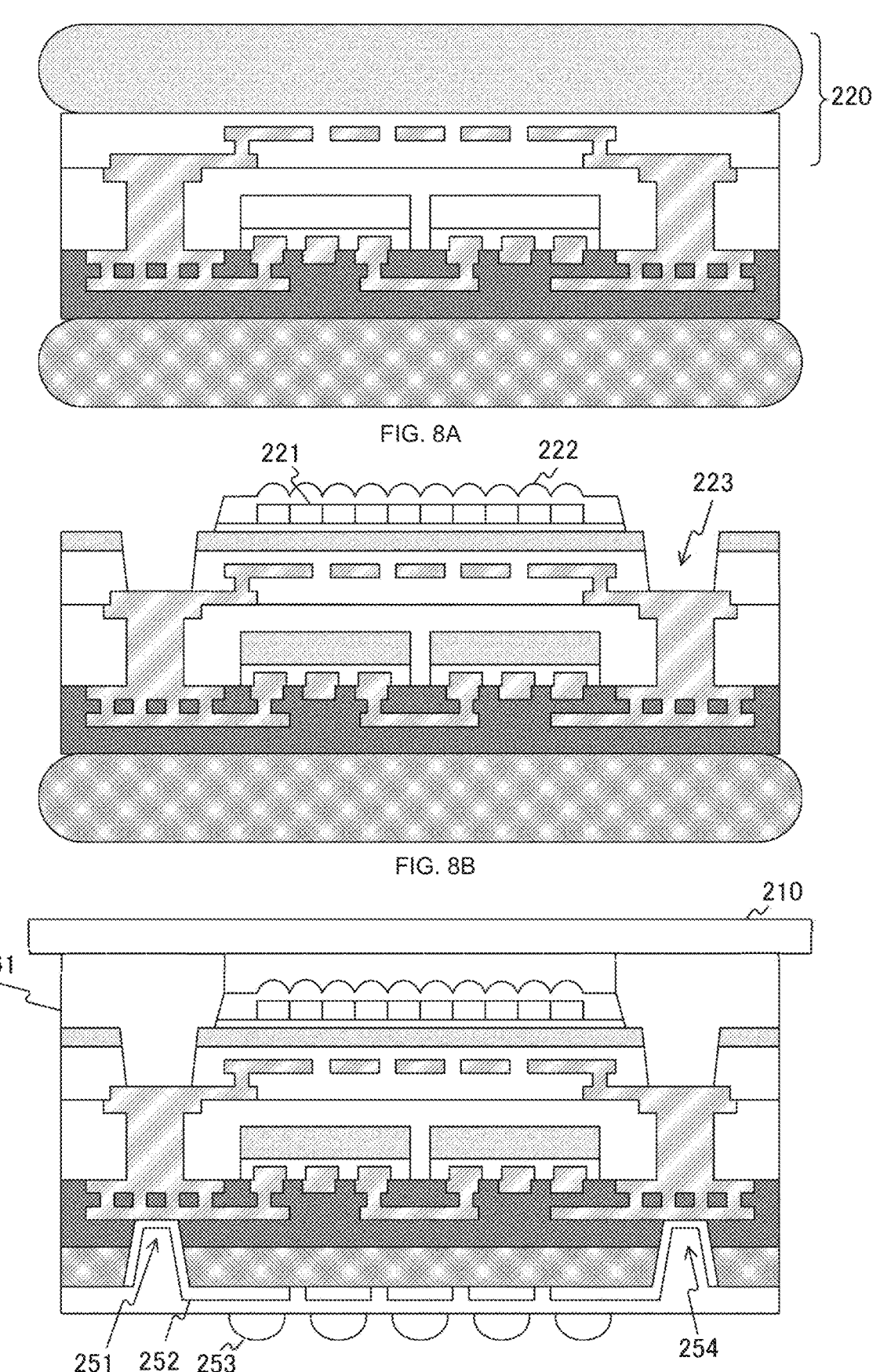
FIGS. 8A, 8B, and 8C are diagrams for explaining steps until formation of output side vias, rewiring, and external terminals is carried out, according to the first embodiment of the present technology.

FIGS. 8A, 8B, and 8C are diagrams for explaining steps until formation of the output side via 251, the rewiring 252, and the external terminals 253 according to the first embodiment of the present technology. A part "a" in the figure FIG. 8A is a diagram for explaining a step of connecting the solid-state imaging element 220. FIG. 8B is a diagram for explaining a step of forming a color filter and an on-chip lens. FIG. 8C is a diagram for explaining steps until formation of the output side via 251, the rewiring 252, and the external terminals 253 is carried out.

As depicted in FIG. 8A by way of example, the manufacturing system prepares a wafer where a plurality of the solid-state imaging elements 220 is provided, and connects the wafer to the input side via 231 and the like of the wafer-shaped support substrate 250 by Cu—Cu bonding or other methods. This step is called a WoW (Wafer on Wafer) connection. Thereafter, as depicted in FIG. 8B, the manufacturing system forms a plurality of pixels 221 on the solid-state imaging element 220, and forms a color filter (not depicted) and an on-chip lens 222 for each of the pixels 221. Subsequently, as depicted in FIG. 8C, the manufacturing system forms the output side vias 251 and 254, the rewiring 252, and the external terminals 253 on the support substrate 250. In addition, the manufacturing system forms the resin dam 261, and seals the solid-state imaging element 220 through use of the glass 210. Thereafter, the manufacturing system produces individual pieces by dicing in units of chip region.

As depicted in FIGS. 6A, 6B, 6C, 7A, 7B, 7C, 8A, 8B, and 8C by way of example, the semiconductor package 200 manufactured at a wafer level is called a WLCSP (Wafer Level Chip Size Package).

FIG. 9 is a flowchart presenting an example of the manufacturing method of the semiconductor package 200 according to the first embodiment of the present technology. The manufacturing system initially forms the wiring layer 240 on the support substrate 250 (step S901), and connects the logic circuit 232 and the memory 233 to the wiring layer 240 by Cu—Cu bonding or other methods (step S902).

Subsequently, the manufacturing system reduces the thicknesses of the logic circuit 232 and the memory 233 (step S903), and embeds the logic circuit 232 and the like in an insulation film to form the circuit layer 230 (step S904). Thereafter, the manufacturing system flattens the circuit layer 230 (step S905), and forms the input side vias 231 and 234 (step S906).

The manufacturing system connects the solid-state imaging element 220 by Cu—Cu bonding or other methods (step S907). The manufacturing system forms the plurality of pixels 221 on the solid-state imaging element 220, and forms the color filter and the on-chip lens 222 for each of the pixels 221 (step S908). Subsequently, the manufacturing system forms the output side vias 251 and 254, the rewiring 252, and the external terminals 253 on the support substrate 250, and seals the solid-state imaging element 220 through use of the glass 210 (step S909). After step S909, the manufacturing system performs dicing, inspection, and the like, and ends manufacturing of the semiconductor package 200.

According to the first embodiment of the present technology, as described above, the output side via 251 and the like penetrate only the support substrate 250. Accordingly, via formation is completed by a simpler process than in the case where the output side via 251 and the like penetrate the support substrate 250 and the logic circuit 232. In this manner, the yield of the semiconductor package 200 improves more than in the case of penetration through the support substrate 250 and the logic circuit 232.

First Modification

According to the first embodiment described above, the cavity 262 is provided in the semiconductor package 200 by providing the resin dam 261. In this case, however, a part of a wall surface of the resin dam 261 may separate and fall on an image surface of the solid-state imaging element 220. The semiconductor package 200 according to a first modification of the first embodiment is different from the semiconductor package 200 in the first embodiment in that the cavity 262 is eliminated by being filled with transparent resin.

Figure 10:
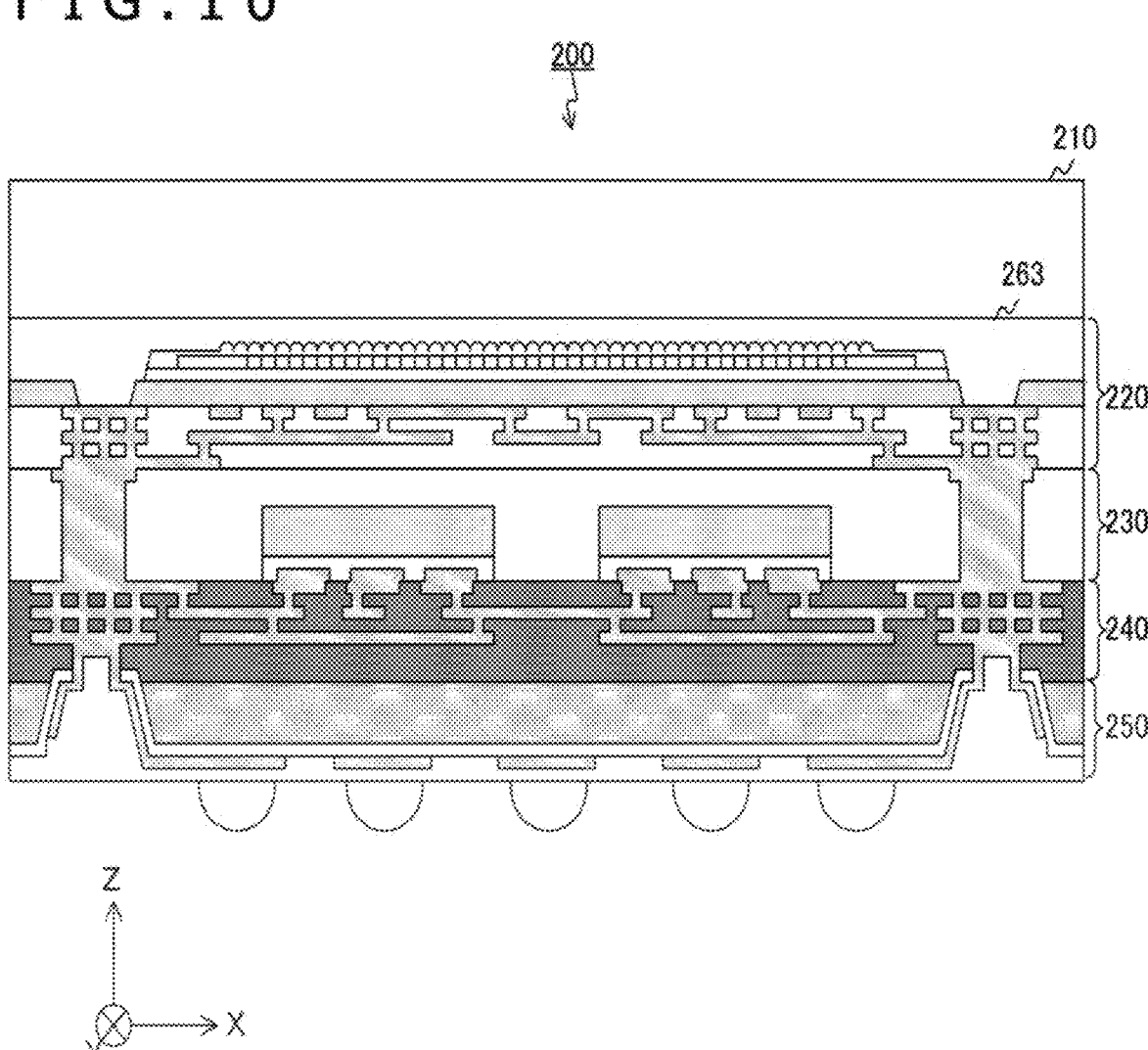
FIG. 10 is a cross-sectional diagram depicting a configuration example of a semiconductor package according to a first modification of the first embodiment of the present technology.

FIG. 10 is a cross-sectional diagram depicting a configuration example of the semiconductor package 200 according to the first modification of the first embodiment of the present technology. The semiconductor package 200 according to the first modification of the first embodiment is different from the semiconductor package 200 in the first embodiment in that transparent resin 263 is formed instead of the resin dam 261. The transparent resin 263 is filled between the glass 210 and the solid-state imaging element 220. In this manner, separation of the wall surface of the resin dam 261 is avoidable by elimination of the cavity 262.

According to the first modification of the first embodiment of the present technology, as described above, the transparent resin 263 is filled between the glass 210 and the solid-state imaging element 220. Accordingly, separation of the wall surface of the resin dam 261 is avoidable by elimination of the cavity 262.

Second Modification

According to the first embodiment described above, the output side via 251 and the like are disposed in the portions corresponding to the peripheries of the logic circuit 232 and the like. In this configuration, however, the number of the external terminals 253 may become insufficient. The semiconductor package 200 according to a second modification of the first embodiment is different from the semiconductor package 200 in the first embodiment in that output side vias are also formed immediately below the logic circuit 232 and the like.

Figure 11:
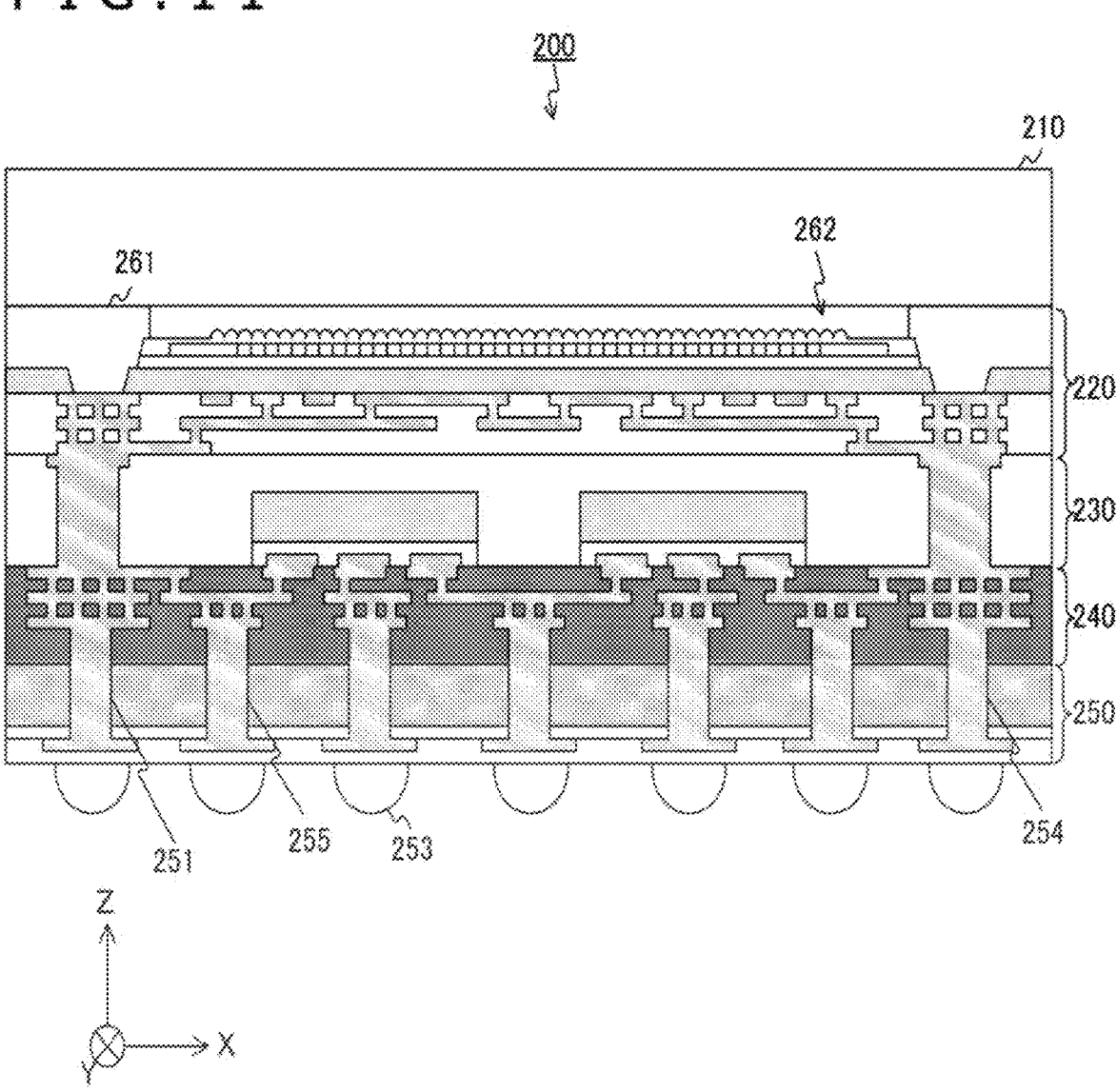
FIG. 11 is a cross-sectional diagram depicting a configuration example of a semiconductor package according to a second modification of the first embodiment of the present technology.

FIG. 11 is a cross-sectional diagram depicting a configuration example of the semiconductor package 200 according to the second modification of the first embodiment of the present technology. The semiconductor package 200 according to the second modification of the first embodiment is different from the semiconductor package 200 in the first embodiment in that a predetermined number of output side vias 255 are formed in the support substrate 250 in the regions corresponding to the logic circuit 232 and the memory 233 as well as in the regions not corresponding to the logic circuit 232 and the memory 233. In other words, the output side vias 255 are disposed in the support substrate 250 immediately below the logic circuit 232 and the like as well. In this manner, insufficiency of the external terminals 253 is avoidable by increasing the number of the output side vias.

According to the second modification of the first embodiment of the present technology, as described above, the output side vias 255 are also formed in the regions corresponding to the logic circuit 232 and the memory 233. Accordingly, insufficiency of the external terminals 253 is avoidable by increasing the number of the output side vias.

Third Modification

According to the second modification of the first embodiment described above, the cavity 262 is provided in the semiconductor package 200 by providing the resin dam 261. In this case, however, a part of a wall surface of the resin dam 261 may separate and fall on the image surface of the solid-state imaging element 220. The semiconductor package 200 according to a third modification of the first embodiment is different from the semiconductor package 200 in the second modification of the first embodiment in that the cavity 262 is eliminated by being filled with transparent resin.

Figure 12:
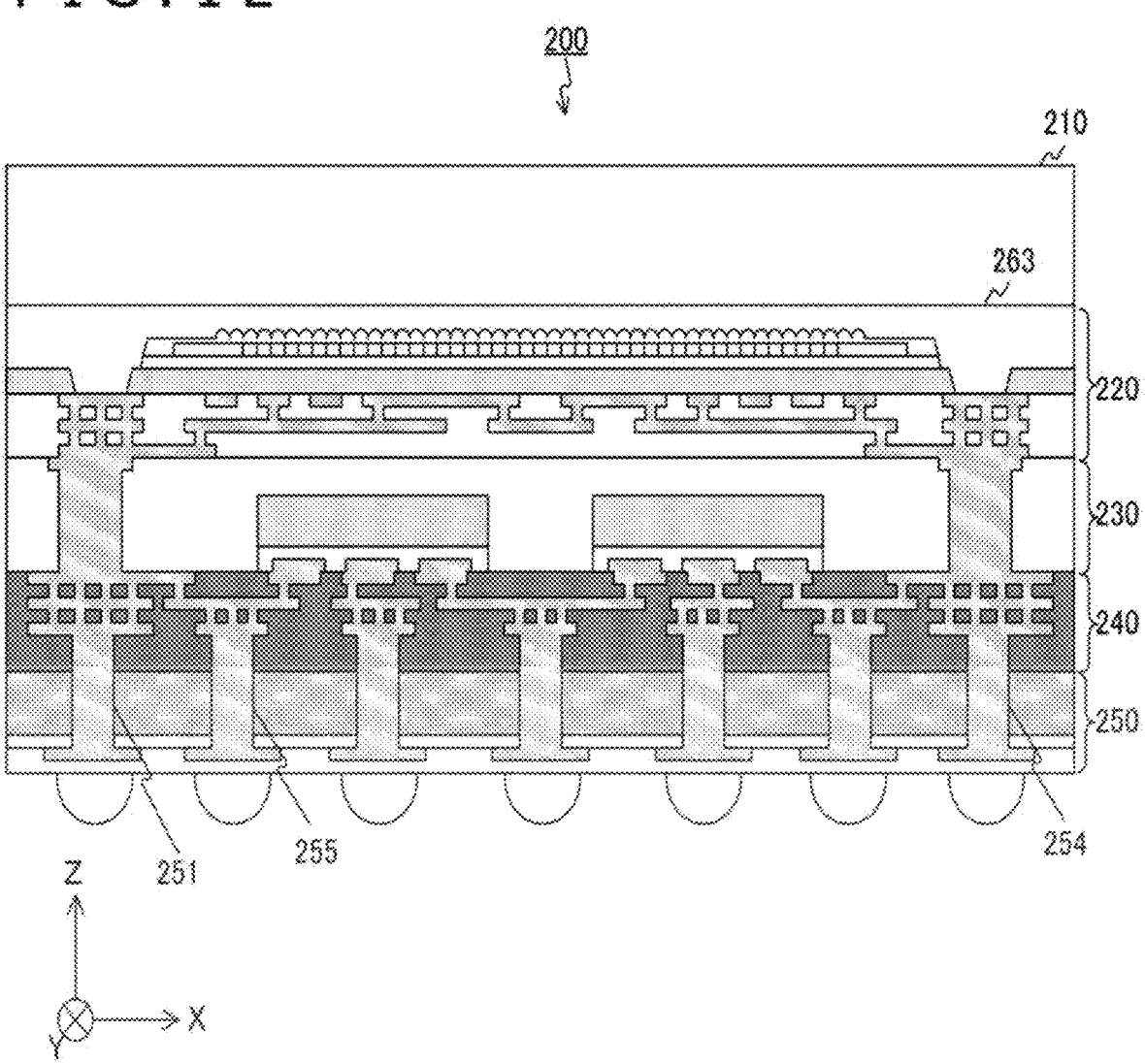
FIG. 12 is a cross-sectional diagram depicting a configuration example of a semiconductor package according to a third modification of the first embodiment of the present technology.

FIG. 12 is a cross-sectional diagram depicting a configuration example of the semiconductor package 200 according to the third modification of the first embodiment of the present technology. The semiconductor package 200 according to the third modification of the first embodiment is different from the semiconductor package 200 in the second modification of the first embodiment in that the transparent resin 263 is formed instead of the cavity 262. In this manner, separation of the wall surface of the resin dam 261 is avoidable by elimination of the cavity 262.

According to the third modification of the first embodiment of the present technology, as described above, the transparent resin 263 is filled between the glass 210 and the solid-state imaging element 220. Accordingly, separation of the wall surface of the resin dam 261 is avoidable by elimination of the cavity 262.

2. Second Embodiment

According to the first embodiment described above, the yield of the semiconductor package 200 manufactured at a wafer level is raised. However, a yield of a ceramic package mounted on a ceramic substrate can be also raised. The semiconductor package 200 according to a second embodiment is different from the semiconductor package 200 in the first embodiment in that the semiconductor package 200 is a ceramic package.

Figure 13:
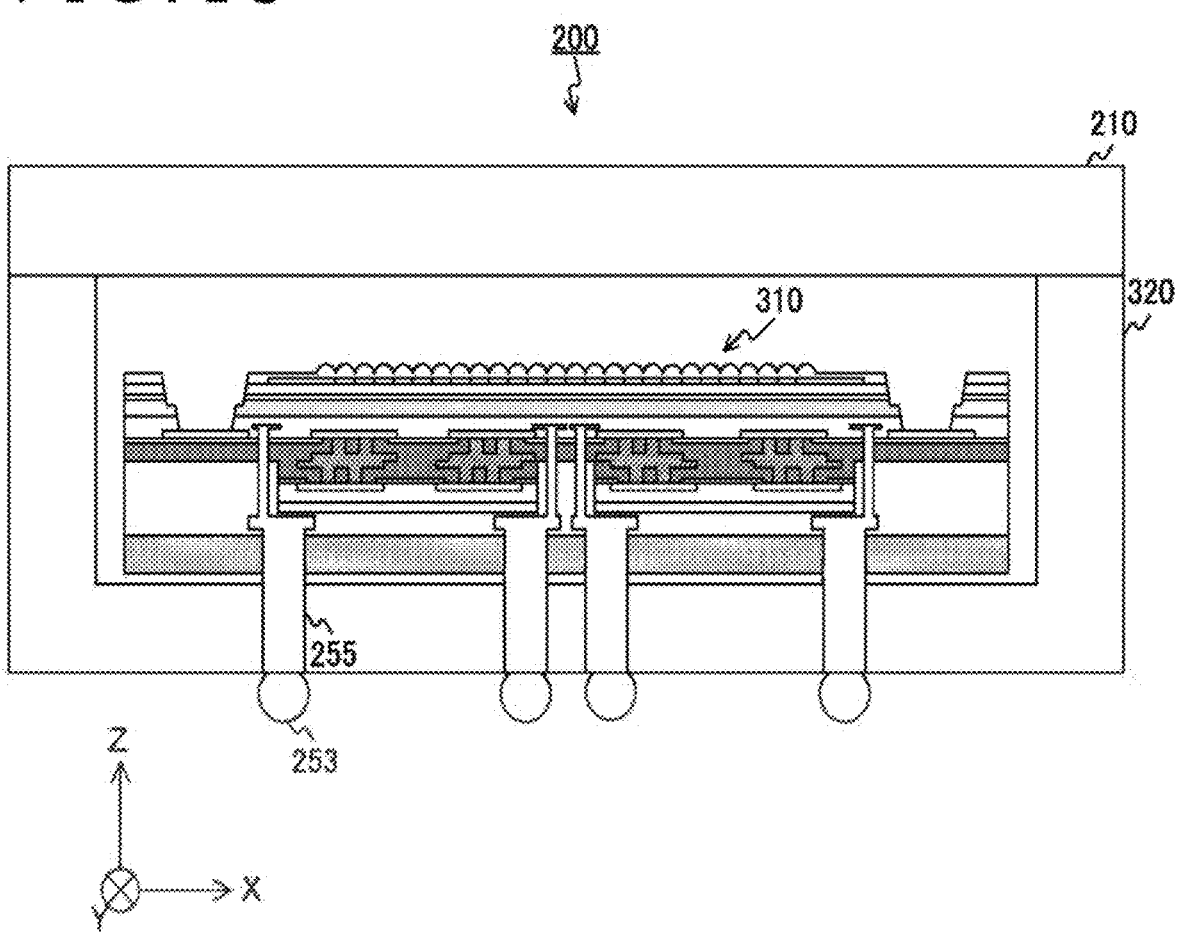
FIG. 13 is a cross-sectional diagram depicting a configuration example of a semiconductor package according to a second embodiment of the present technology.

FIG. 13 is a cross-sectional diagram depicting a configuration example of the semiconductor package 200 according to the second embodiment of the present technology. The semiconductor package 200 according to the second embodiment includes the glass 210, a sensor chip 310, and a ceramic substrate 320.

The sensor chip 310 is a chip where the solid-state imaging element 220, the circuit layer 230, the wiring layer 240, and the support substrate 250 are stacked in this order from the upper side on an assumption that the light reception side corresponds to the upper side. Configurations of the respective layers are similar to the corresponding configurations in the first embodiment. However, the output side vias 255 of the second embodiment are different from the output side vias 255 of the first embodiment in that the output side vias 255 penetrate both the support substrate 250 and the ceramic substrate 320.

A space is formed in the ceramic substrate 320, and the sensor chip 310 is provided in the space. Moreover, this space is sealed by the glass 210.

FIG. 14 is a cross-sectional diagram schematically depicting a configuration of the sensor chip 310 according to the second embodiment of the present technology. As depicted in the figure, the logic circuit 232 outputs data to the outside through the output side vias 255 penetrating the support substrate 250 and the ceramic substrate 320.

According to the second embodiment of the present technology, as described above, the sensor chip 310 is disposed in the ceramic substrate 320 through which the output side vias 255 penetrate. Accordingly, a yield of the ceramic package improves.

First Modification

According to the second embodiment described above, the sensor chip 310 is connected to the ceramic substrate 320 with the output side vias 255. However, the sensor chip 310 can be connected with wires. The semiconductor package 200 according to a first modification of the second embodiment is different from the semiconductor package 200 in the second embodiment in that the sensor chip 310 is connected to the ceramic substrate 320 with wires.

Figure 15:
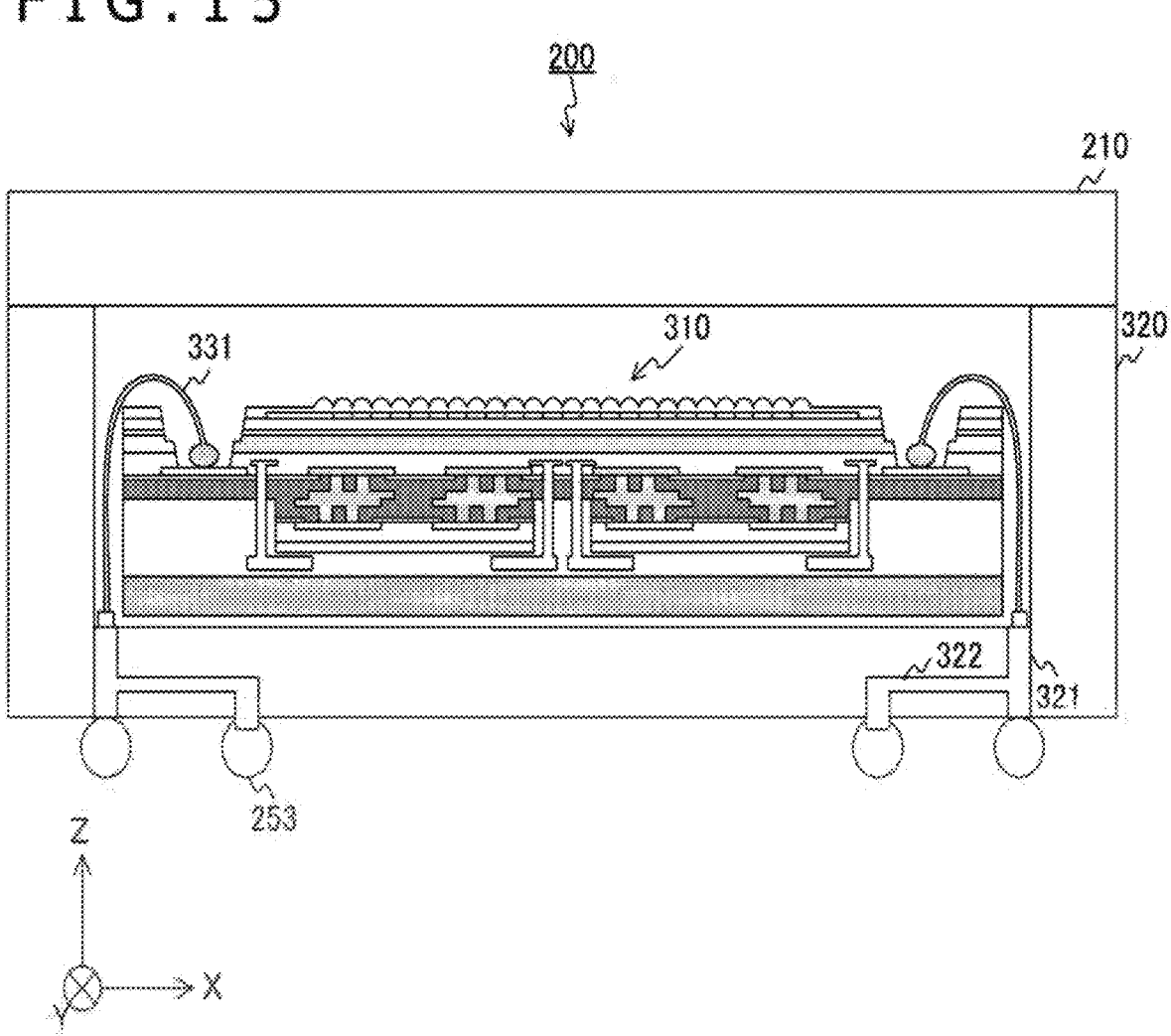
FIG. 15 is a cross-sectional diagram depicting a configuration example of a semiconductor package according to a first modification of the second embodiment of the present technology.

FIG. 15 is a cross-sectional diagram depicting a configuration example of the semiconductor package 200 according to the first modification of the second embodiment of the present technology. The semiconductor package 200 according to the first modification of the second embodiment is different from the semiconductor package 200 in the second embodiment in that the semiconductor package 200 is connected to the ceramic substrate 320 with wires 331.

Moreover, output side vias 321, rewiring 322, and the external terminals 253 are provided on the ceramic substrate 320. The output side vias 321 penetrate the ceramic substrate 320. One end of each of the output side vias 321 is connected to the corresponding wire 331. Moreover, each of the external terminals 253 is connected to the corresponding output side via 321 or the rewiring 322.

Figure 16:
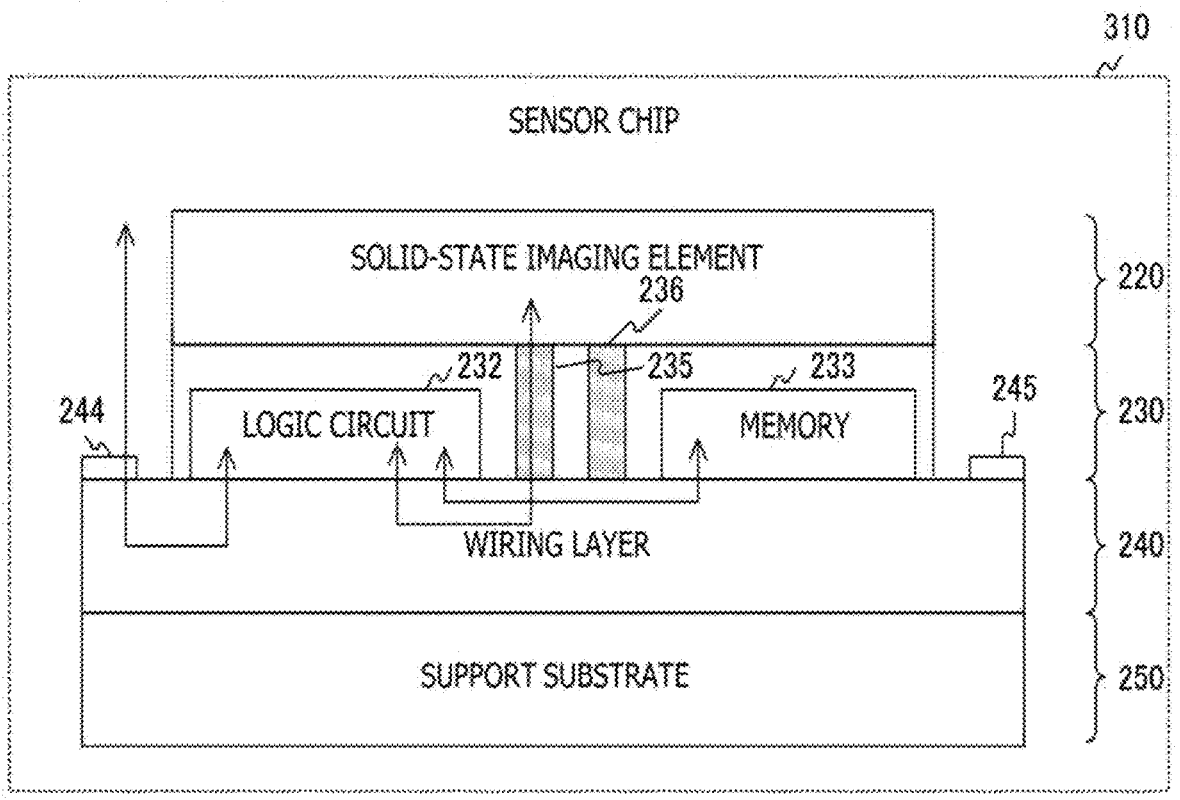
FIG. 16 is a cross-sectional diagram schematically depicting a configuration of a sensor chip according to the first modification of the second embodiment of the present technology.

FIG. 16 is a cross-sectional diagram schematically depicting a configuration of the sensor chip 310 according to the second embodiment of the present technology. As depicted in the figure by way of example, the output sides vias 255 are not formed in the support substrate 250. In this case, a via does not penetrate the logic circuit 232 and the like, and therefore, via penetration does not change the characteristics of the logic circuit 232 and the like. Accordingly, a yield drop produced by characteristic changes can be reduced.

Moreover, areas of the wiring layer 240 and the support substrate 250 as viewed in the Z-axis direction are smaller than those areas of the solid-state imaging element 220 and the circuit layer 230. Accordingly, a space is produced in an upper surface of the wiring layer 240 around a region corresponding to the solid-state imaging element 220 on an assumption that the light reception side corresponds to the upper side. A predetermined number of pads such as pads 244 and 245 are provided in this space. These pads are connected to the wires 311. The logic circuit 232 outputs data to the ceramic substrate 320 through the wires 311.

Figure 17:
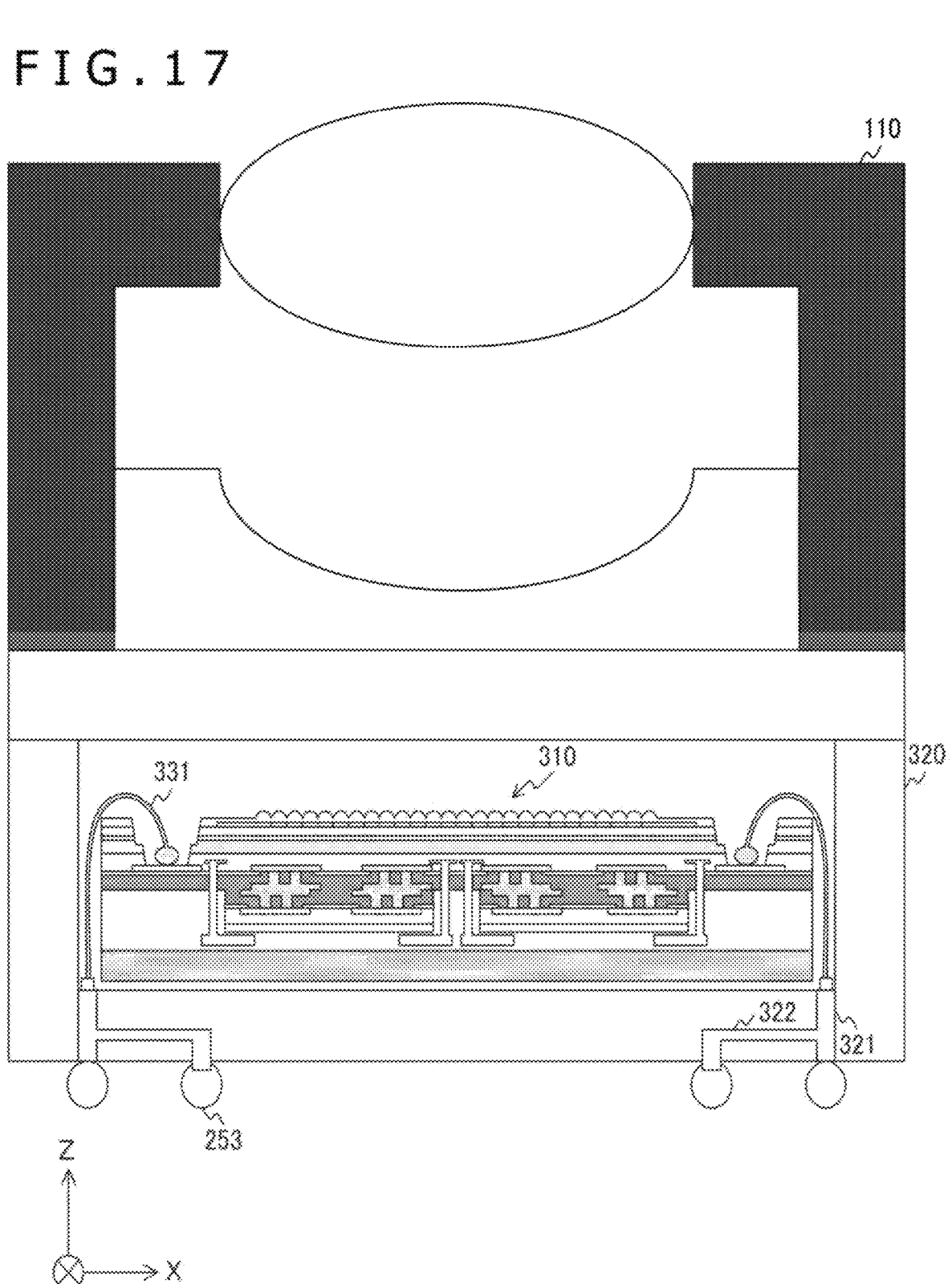
FIG. 17 is a cross-sectional diagram depicting the semiconductor package and an optical unit 110 according to the first modification of the second embodiment of the present technology.

FIG. 17 is a cross-sectional diagram depicting the semiconductor package 200 and the optical unit 110 according to the first modification of the second embodiment of the present technology. As depicted in the figure by way of example, the glass 210 of the semiconductor package 200 is attached to the optical unit 110 equipped with a lens and a lens holder. Note that each of the semiconductor packages 200 other than the first modification of the second embodiment is also attached in this manner depicted in the figure by way of example.

According to the first modification of the second embodiment of the present technology, as described above, the wiring layer 240 below the logic circuit 232 and the like is connected to the ceramic substrate 320 through use of the wires 331. In this case, the necessity of penetration of vias through the logic circuit 232 and the like is eliminated. Accordingly, the characteristics of the logic circuit 232 and the like are not changed by penetration of vias, and therefore a yield drop produced by the characteristic changes can be reduced.

Second Modification

According to the second embodiment described above, the sensor chip 310 is disposed in the ceramic substrate 320, and sealed with the glass 210. However, the glass 210 can also directly be mounted on the sensor chip 310 with resin interposed therebetween without providing the ceramic substrate. Such a semiconductor package described above is called a GoC (Glass on Chip) package. The semiconductor package 200 according to a second modification of the second embodiment is different from the semiconductor package 200 in the second embodiment in that the semiconductor package 200 is a GoC package.

Figure 18:
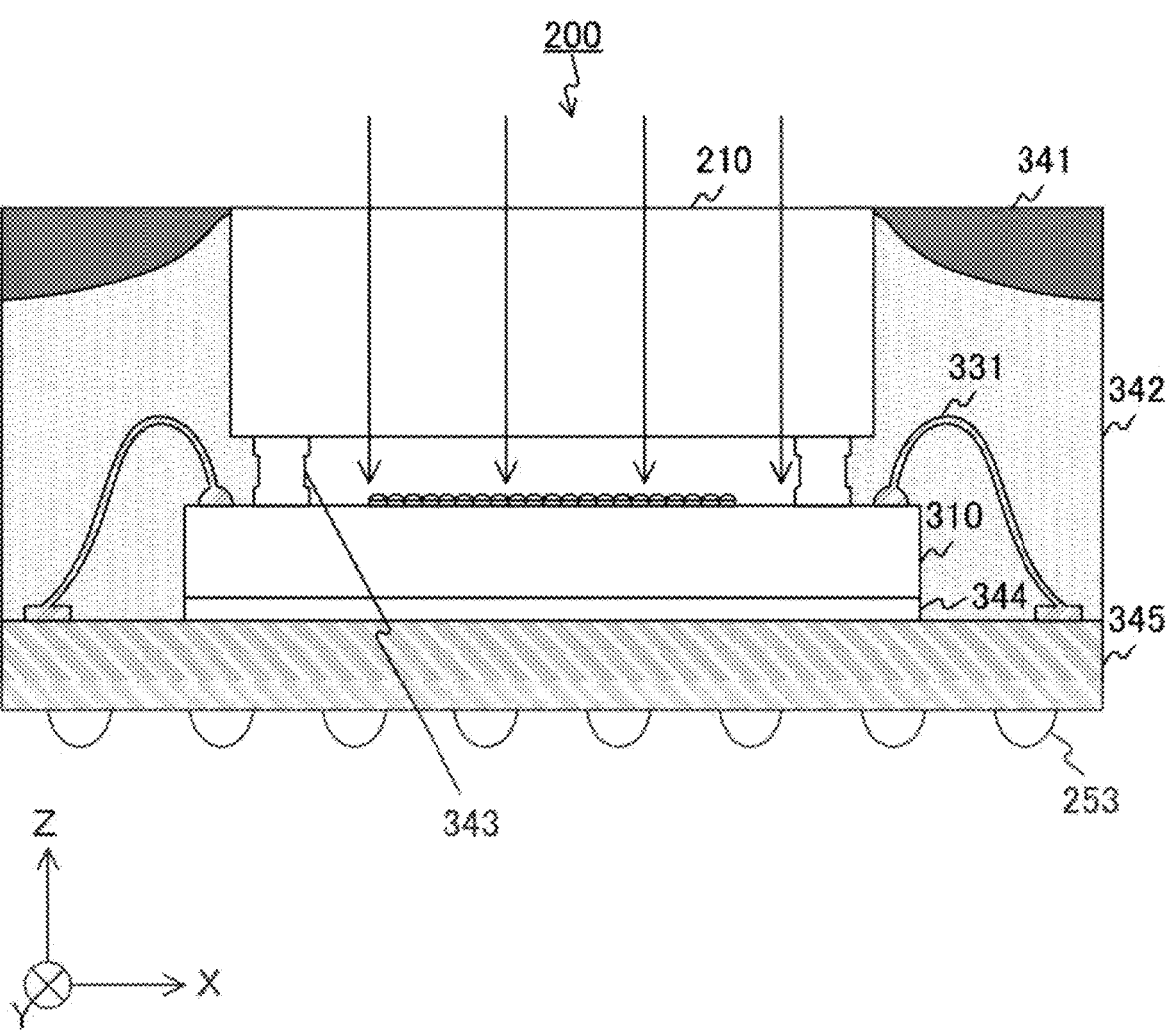
FIG. 18 is a cross-sectional diagram depicting a configuration example of a semiconductor package according to a second modification of the second embodiment of the present technology.

FIG. 18 is a cross-sectional diagram depicting a configuration example of the semiconductor package 200 according to the second modification of the second embodiment of the present technology. The semiconductor package 200 according to the second modification of the second embodiment is different from the semiconductor package 200 in the second embodiment in that an interposer 345 is provided instead of the ceramic substrate 320. In addition, a configuration of the sensor chip 310 according to the second modification of the second embodiment is similar to the corresponding configuration of the first modification of the second embodiment.

A lower surface of the sensor chip 310 is bonded to the interposer 345 through use of an adhesive 344 on an assumption that the light reception side corresponds to the upper side. Moreover, the sensor chip 310 is connected to the interposer 345 through the wires 331.

Furthermore, the external terminals 253 are formed on a lower surface of the interposer 345. Vias and rewiring are formed in the interposer 345 to connect the wires 331 and the external terminals 253 through these vias and rewiring. For example, the interposer 345 includes an organic substrate.

Moreover, a periphery of the sensor chip 310 as viewed in the Z direction is filled with potting resin 342. Mold resin 341 having a flat upper portion is formed on an upper portion of the potting resin 342. Furthermore, spacer resin 343 is formed on an upper surface of the sensor chip 310 between the periphery of the pixel array unit and the glass 210.

As depicted in the figure by way of example, a semiconductor package structured such that the glass 210 is mounted on the chip (sensor chip 310) is called a GoC package.

Figures 19A, 19B, 19C, 19D:
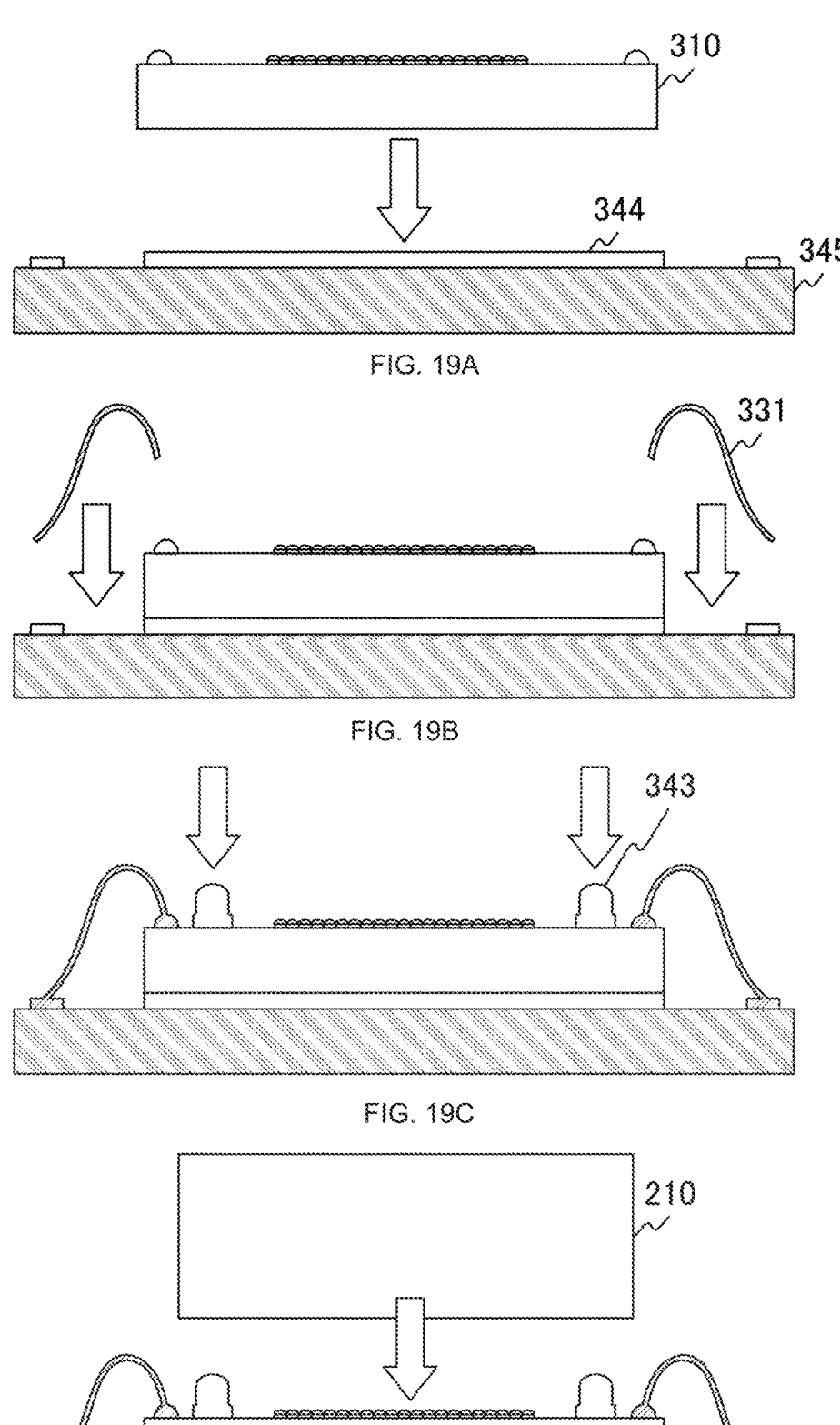
FIGS. 19A, 19B, 19C, and 19D are diagrams for explaining steps until mounting of a glass is carried out, according to the second modification of the second embodiment of the present technology.

FIGS. 19A, 19B, 19C, and 19D are diagrams for explaining steps until mounting of the glass is carried out according to the second modification of the second embodiment of the present technology. FIG. 19A is a diagram for explaining a step of mounting the sensor chip 310. FIG. 19B is a diagram for explaining a step of wire bonding. FIG. 19C is a diagram for explaining a step of forming the spacer resin 343. A part "d" in the figure is a diagram for explaining a step of mounting the glass 210.

As depicted in FIG. 19A by way of example, the manufacturing system mounts the sensor chip 310 on the upper surface of the wafer-shaped interposer 345, and bonds the sensor chip 310 to the upper surface. Thereafter, as depicted in FIG. 19A by way of example, the manufacturing system connects the sensor chip 310 to the interposer 345 through the wires 331. Subsequently, as depicted in FIG. 19C, the manufacturing system forms the spacer resin 343 around the pixel array unit, and mounts the glass 210 on the spacer resin 343 and fixes the glass 210 to the spacer resin 343 as depicted in FIG. 19D.

Figure 20A:
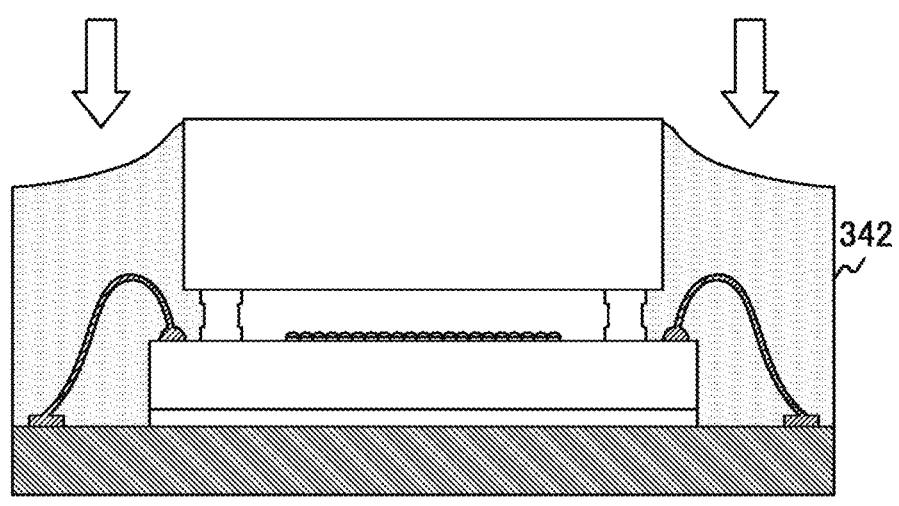
FIGS. 20A, 20B, and 20C are diagrams for explaining steps until formation of external terminals is carried out, according to the second modification of the second embodiment of the present technology.
Figure 20B:
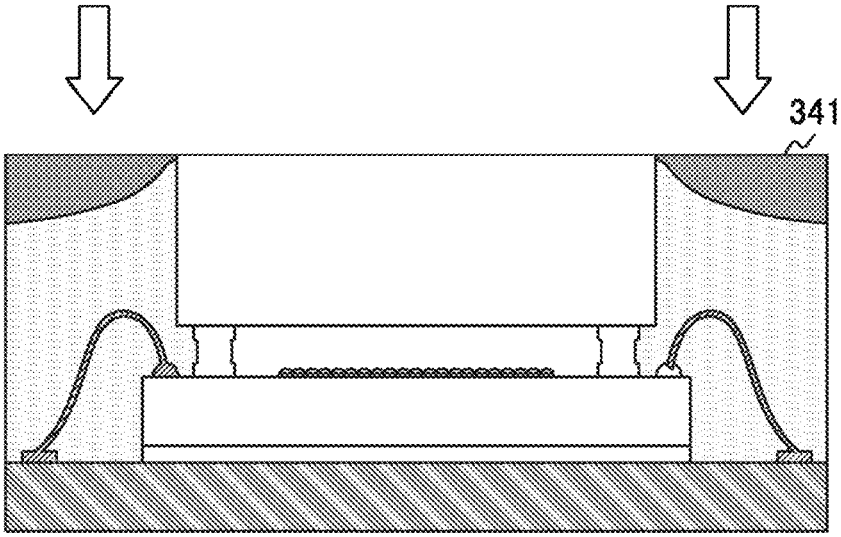
Figure 20C:
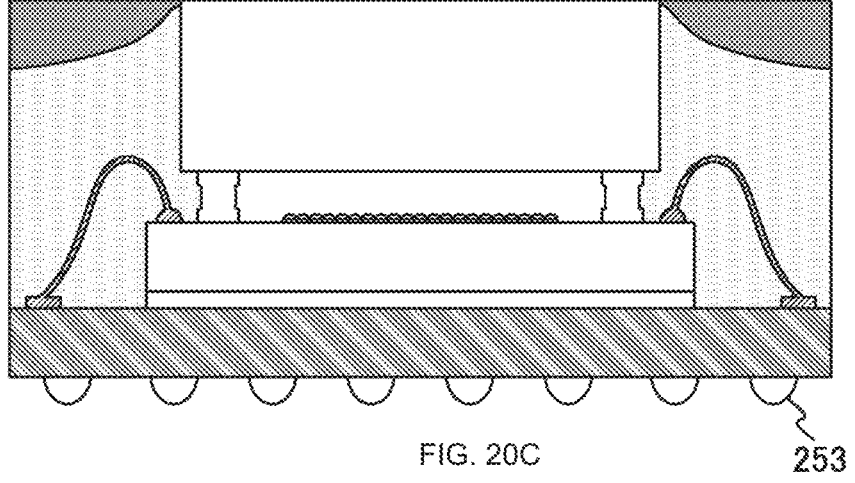

FIG. 20 is a diagram for explaining steps until formation of the external terminals 253 is carried out according to the second modification of the second embodiment of the present technology. FIG. 20A is a diagram for explaining a step of forming the potting resin 342. FIG. 20B is a diagram for explaining a step of forming the mold resin 341. FIG. 20C is a diagram for explaining a step of forming the external terminals 253.

As depicted in FIG. 20A by way of example, the manufacturing system forms the potting resin 342 around the sensor chip 310, and embeds the wires 331 in the potting resin 342. Thereafter, as depicted in FIG. 20B, the manufacturing system forms the mold resin 341 on the upper portion of the potting resin 342 to produce a flat shape. Subsequently, as depicted in FIG. 20C, the manufacturing system provides a predetermined number of the external terminals 253 (e.g., solder balls) on the lower surface of the interposer 345. Then, the manufacturing system produces a plurality of individual packages by dicing.

According to the second modification of the second embodiment of the present technology, as described above, the sensor chip 310 is connected to the interposer 345 through the wires 331. In this case, the necessity of penetrating vias through the logic circuit 232 and the like is eliminated. Accordingly, the characteristics of the logic circuit 232 and the like are not changed by penetration of vias, and therefore, a yield drop produced by the characteristic changes can be reduced.

Third Modification

According to the second embodiment described above, the sensor chip 310 is connected to the ceramic substrate 320 through the output side vias 255. However, this connection can also be made by flip chip connection. The semiconductor package 200 according to a third modification of the second embodiment is different from the semiconductor package 200 in the second embodiment in that the sensor chip 310 is connected to a rewiring layer through bumps.

Figure 21:
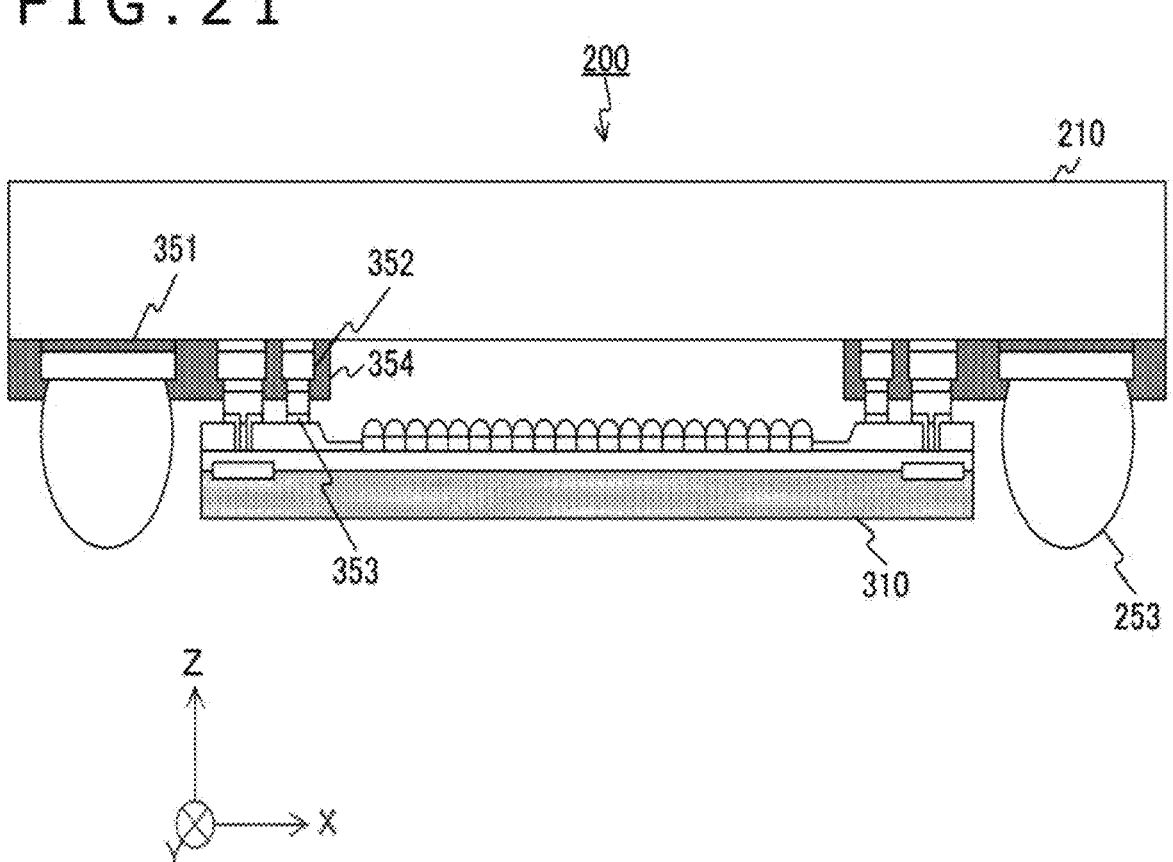
FIG. 21 is a cross-sectional diagram depicting a configuration example of a semiconductor package according to a third modification of the second embodiment of the present technology.

FIG. 21 is a cross-sectional diagram depicting a configuration example of the semiconductor package 200 according to the third modification of the second embodiment of the present technology. The semiconductor package 200 according to the third modification of the second embodiment is different from the semiconductor package 200 in the second embodiment in that a rewiring layer 354 is provided instead of the ceramic substrate 320. In addition, a configuration of the sensor chip 310 according to the third modification of the second embodiment is similar to the corresponding configuration of the first modification of the second embodiment. However, bumps 353 are provided on the sensor chip 310 instead of the pad 244 and the like.

The rewiring layer 354 is formed on the lower surface of the glass 210 in a region other than the region corresponding to the pixel array unit on an assumption that the light reception side corresponds to the upper side. Rewiring 351, seal rings 352, and the external terminals 253 (e.g., solder balls) are provided in the rewiring layer 354.

Moreover, the sensor chip 310 is connected to the rewiring layer 354 through the bumps 353 (i.e., flip chip connection). A connection portion of each of the bumps 353 is sealed by the corresponding seal ring 352.

Figure 22A:
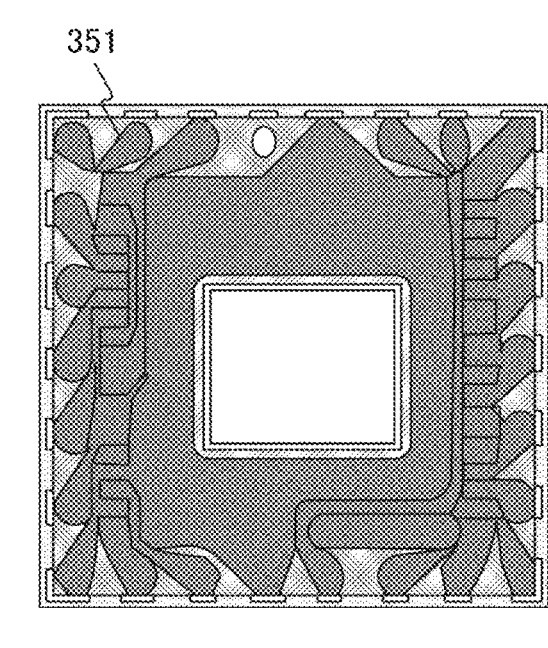
FIGS. 22A and 22B depict a top diagram and a bottom diagram of the semiconductor package according to the third modification of the second embodiment of the present technology.
Figure 22B:
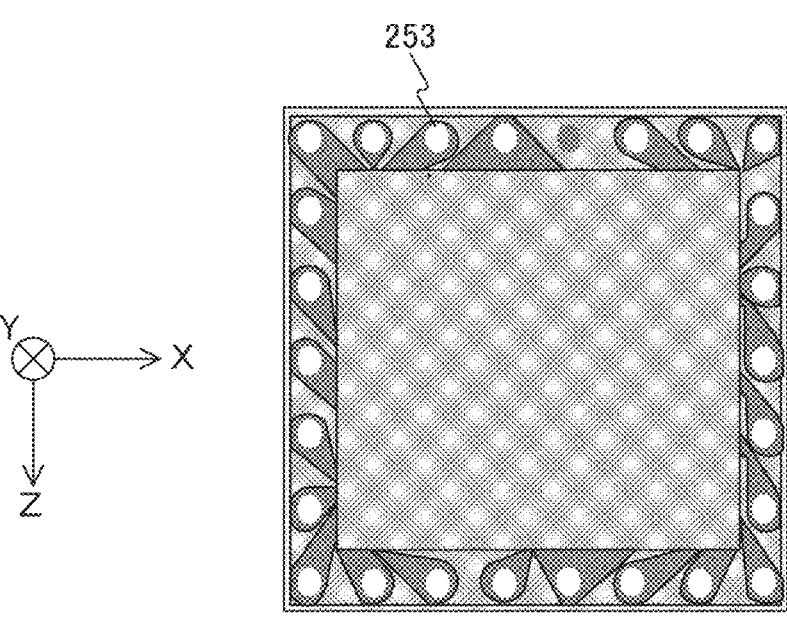

FIGS. 22A and 22B depicts a top diagram and a bottom diagram of the semiconductor package 200 according to the third modification of the second embodiment of the present technology. FIG. 22A is a top diagram of the semiconductor package 200. FIG. 22B is a bottom diagram of the semiconductor package 200.

As depicted in FIG. 22A by way of example, the rewiring 351 is visually recognizable through the glass 210 as viewed from the upper side of the semiconductor package 200. Moreover, as depicted in FIG. 22B by way of example, the external terminals 253 are arranged along an outer circumference of the lower surface of the semiconductor package 200. The package having the configuration depicted in FIGS. 21, 22A, and 22B by way of example is called an FOCSP (Fan-Out Chip Size/Scale Package).

According to the third modification of the second embodiment of the present technology, as described above, the sensor chip 310 is connected to the rewiring layer 354 by flip chip connection. In this case, the necessity of penetration of vias through the logic circuit 232 and the like is eliminated. Accordingly, the characteristics of the logic circuit 232 and the like are not changed by penetration of vias, and therefore, a yield drop produced by the characteristic changes can be reduced.

Fourth Modification

According to the second embodiment described above, the sensor chip 310 is connected to the ceramic substrate 320. However, the sensor chip 310 can also be bonded to a frame-attached interposer. The semiconductor package 200 according to a fourth modification of the second embodiment is different from the semiconductor package 200 in the second embodiment in that the sensor chip 310 is connected to a frame-attached interposer.

Figure 23:
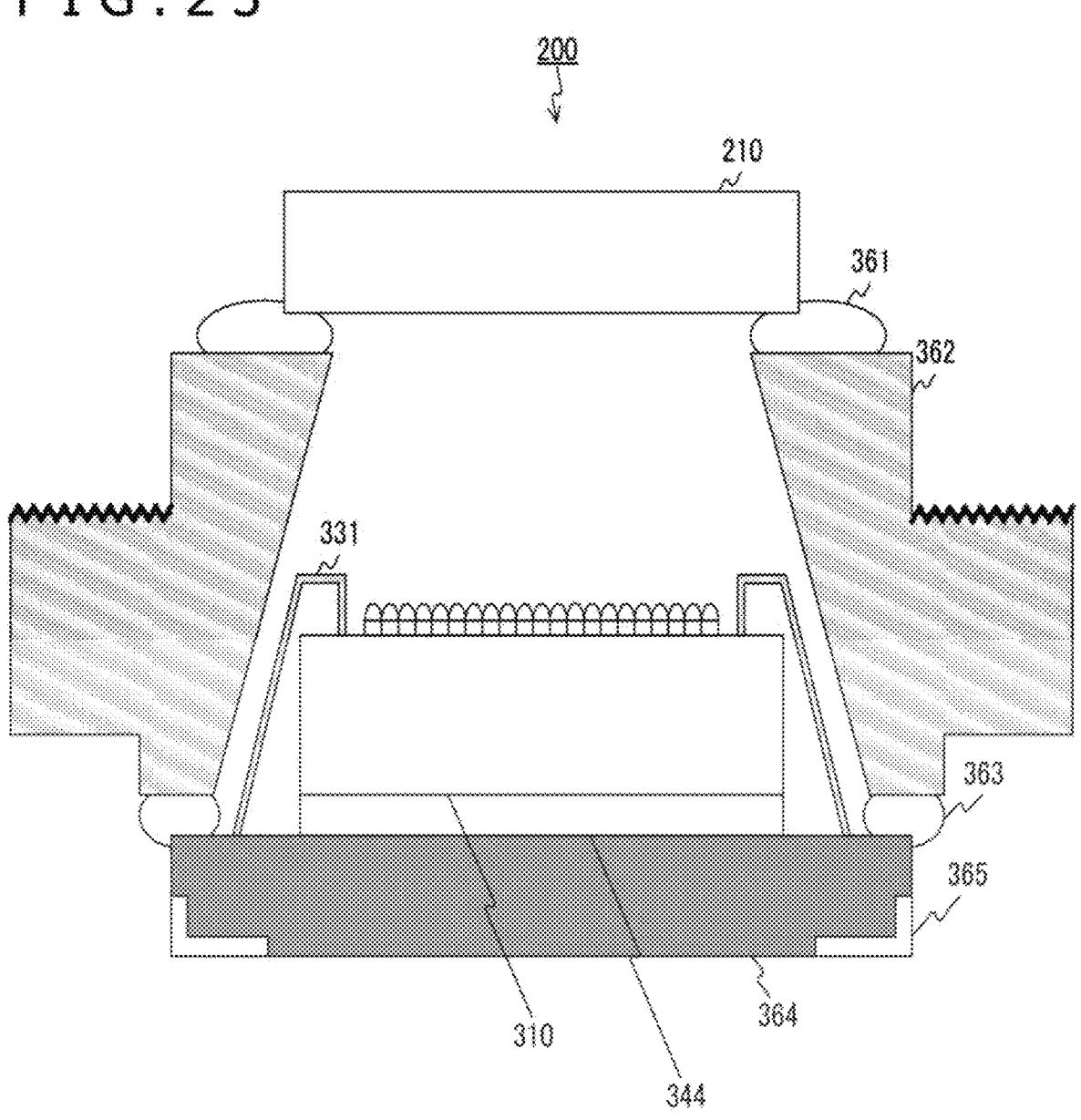
FIG. 23 is a cross-sectional diagram depicting a configuration example of a semiconductor package according to a fourth modification of the second embodiment of the present technology.

FIG. 23 is a cross-sectional diagram depicting a configuration example of a semiconductor package 200 according to the fourth modification of the second embodiment of the present technology. The semiconductor package 200 according to the fourth modification of the second embodiment is different from the semiconductor package 200 in the second embodiment in that a frame 362 and a ceramic interposer 364 are provided instead of the ceramic substrate 320. In addition, a configuration of the sensor chip 310 according to the fourth modification of the second embodiment is similar to the corresponding configuration of the first modification of the second embodiment.

A lower surface of the sensor chip 310 is bonded to the ceramic interposer 364 through the adhesive 344 on an assumption that the light reception side corresponds to the upper side. Moreover, the sensor chip 310 is connected to the ceramic interposer 364 through wires 331.

Furthermore, external terminals 365 such as lands are formed on a lower surface of the ceramic interposer 364. Vias and rewiring are formed in the ceramic interposer 364 to connect the wires 331 and the external terminals 365 through these via and rewiring.

An upper surface of the ceramic interposer 364 around the sensor chip 310 is connected to the frame 362 by a sealing agent 363. The frame 362 is a member which has a bowl-shaped inner wall, and has an outer wall having a reference surface perpendicular to the Z axis. Bold wavy lines in the figure each indicate the reference surface. This reference surface is attached to a camera module or the like. Moreover, an upper surface of the frame 362 is connected to the glass 210 through a sealing agent 361.

According to the third modification of the second embodiment of the present technology, as described above, the sensor chip 310 is connected to the ceramic interposer 364 through the wires 331. In this case, the necessity of penetrating vias through the logic circuit 232 and the like is eliminated. Accordingly, the characteristics of the logic circuit 232 and the like are not changed by penetration of vias, and therefore, a yield drop produced by the characteristic changes can be reduced.

Fifth Modification

According to the second embodiment described above, solder balls are provided as the external terminals 253. However, pads can be provided instead of solder balls. The semiconductor package 200 according to a fifth modification of the second embodiment is different from the semiconductor package 200 in the second embodiment in that pads are provided as the external terminals.

Figure 24:
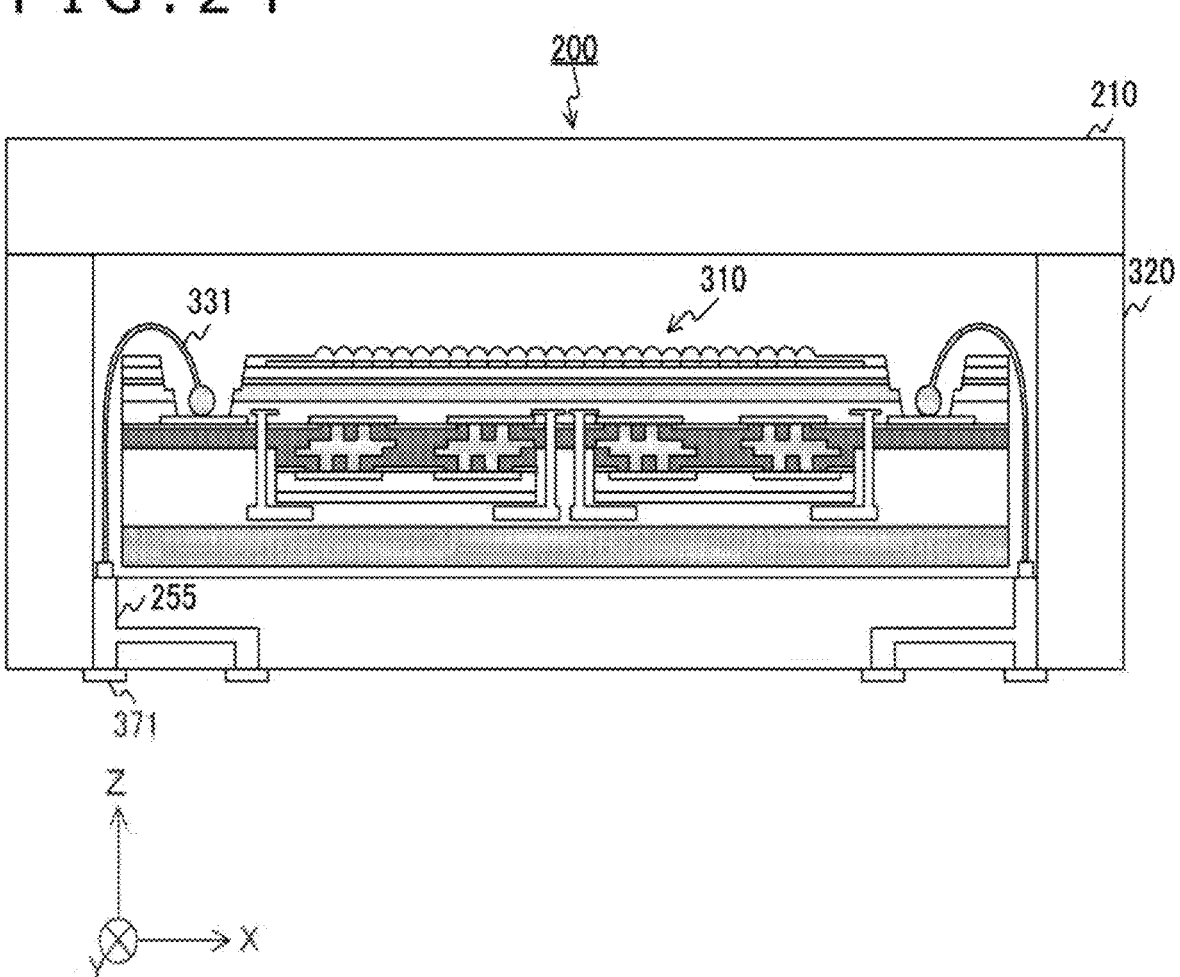
FIG. 24 is a cross-sectional diagram depicting a configuration example of a semiconductor package according to a fifth modification of the second embodiment of the present technology.

FIG. 24 is a cross-sectional diagram depicting a configuration example of the semiconductor package 200 according to the fifth modification of the second embodiment of the present technology. The semiconductor package 200 according to the fifth modification of the second embodiment is different from the semiconductor package 200 in the second embodiment in that pads are provided as external terminals 371 instead of the external terminals 253 (solder balls).

According to the fifth modification of the second embodiment of the present technology, as described above, the pads are provided instead of the solder balls. Accordingly, wire bonding or the like is allowed to be used.

Sixth Modification

According to the second embodiment described above, the sensor chip 310 is connected to the ceramic substrate 320 through use of the output side vias 255. However, this connection can also be made by flip chip connection. The semiconductor package 200 according to a sixth modification of the second embodiment is different from the semiconductor package 200 in the second embodiment in that the sensor chip 310 is connected to the ceramic substrate 320 by flip chip connection.

FIG. 25 is a cross-sectional diagram depicting a configuration example of the semiconductor package 200 according to the sixth modification of the second embodiment of the present technology. The semiconductor package 200 according to the sixth modification of the second embodiment is different from the semiconductor package 200 in the second embodiment in that the sensor chip 310 is connected to the ceramic substrate 320 through use of bumps 381. In addition, a configuration of the sensor chip 310 according to the sixth modification of the second embodiment is similar to the corresponding configuration of the first modification of the second embodiment.

Moreover, the ceramic substrate 320 covers the upper surface of the sensor chip 310 around the pixel array unit, and a side surface of the sensor chip 310.

According to the sixth modification of the second embodiment of the present technology, as described above, the wiring layer 240 below the logic circuit 232 and the like is connected to the ceramic substrate 320 through the bumps 381. In this case, the necessity of penetration of vias through the logic circuit 232 and the like is eliminated. Accordingly, the characteristics of the logic circuit 232 and the like are not changed by penetration of vias, and therefore, a yield drop produced by the characteristic changes can be reduced.

3. Third Embodiment

According to the first embodiment described above, the logic circuit 232 and the memory 233 are provided below the solid-state imaging element 220. In this case, however, a light emitting element needs to be equipped to achieve a function of measuring a distance through use of a ToF (Time of Flight) system. The semiconductor package 200 according to a third embodiment is different from the semiconductor package 200 in the first embodiment in that a light emitting element is provided.

FIG. 26 is a cross-sectional diagram depicting a configuration example of the semiconductor package 200 according to the third embodiment of the present technology. The semiconductor package 200 according to the third embodiment is different from the semiconductor package 200 in the first embodiment in that a light emitting element 411 is further provided.

The light emitting element 411 emits light such as infrared light. For example, the light emitting element 411 includes an LED (Light Emitting Diode) or a laser diode. The light emitting element 411 is provided in the circuit layer 230.

Moreover, an opening 410 penetrating from the upper surface (i.e., light reception surface) of the solid-state imaging element 220 to the light emitting element 411 in the Z direction is formed in the solid-state imaging element 220 and the circuit layer 230 on an assumption that the light reception side corresponds to the upper side. The light emitting element 411 is allowed to irradiate light through the opening 410. An arrow in the figure indicates an irradiation direction of light from the light emitting element 411.

As depicted in the figure by way of example, the number of lead terminals from the sensor chip can be reduced by embedding the light emitting element 411 in the circuit layer 230. This reduction of the number of lead terminals contributes to size reduction of a ToF module through use of the semiconductor package 200, and cost reduction in a case of use of an interposer. Moreover, by embedding the light emitting element 411 in the circuit layer 230, a distance between the light receiving element (solid-state imaging element 220) and the light emitting element 411 can be reduced in the X-axis direction and the Y-axis direction. In this manner, distance measurement accuracy improves.

While the light emitting element 411 is embedded in this example, an element other than the light emitting element 411 can also be embedded. For example, a temperature sensor, a humidity sensor, or a pressure sensor can also be embedded. By embedding these sensors, circuits inside the semiconductor package (e.g., logic circuit 232) and outside the semiconductor package are capable of detecting the presence or absence of an abnormality in the semiconductor package 200, and giving feedback to driving of the sensors.

Note that the light emitting element 411 is an example of an embedded element included in the claims.

Figure 27:
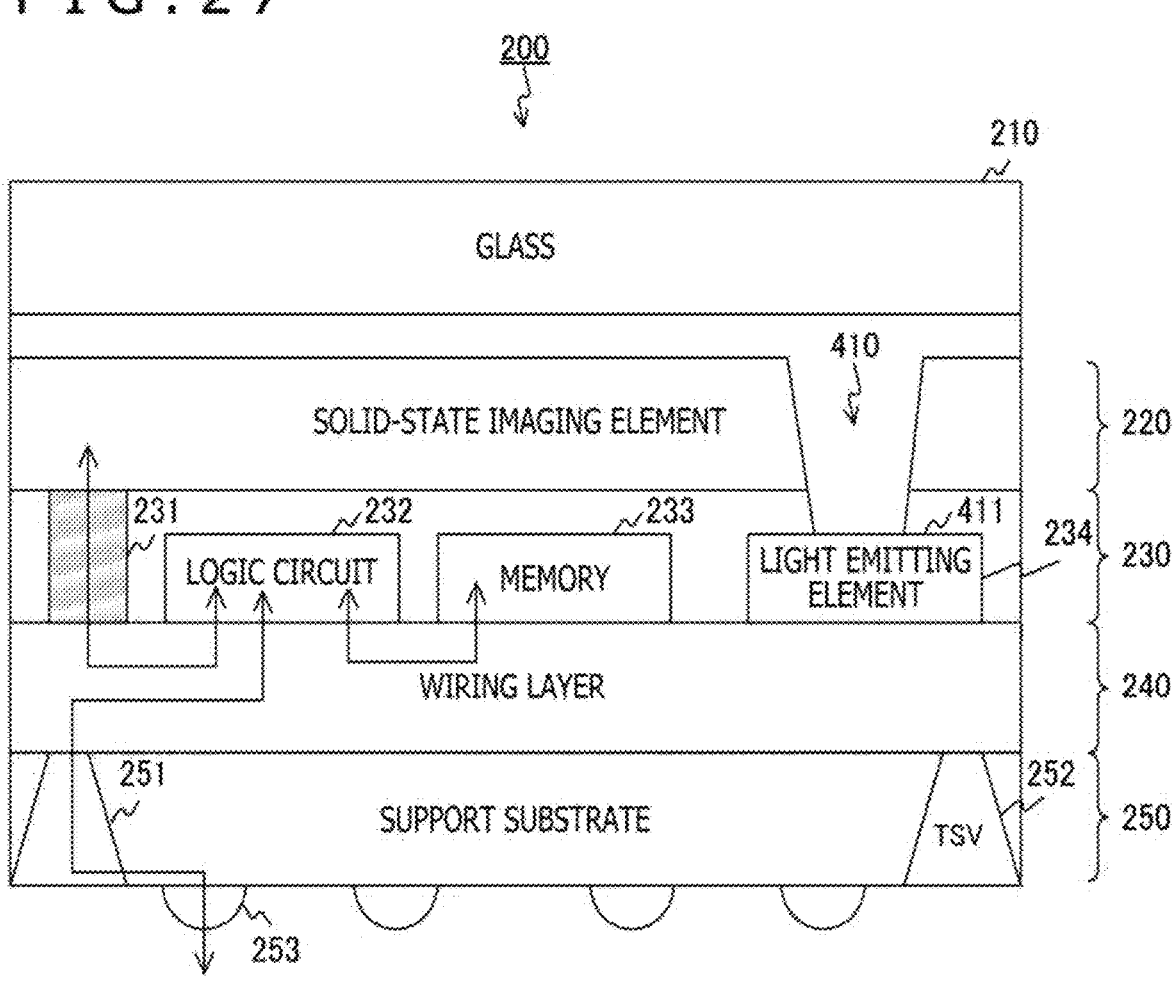
FIG. 27 is a cross-sectional diagram schematically depicting a configuration of the semiconductor package according to the third embodiment of the present technology.

FIG. 27 is a cross-sectional diagram schematically depicting a configuration of the semiconductor package 200 according to the third embodiment of the present technology.

The logic circuit 232 irradiates an object with irradiation light by controlling the light emitting element 411. Thereafter, the solid-state imaging element 220 receives reflection light of the irradiation light, and the logic circuit 232 measures a distance to the object through use of the ToF system. The logic circuit 232 outputs measurement data thus obtained to the outside through the external terminals 253. Note that a control circuit outside the semiconductor package 200 can also control a light emitting operation of the light emitting element 411 instead of the logic circuit 232.

Figure 28A:
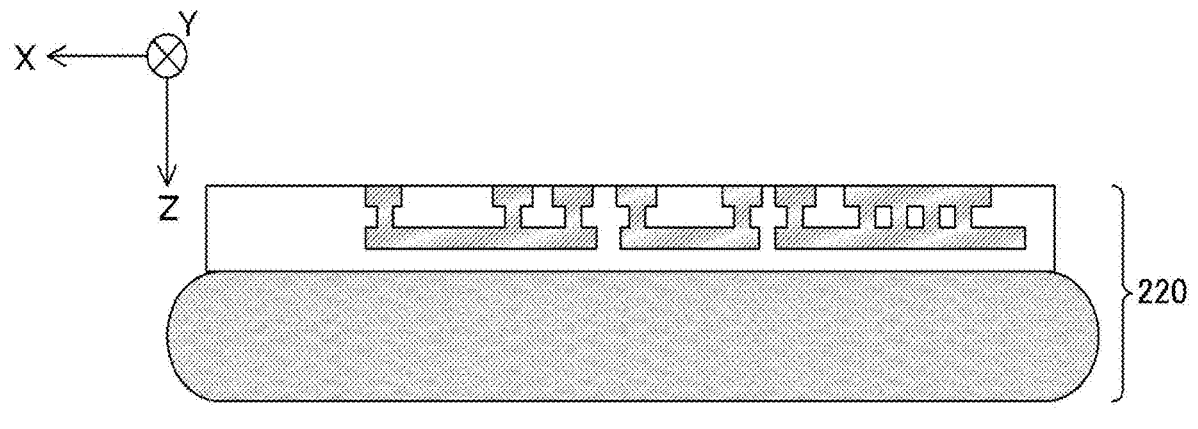
FIGS. 28A, 28B, and 28C are diagrams for explaining steps until reduction of thicknesses of a logic circuit and the like is carried out, according to the third embodiment of the present technology.
Figure 28B:
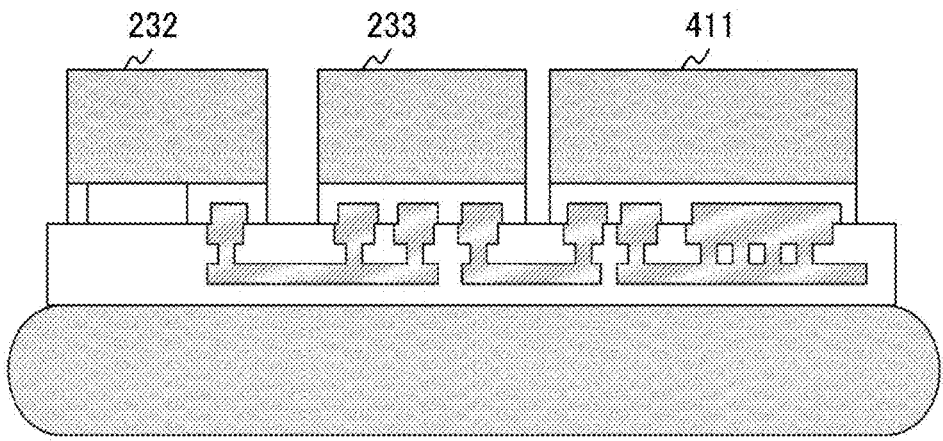
Figure 28C:
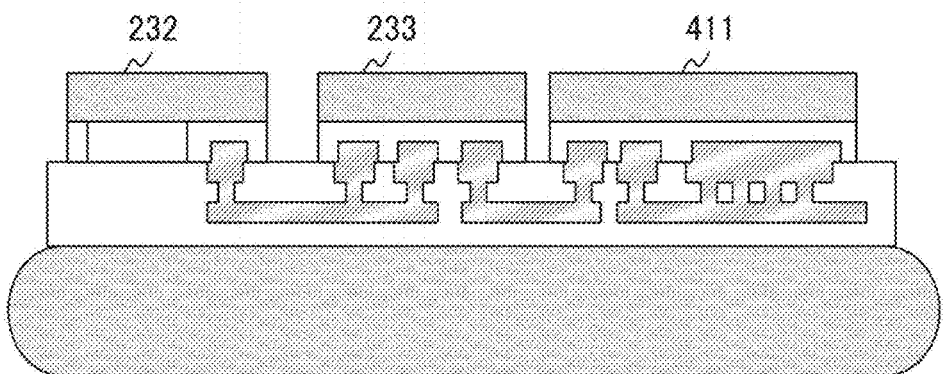

FIGS. 28A, 28B, and 28C are diagrams for explaining steps until reduction of thicknesses of the logic circuit 232 and the like is carried out according to the third embodiment of the present technology. FIG. 28A is a diagram for explaining a step of forming the solid-state imaging element 220. FIG. 28B is a diagram for explaining a step of connecting the logic circuit 232 and the like. FIG. 28C is a diagram for explaining steps until reduction of the thicknesses of the logic circuit 232 and the like is carried out.

As depicted in FIG. 28A by way of example, the manufacturing system forms the solid-state imaging element 220 for each of chip regions in a wafer divided into a plurality of the chip regions. Thereafter, as depicted in FIG. 28B by way of example, the manufacturing system connects the logic circuit 232, the memory 233, and the light emitting element 411 to the solid-state imaging element 220 by Cu—Cu bonding or other methods. Subsequently, as depicted in FIG. 28C by way of example, the manufacturing system reduces the thicknesses of the logic circuit 232 and the like as necessary.

Figure 29A:
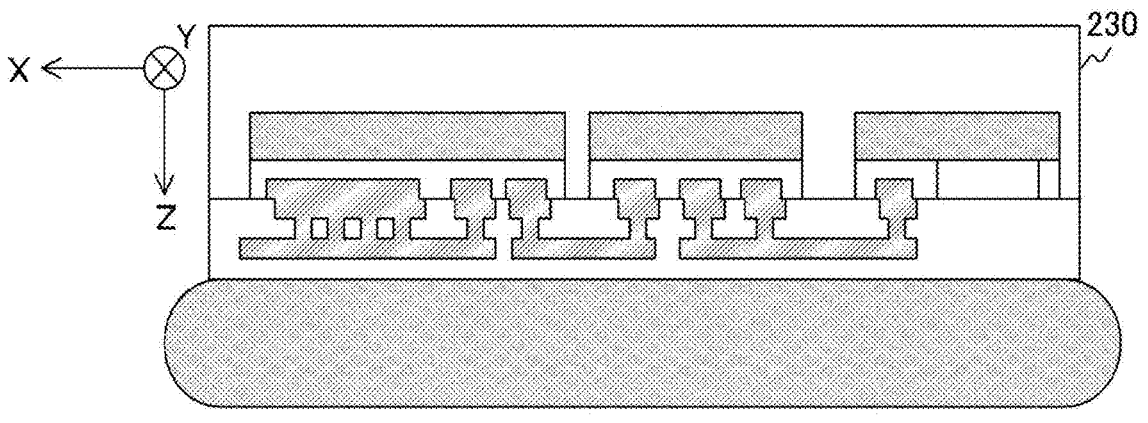
FIGS. 29A, 29B, and 29C are diagrams for explaining steps until connection of a support substrate is carried out, according to the third embodiment of the present technology.
Figure 29B:
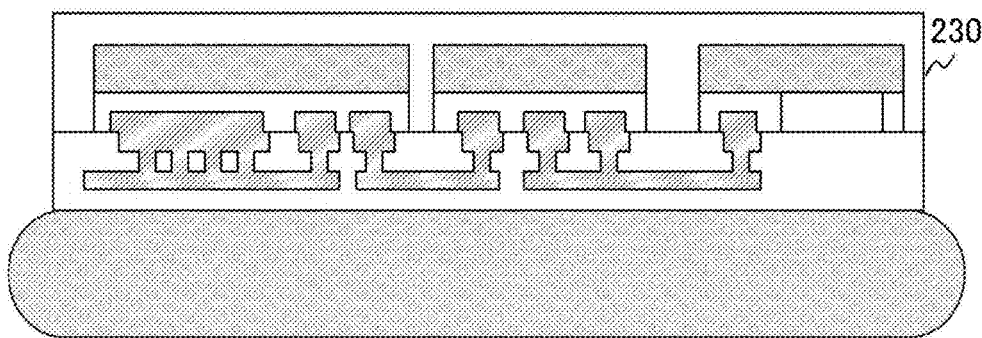
Figure 29C:
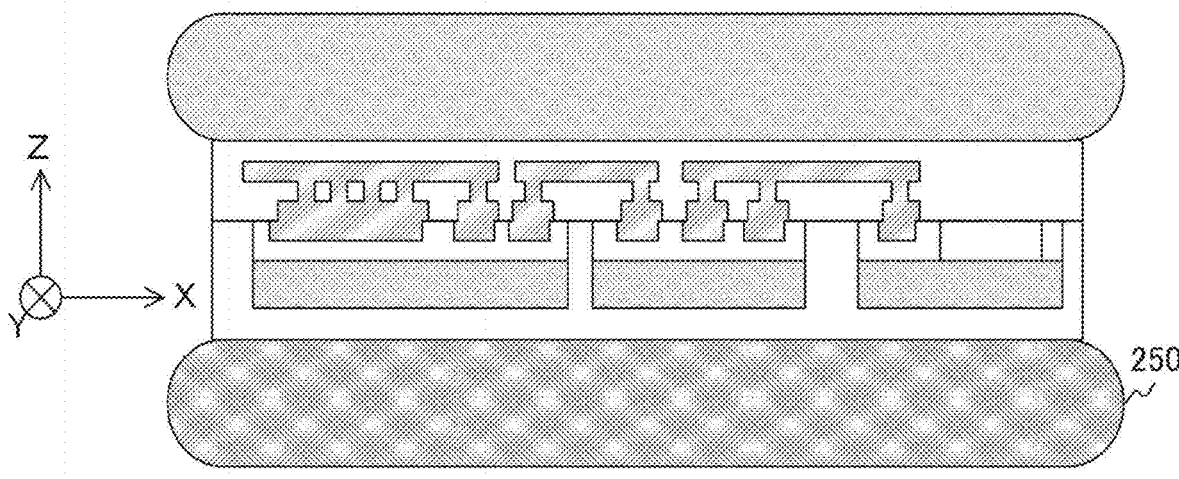

FIGS. 29A, 29B, and 29C are diagrams for explaining steps until connection of the support substrate 250 is carried out according to the third embodiment of the present technology. FIG. 29A is a diagram for explaining a step of embedding the logic circuit 232 and the like in an insulation film. FIG. 29B is a diagram for explaining a step of flattening the circuit layer 230. FIG. 29C is a diagram for explaining a step of connecting the support substrate 250.

As depicted in FIG. 29A by way of example, the manufacturing system embeds the logic circuit 232 and the like in the insulation film to form the circuit layer 230. Thereafter, as depicted in FIG. 29B by way of example, the manufacturing system flattens the circuit layer 230. Subsequently, as depicted in FIG. 29C by way of example, the manufacturing system positions the circuit layer 230 on the lower side, and connects the circuit layer 230 to the wafer-shaped support substrate 250 by Cu—Cu bonding or the like.

Figure 30:
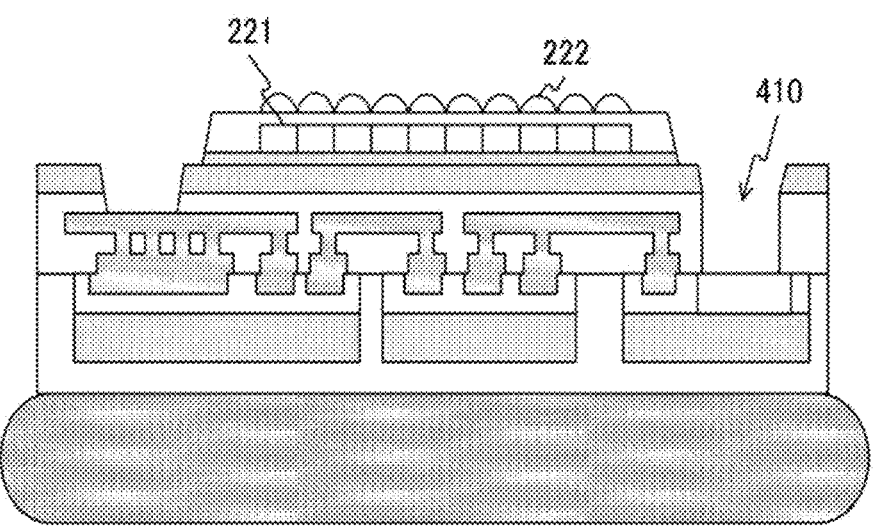
FIG. 30 is a diagram for explaining a step of forming an opening according to the third embodiment of the present technology.

FIG. 30 is a diagram for explaining a step of forming the opening 410 according to the third embodiment of the present technology. As depicted in the figure by way of example, the manufacturing system forms the opening 410 penetrating to the light emitting element 411. Moreover, the manufacturing system provides a plurality of the pixels 221 on the solid-state imaging element 220, and forms the color filter (not depicted) and the on-chip lens 222 for each of the pixels 221.

Thereafter, the manufacturing system forms the output side vias 251 and 254, the rewiring 252, and the external terminals 253 on the support substrate 250. In addition, the manufacturing system forms the resin dam 261, seals the solid-state imaging element 220 with the glass 210, and executes dicing.

According to the third embodiment of the present technology, as described above, the light emitting element 411 is embedded in the circuit layer 230 in the semiconductor module 200. Accordingly, size reduction of the ToF module is achievable in comparison with a case where the light emitting element 411 is disposed outside the semiconductor module 200.

First Modification

According to the third embodiment, as described above, the sensor chip 310 is connected to the support substrate 250 through the output side vias 255. However, the sensor chip 310 can also be connected to a frame-attached substrate through wires. The semiconductor package 200 according to a first modification of the third embodiment is different from the semiconductor package 200 in the third embodiment in that the sensor chip 310 is connected to a frame-attached substrate.

Figure 31:
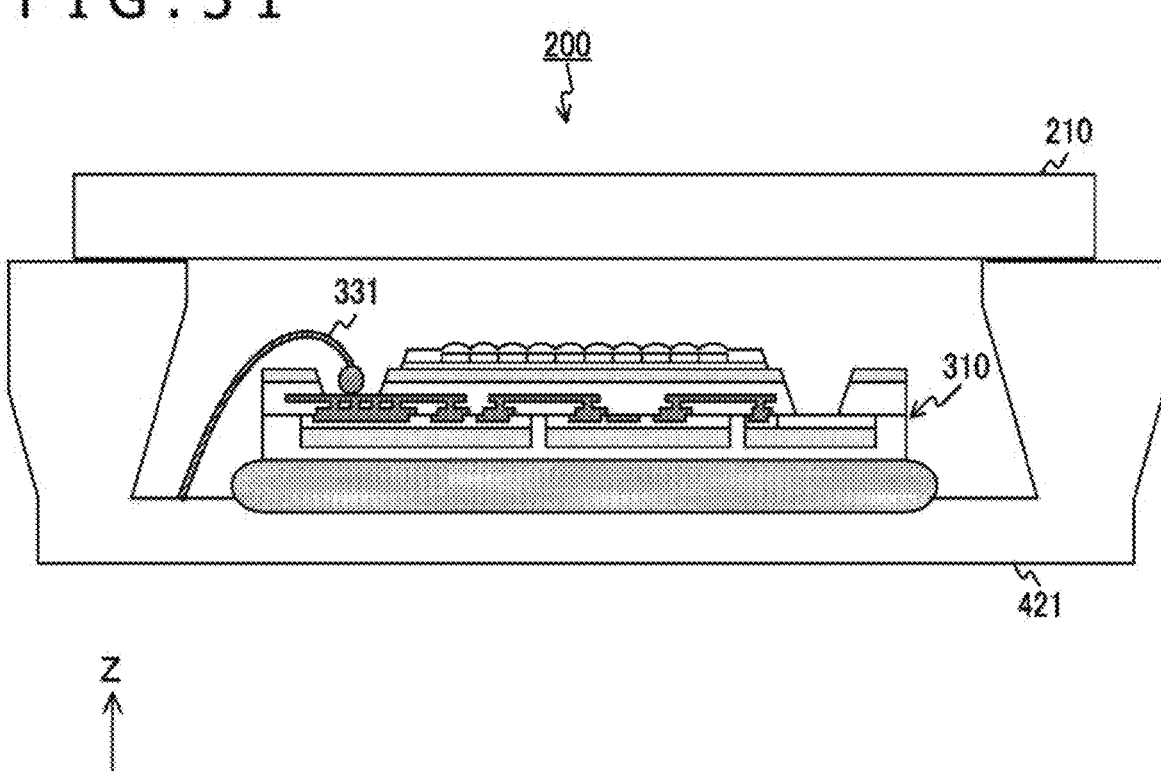
FIG. 31 is a cross-sectional diagram depicting a configuration example of a semiconductor package according to a first modification of the third embodiment of the present technology.

FIG. 31 is a cross-sectional diagram depicting a configuration example of the semiconductor package 200 according to the first modification of the third embodiment of the present technology. The semiconductor package 200 according to the first modification of the third embodiment is different from the semiconductor package 200 in the third embodiment in that a frame-attached substrate 421 is further provided.

The frame-attached substrate 421 is a substrate which has a frame on an outer circumference of the substrate. The sensor chip 310 is provided on a bottom surface of the frame-attached substrate 421. Moreover, the glass 210 is connected to a frame portion of the frame-attached substrate 421.

The sensor chip 310 is a chip where the solid-state imaging element 220, the circuit layer 230, the wiring layer 240, and the support substrate 250 are stacked in this order from the upper side on an assumption that the light reception side corresponds to the upper side. Configurations of the respective layers are similar to the corresponding configurations in the first embodiment. However, the sensor chip 310 is connected to the frame-attached substrate 421 through the wires 331.

Figure 32:
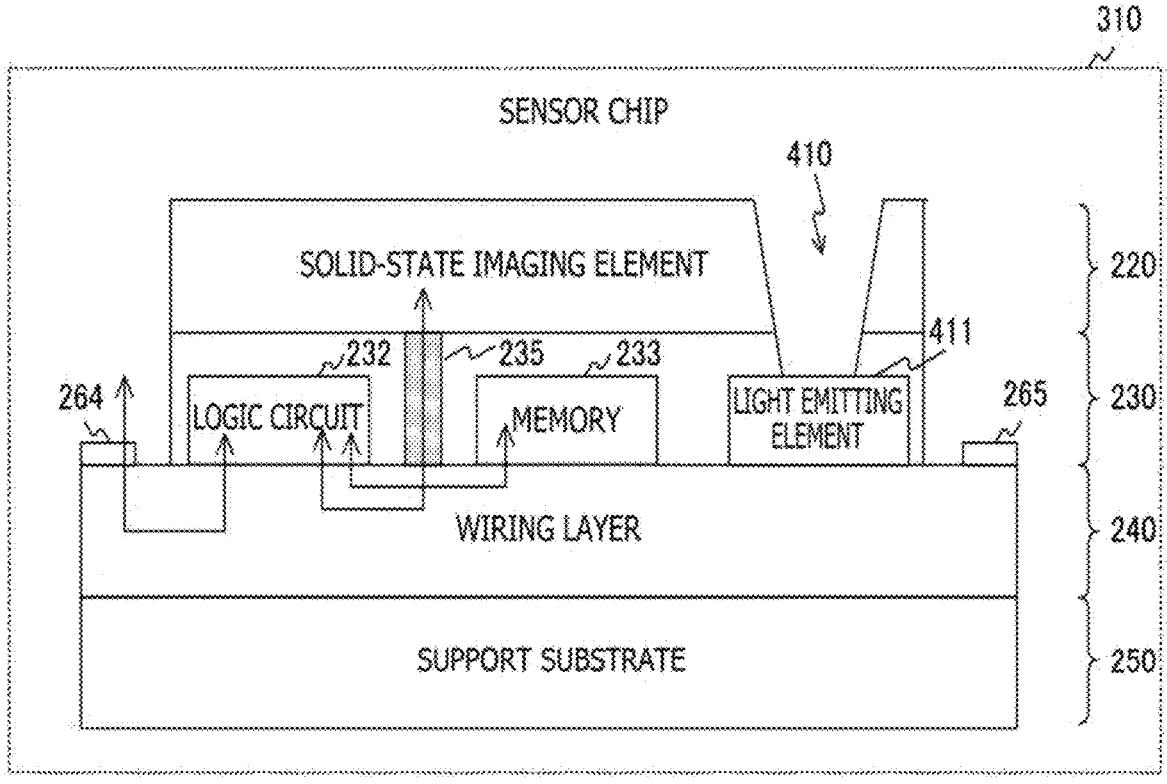
FIG. 32 is a cross-sectional diagram schematically depicting a configuration of a sensor chip according to the first modification of the third embodiment of the present technology.

FIG. 32 is a cross-sectional diagram schematically depicting a configuration of the sensor chip 310 according to the first modification of the third embodiment of the present technology. As depicted in the figure by way of example, the output sides via 255 are not formed in the support substrate 250. In this case, no via penetrates the logic circuit 232 and the like, and therefore characteristics of the logic circuit 232 and the like do not change. Accordingly, a yield drop produced by characteristic changes can be reduced.

According to the first modification of the third embodiment of the present technology, as described above, the sensor chip 310 is bonded to the frame-attached substrate 421 by wire bonding. In this case, the necessity of penetration of vias through the logic circuit 232 and the like is eliminated. Accordingly, the characteristics of the logic circuit 232 and the like are not changed by penetration of vias, and therefore, a yield drop produced by the characteristic changes can be reduced.

Second Modification

According to the third embodiment described above, the light emitting element 411 is provided on the semiconductor package 200 manufactured at a wafer level. However, the light emitting element 411 can also be provided on a ceramic package mounted on a ceramic substrate. The semiconductor package 200 according to a second modification of the third embodiment is different from the semiconductor package 200 in the third embodiment in that the semiconductor package 200 is a ceramic package.

Figure 33:
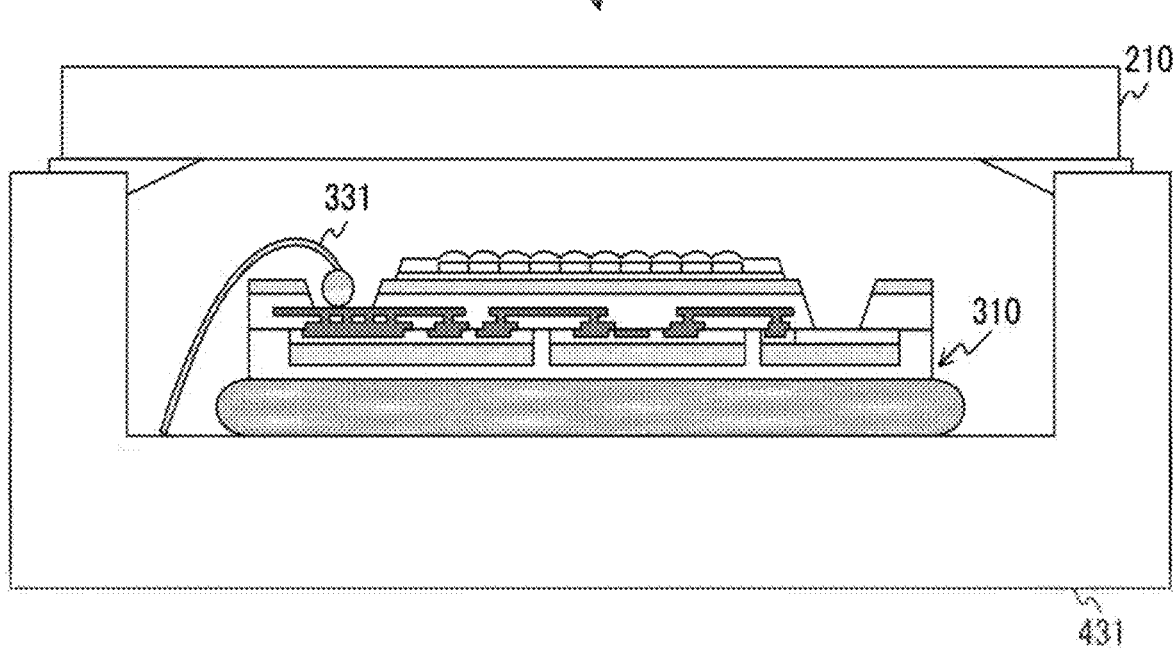
FIG. 33 is a cross-sectional diagram depicting a configuration example of a semiconductor package according to a second modification of the third embodiment of the present technology.

FIG. 33 is a cross-sectional diagram depicting a configuration example of the semiconductor package 200 according to the second modification of the third embodiment of the present technology. The semiconductor package 200 according to the second modification of the third embodiment is different from the semiconductor package 200 in the third embodiment in that a ceramic substrate 431 is further provided.

A space is provided in the ceramic substrate 431, and the sensor chip 310 is provided in this space. Moreover, this space is sealed by the glass 210. A configuration of the sensor chip 310 according to the second modification of the third embodiment is similar to the corresponding configuration of the first modification of the third embodiment. In the second modification of the third embodiment, the wiring layer 240 in the sensor chip 310 is connected to the ceramic substrate 431 through the wires 331 similarly to the first modification of the third embodiment.

According to the second modification of the third embodiment of the present technology, as described above, the light emitting element 411 is provided in the sensor chip 310 in the ceramic substrate 431. Accordingly, size reduction of a ToF module through use of the ceramic package is achievable.

Third Modification

According to the third embodiment described above, the circuit layer 230 is disposed between the solid-state imaging element 220 and the wiring layer 240. However, the wiring layer 240 can also be disposed between the solid-state imaging element 220 and the circuit layer 230. The semiconductor package 200 according to a third modification of the third embodiment is different from the semiconductor package 200 in the third embodiment in that the wiring layer 240 is disposed between the solid-state imaging element 220 and the circuit layer 230.

Figure 34:
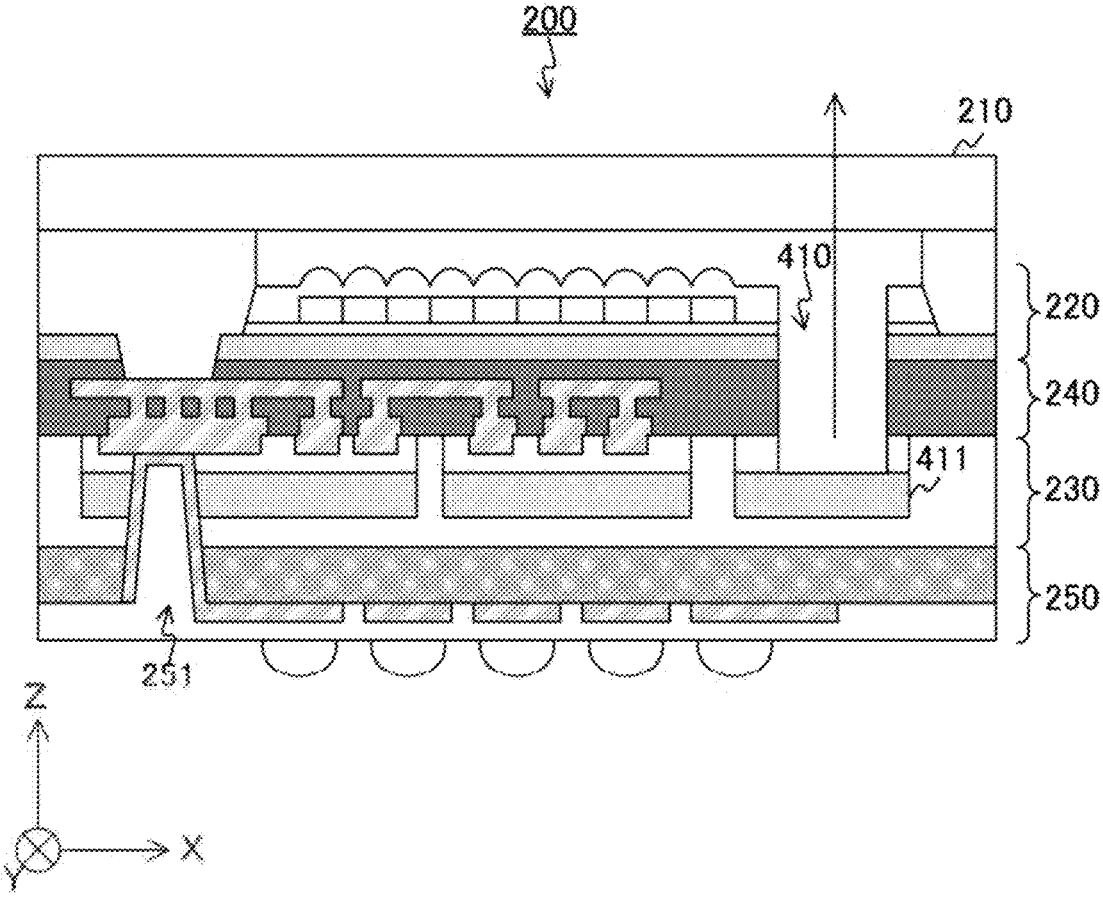
FIG. 34 is a cross-sectional diagram depicting a configuration example of a semiconductor package according to a third modification of the third embodiment of the present technology.

FIG. 34 is a cross-sectional diagram depicting a configuration example of the semiconductor package 200 according to the third modification of the third embodiment of the present technology. The semiconductor package 200 according to the third modification of the third embodiment is different from the semiconductor package 200 in the third embodiment in that the wiring layer 240 is disposed between the solid-state imaging element 220 and the circuit layer 230. Moreover, the output side via 251 in this configuration penetrates the support substrate 250 and the circuit layer 230.

Figure 35:
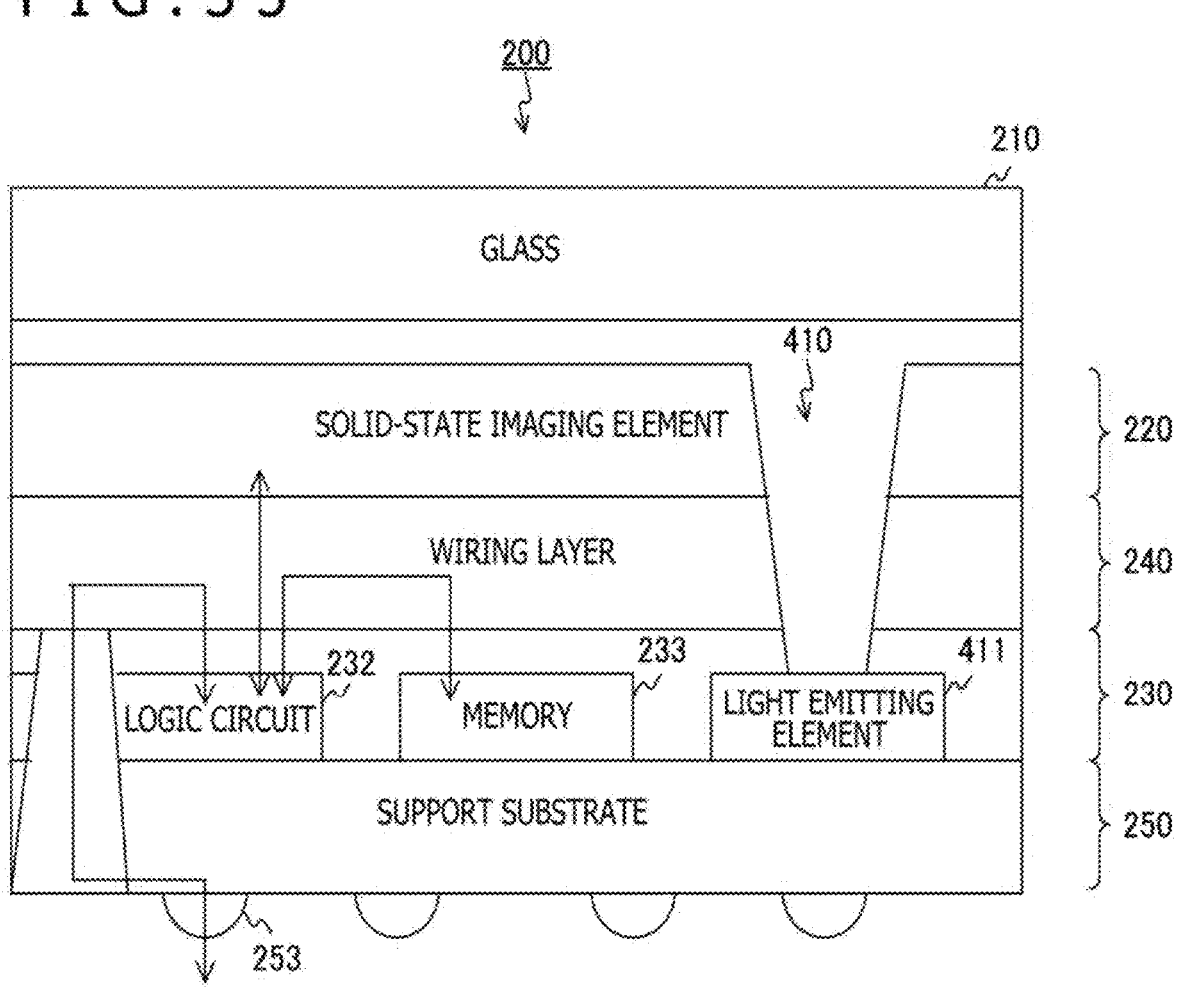
FIG. 35 is a cross-sectional diagram schematically depicting the configuration of the semiconductor package according to the third modification of the third embodiment of the present technology.

FIG. 35 is a cross-sectional diagram schematically depicting a configuration of the semiconductor package according to the third modification of the third embodiment of the present technology. As depicted in the figure by way of example, the opening 410 penetrates the solid-state imaging element 220 and the wiring layer 240 and reaches the light emitting element 411.

According to the third modification of the third embodiment of the present technology, the wiring layer 240 is disposed between the solid-state imaging element 220 and the circuit layer 230. Accordingly, irradiation light can be irradiated through the opening 410 penetrating the solid-state imaging element 220 and the wiring layer 240.

4. Fourth Embodiment

According to the first embodiment described above, the logic circuit 232 and the memory 233 are provided below the solid-state imaging element 220. In this case, however, a light emitting element needs to be equipped to achieve a function of measuring a distance through use of a ToF (Time of Flight) system. The semiconductor package 200 according to a fourth embodiment is different from the semiconductor package 200 in the first embodiment in that a light emitting element is provided.

Figure 36:
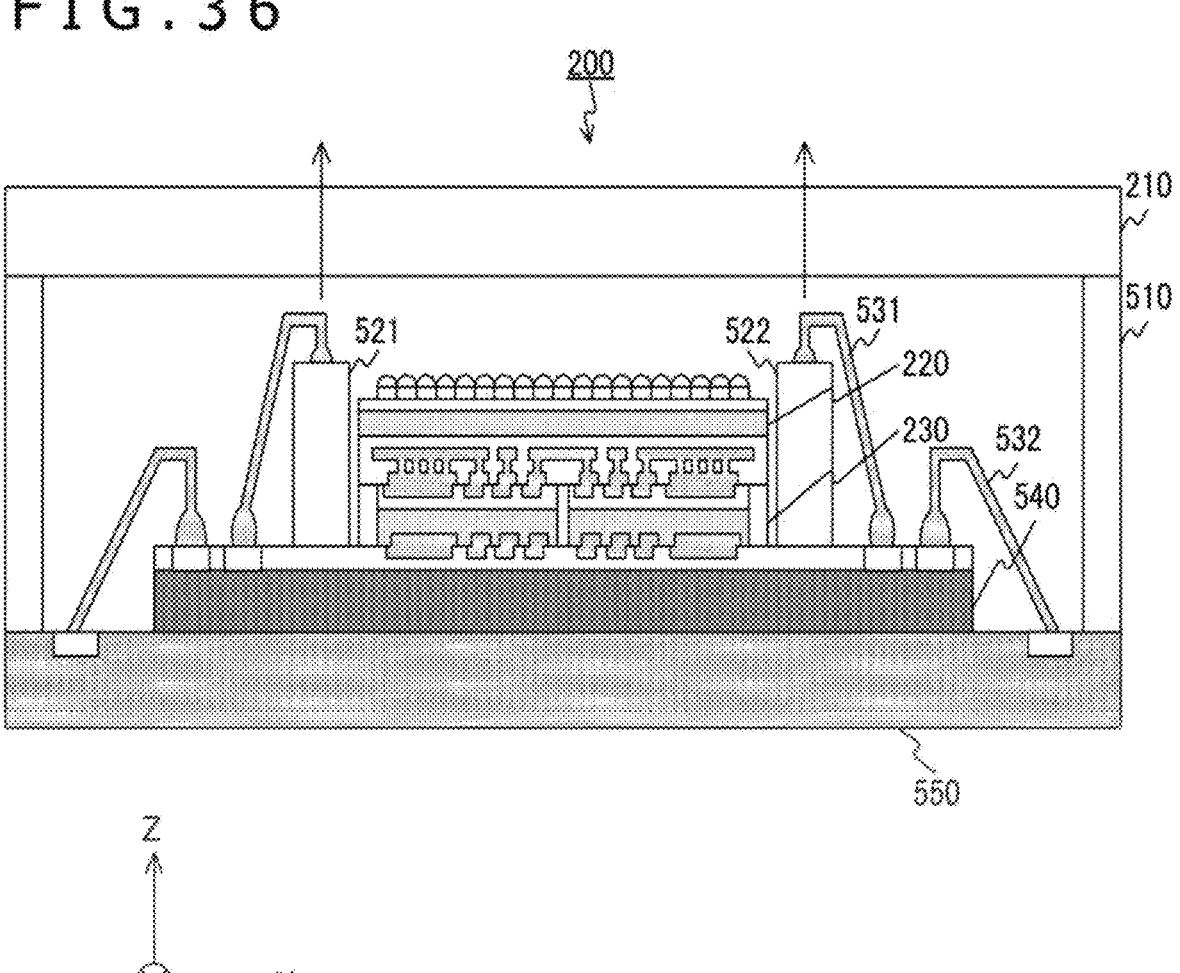
FIG. 36 is a cross-sectional diagram depicting a configuration example of a semiconductor package according to a fourth embodiment of the present technology.

FIG. 36 is a cross-sectional diagram depicting a configuration example of the semiconductor package 200 according to the fourth embodiment of the present technology. The semiconductor package 200 of the fourth embodiment further includes a frame 510, LEDs 521 and 522, and a package substrate 550. Moreover, the semiconductor package 200 includes a wiring-layer-attached support substrate 540 instead of the wiring layer 240 and the support substrate 250.

The frame 510 is provided on an outer circumference of an upper surface of the package substrate 550 on an assumption that the light reception side corresponds to the upper side. The glass 210 is bonded to an upper portion of the frame 510. Moreover, the solid-state imaging element 220, the circuit layer 230, and the wiring-layer-attached support substrate 540 are stacked on the upper surface of the package substrate 550 in this order from the upper side. For example, the package substrate 550 includes a ceramic substrate, an organic substrate, or a flexible substrate.

The wiring-layer-attached support substrate 540 is a support substrate having a wiring layer formed on an upper portion thereof. An area of the wiring-layer-attached support substrate 540 is larger than the area of each of the solid-state imaging element 220 and the circuit layer 230. Accordingly, a space is produced around the wiring-layer-attached support substrate 540. Elements and parts such as the LEDs 521 and 522 are disposed in this space. The LEDs 521 and 522 are connected to the wiring-layer-attached support substrate 540 through wires 531, while the wiring-layer-attached support substrate 540 is connected to the package substrate 550 through use of wires 532.

Each of the LEDs 521 and 522 is a light emitting element which emits light such as infrared light. Arrows in the figure indicate irradiation directions of lights from the LED 521 and the like. While the LEDs 521 and 522 are disposed on the wiring layer 240, elements or parts other than the LED 521 and the like can also be disposed thereon.

As depicted in the figure by way of example, size reduction of a ToF module through use of the semiconductor package 200 is achievable by providing the LED 521 and the like in the semiconductor package 200. Moreover, the distance between the light emitting element (solid-state imaging element 220) and the light emitting element 411 can be reduced in the X-axis direction and the Y-axis direction. In this manner, distance measurement accuracy improves.

Figure 37:
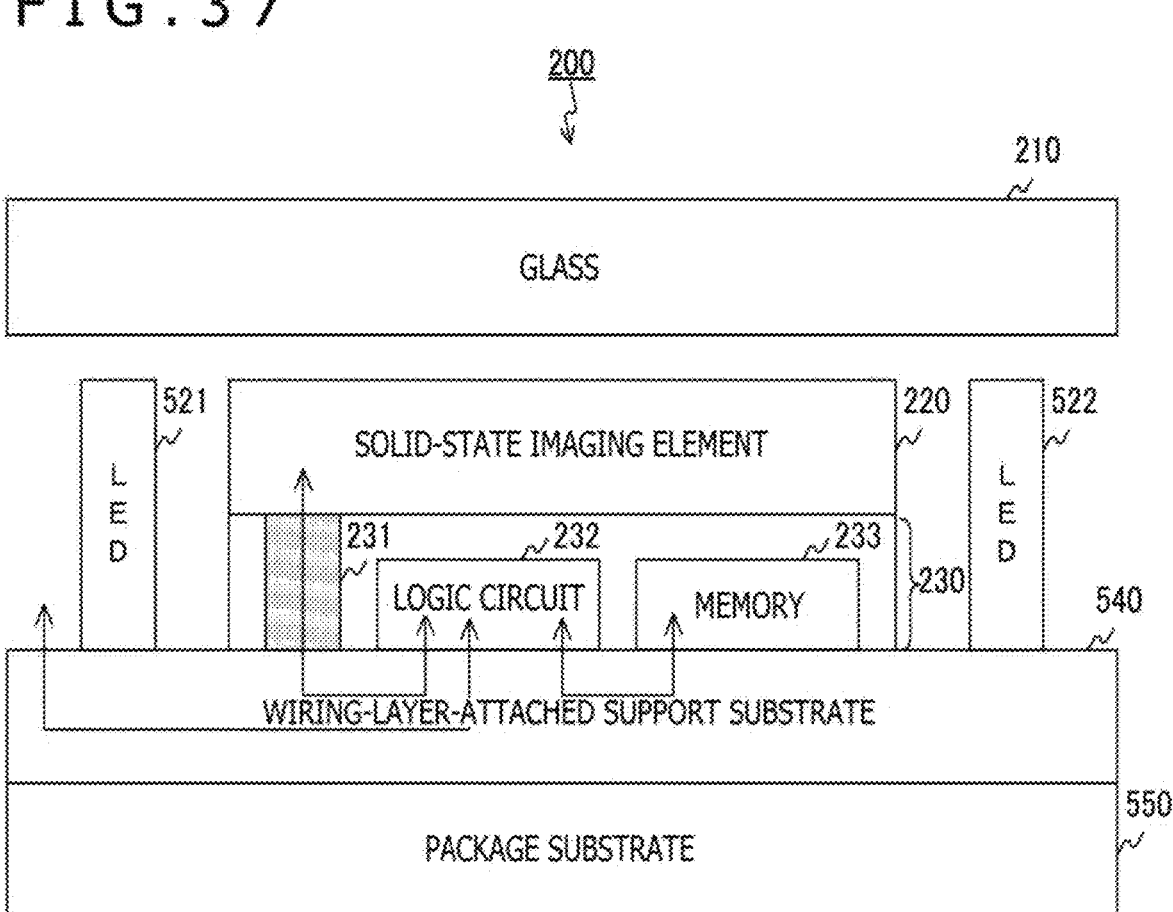
FIG. 37 is a cross-sectional diagram schematically depicting a configuration of the semiconductor package according to the fourth embodiment of the present technology.

FIG. 37 is a cross-sectional diagram schematically depicting a configuration of the semiconductor package according to the fourth embodiment of the present technology.

The logic circuit 232 irradiates an object with irradiation light by controlling the LED 521 and the like Thereafter, the solid-state imaging element 220 receives reflection light of the irradiation light, and the logic circuit 232 measures a distance to the object through use of the ToF system. The logic circuit 232 outputs measurement data thus obtained to the outside through the wires 532. Note that a control circuit outside the semiconductor package 200 can also control light emitting operations of the LED 521 and the like instead of the logic circuit 232.

Figure 38A:
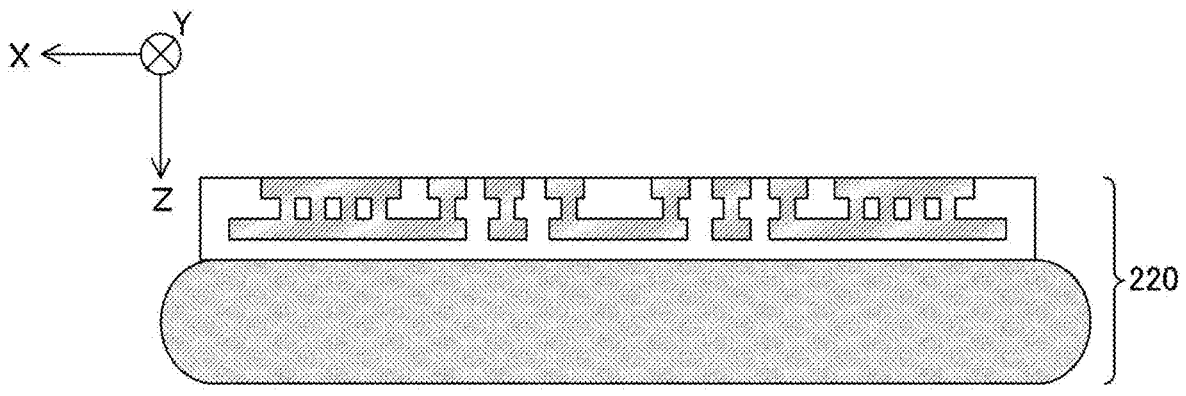
FIGS. 38A, 38B, and 38C are diagrams for explaining steps until reduction of thicknesses of a logic circuit and the like is carried out, according to the fourth embodiment of the present technology.
Figure 38B:
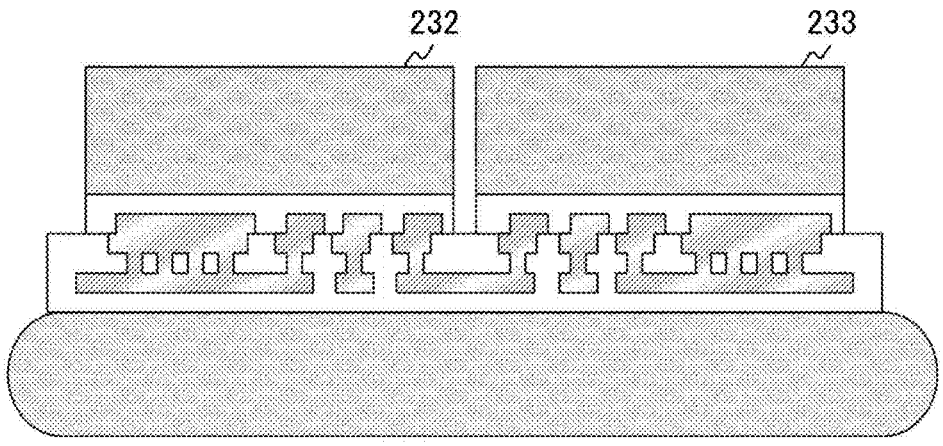
Figure 38C:
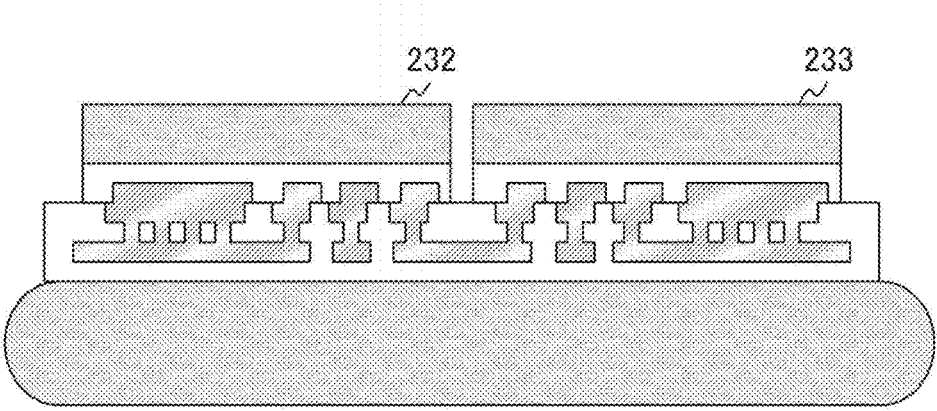

FIGS. 38A, 38B, and 38C are diagrams for explaining steps until reduction of thicknesses of the logic circuit 232 and the like is carried out according to the fourth embodiment of the present technology. FIG. 38A is a diagram for explaining a step of forming the solid-state imaging element 220. FIG. 38B for explaining a step of connecting the logic circuit 232 and the like. FIG. 38C is a diagram for explaining steps until reduction of the thicknesses of the logic circuit 232 and the like is carried out.

As depicted in FIG. 38A by way of example, the manufacturing system forms the solid-state imaging element 220 for each of chip regions in a wafer divided into a plurality of the chip regions. Thereafter, as depicted in FIG. 38B by way of example, the manufacturing system connects the logic circuit 232 and the memory 233 to the solid-state imaging element 220 by Cu—Cu bonding or other methods. Subsequently, as depicted in FIG. 38C by way of example, the manufacturing system reduces the thicknesses of the logic circuit 232 and the like as necessary.

Figure 39A:
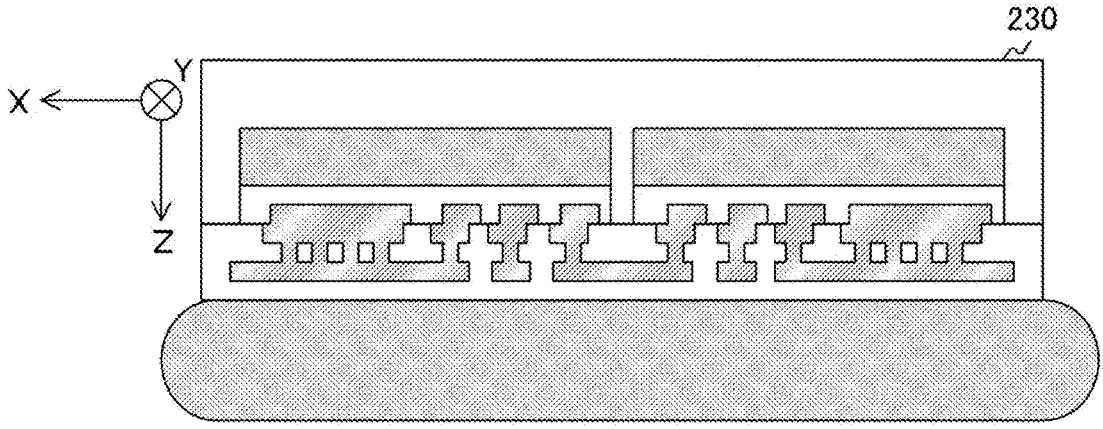
FIGS. 39A, 39B, and 39C are diagrams for explaining steps until formation of a wiring layer is carried out, according to the fourth embodiment of the present technology.
Figure 39B:
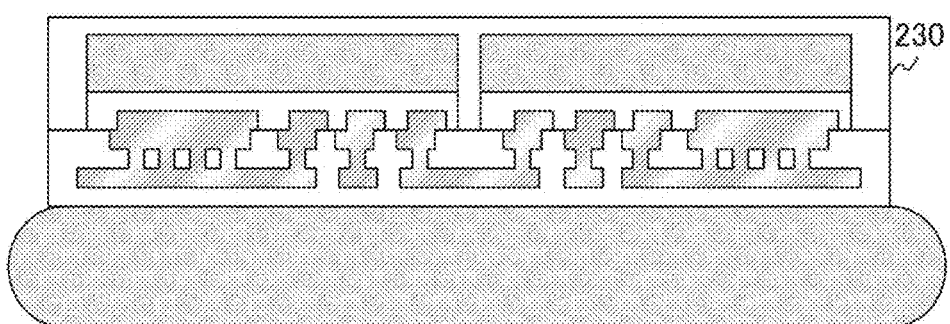
Figure 39C:
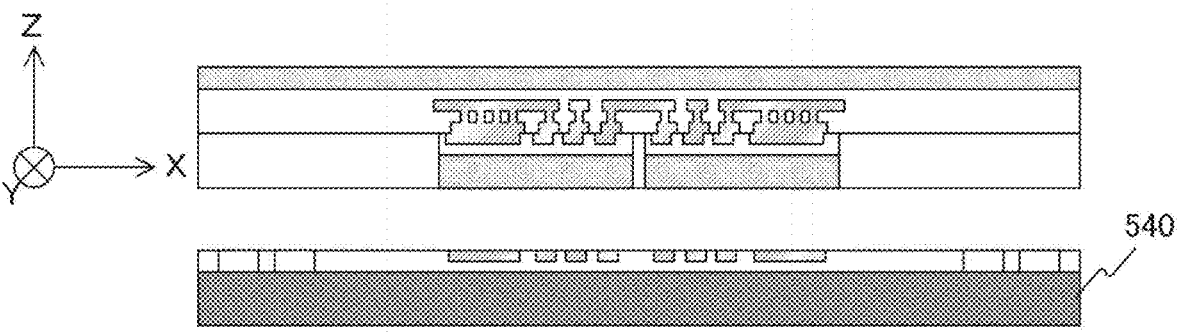

FIGS. 39A, 39B, and 39C are diagrams for explaining steps until formation of the wiring layer 240 is carried out according to the fourth embodiment of the present technology. FIG. 39A is a diagram for explaining a step of embedding the logic circuit 232 and the like in an insulation film. FIG. 39B is a diagram for explaining a step of flattening the circuit layer. FIG. 39C is a diagram for explaining a step of forming the wiring layer.

As depicted in FIG. 39A by way of example, the manufacturing system embeds the logic circuit 232 and the like in the insulation film to form the circuit layer 230. Thereafter, as depicted in FIG. 39B by way of example, the manufacturing system flattens the circuit layer 230. Subsequently, as depicted in FIG. 39C, the manufacturing system forms the wiring layer on the upper portion of the support substrate to produce the wiring-layer-attached support substrate 540.

Figure 40A:
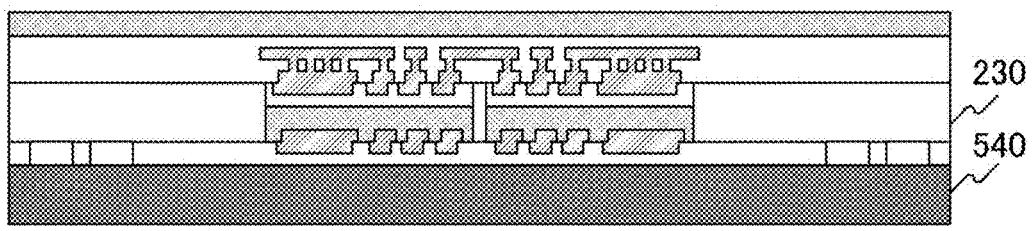
FIGS. 40A and 40B are diagrams for explaining steps until formation of a color filter and an on-chip lens is carried out, according to the fourth embodiment of the present technology.
Figure 40B:
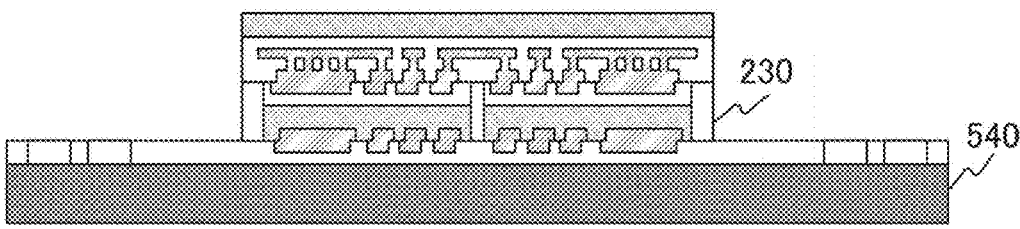
Figure 40C:
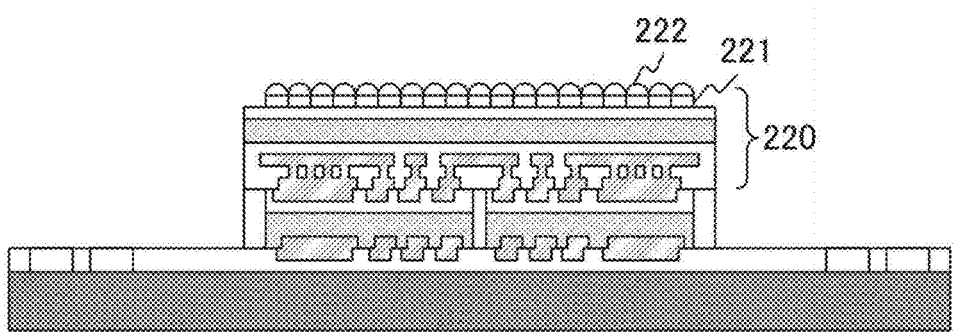

FIGS. 40A, 40B, and 40C are diagrams for explaining steps until formation of the color filter and the on-chip lens is carried out according to the fourth embodiment of the present technology. FIG. 40A is a diagram for explaining a step of connecting the wiring-layer-attached support substrate 540. FIG. 40B is a diagram for explaining a step of forming an opening reaching the wiring-layer-attached support substrate 540. FIG. 40C is a diagram for explaining steps until forming a color filter and an on-chip lens is carried out.

As depicted in FIG. 40A by way of example, the manufacturing system connects the solid-state imaging element 220 and the circuit layer 230 to the wiring-layer-attached support substrate 540 by Cu—Cu bonding. Thereafter, as depicted in FIG. 40B by way of example, the manufacturing system forms an opening reaching the wiring-layer-attached support substrate 540 and located in the solid-state imaging element 220 and the circuit layer 230 around the central portion where the circuits are formed. Subsequently, as depicted in FIG. 40C, the manufacturing system forms the plurality of pixels 221 on the solid-state imaging element 220, and forms the color filter (not depicted) and the on-chip lens 222 for each of the pixels 221.

FIGS. 41A and 41B are diagrams for explaining steps until wire bonding is carried out according to the fourth embodiment of the present technology. FIG. 41A is a diagram for explaining a step of forming the LEDs 521 and 522. FIG. 41B is a diagram for explaining a step of wire bonding.

As depicted in FIG. 41A by way of example, the manufacturing system forms the LEDs 521 and 522 on the upper surface of the wiring-layer-attached support substrate 540 around the solid-state imaging element 220 and the circuit layer 230. Thereafter, as depicted in FIG. 41B by way of example, the manufacturing system connects the LED 521 and the like to the wiring-layer-attached support substrate 540 through the wires 531, and connects the wiring-layer-attached support substrate 540 to the package substrate 550 through the wires 532.

Thereafter, the manufacturing system forms the frame 510 on the outer circumference of the upper surface of the package substrate 550, bonds the glass 210 to an upper part of the frame 510, and performs dicing.

According to the fourth embodiment of the present technology, as described above, the LED 521 and the like are provided on the wiring-layer-attached support substrate 540 in the semiconductor package 200. Accordingly, size reduction of a ToF module, and improvement of distance measurement accuracy are achievable.

First Modification

While the LED 521 and the like are provided on the wiring-layer-attached support substrate 540 in the fourth embodiment described above, laser diodes can also be provided instead of the LED 521 and the like. The semiconductor package 200 according to a first modification of the fourth embodiment is different from the semiconductor package 200 in the fourth embodiment in that laser diodes are provided on the wiring-layer-attached support substrate 540.

FIG. 42 is a cross-sectional diagram depicting a configuration example of the semiconductor package 200 according to the first modification of the fourth embodiment of the present technology. The semiconductor package 200 according to the first modification of the fourth embodiment is different from the semiconductor package 200 in the fourth embodiment in that laser diodes 523 and 524 are provided instead of the LEDs 521 and 522.

According to the fourth embodiment of the present technology, as described above, the laser diode 523 and the like are provided on the wiring-layer-attached support substrate 540 in the semiconductor package 200. Accordingly, size reduction of a ToF module, and improvement of distance measurement accuracy are achievable.

Second Modification

While the LED 521 and the like are provided on the wiring-layer-attached support substrate 540 in the fourth embodiment described above, a circuit or a part other than an LED can also be added. The semiconductor package 200 according to a first modification of the fourth embodiment is different from the semiconductor package 200 in the fourth embodiment in that an additional circuit and an additional part are provided on the wiring-layer-attached support substrate 540.

Figure 43:
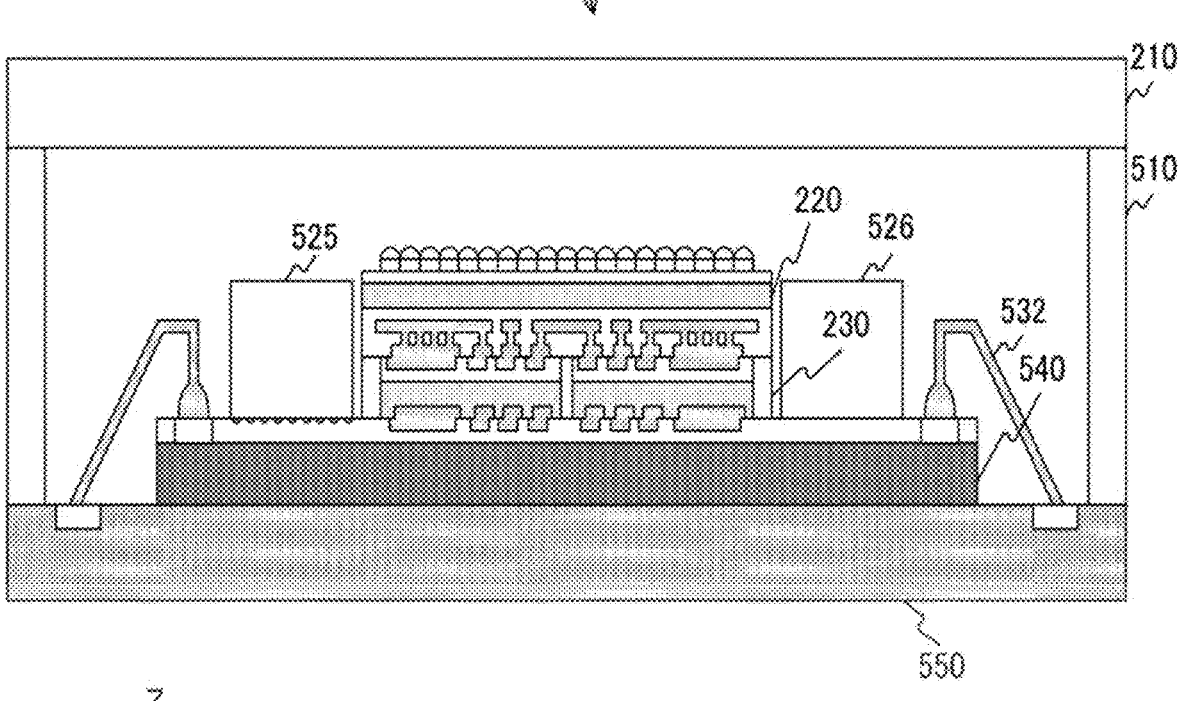
FIG. 43 is a cross-sectional diagram depicting a configuration example of a semiconductor package according to a second modification of the fourth embodiment of the present technology.

FIG. 43 is a cross-sectional diagram depicting a configuration example of the semiconductor package 200 according to the second modification of the fourth embodiment of the present technology. The semiconductor package 200 according to the second modification of the fourth embodiment is different from the semiconductor package 200 in the fourth embodiment in that a logic circuit 525 and an active part 526 are provided instead of the LEDs 521 and 522.

A component not enduring a high-temperature step of a wafer is allowed to be mounted to constitute each of the logic circuit 525 and the active part 526. Improvement of the function of the semiconductor package 200 is achievable by adding the logic circuit 525 and the like.

Note that an additional memory can also be provided instead of the logic circuit 525. For example, an HMC (Hybrid Memory Cube) is adopted as the memory. Moreover, a passive part can also be provided instead of the active part 526.

Note that each of the LED 521, the LED 522, the laser diode 523, the laser diode 524, the logic circuit 525, and the active part 526 is an example of an additional circuit included in the claims.

Furthermore, a method for connecting these additional circuits to the wiring-layer-attached support substrate 540 is not limited to a particular method. For example, the additional circuits can be connected by solder connection, conductive wire connection, or connection through use of conductive material.

Figure 44A:
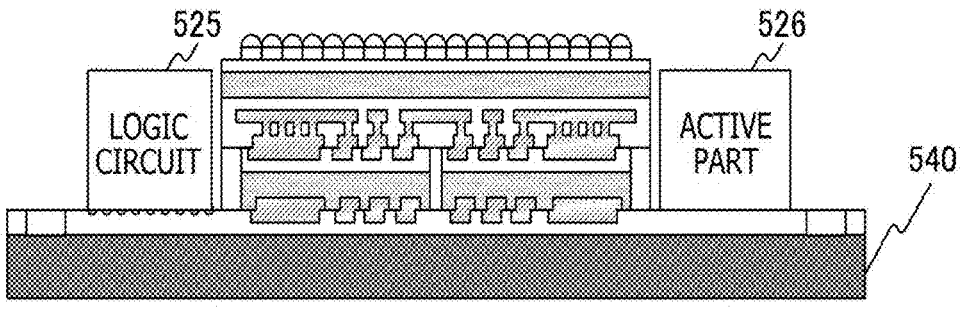
FIGS. 44A and 44B are diagrams for explaining steps until wire bonding according to the second modification of the fourth embodiment of the present technology.
Figure 44B:
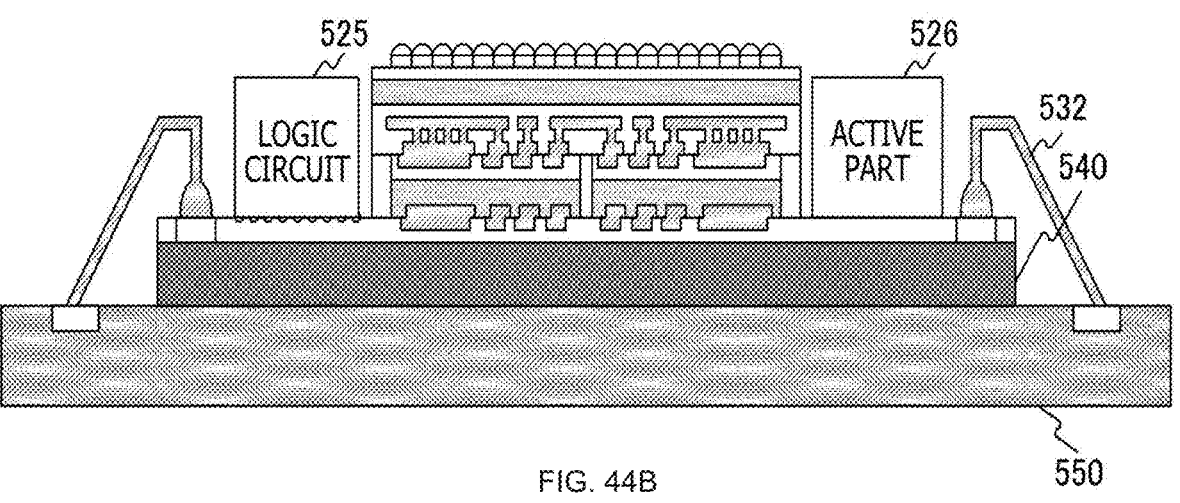

FIGS. 44A and 44B are diagrams for explaining steps until wire bonding is carried out according to the second modification of the fourth embodiment of the present technology. FIG. 44A is a diagram for explaining a step of forming the logic circuit 525 and the active part 526. FIG. 44B is a diagram for explaining a step of wire bonding.

The steps in FIGS. 38A, 38B, 38C, 39A, 39B, 39C, 40A, and 40B are performed also in the second modification of the fourth embodiment similarly to the fourth embodiment. In addition, as depicted in FIG. 44A by way of example, the manufacturing system forms the logic circuit 525 and the active part 526 around the solid-state imaging element 220 and the circuit layer 230 on the upper surface of the wiring-layer-attached support substrate 540. Thereafter, as depicted in FIG. 44B by way of example, the manufacturing system connects the wiring-layer-attached support substrate 540 to the package substrate 550 through use of the wires 532.

According to the second modification of the fourth embodiment of the present technology, as described above, the additional logic circuit 525 and the additional active part 526 are provided on the wiring-layer-attached support substrate 540. Accordingly, the function of the semiconductor package 200 improves.

Third Modification

According to the second modification of the fourth embodiment, as described above, the logic circuit 525 and the active part 526 are formed and connected to the wiring-layer-attached support substrate 540 through use of the wires 532. It is preferable, however, that these component are sealed by resin in view of reliability and handling. The semiconductor package 200 according to a third modification of the fourth embodiment is different from the semiconductor package 200 in the second modification of the fourth embodiment in that the logic circuit 525 and the like and the wires 532 are embedded in sealing resin.

Figure 45:
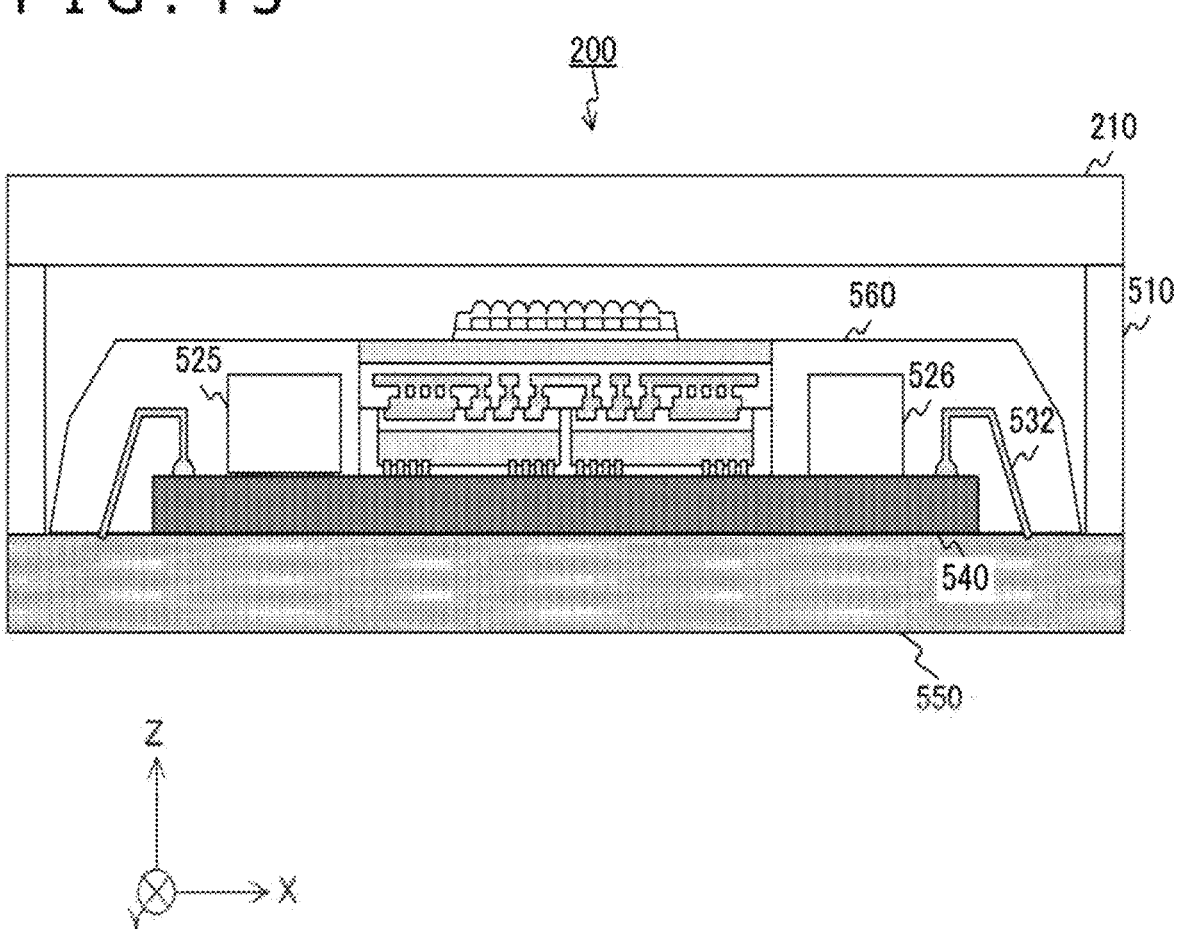

FIG. 45 is a cross-sectional diagram depicting a configuration example of the semiconductor package 200 according to the third modification of the fourth embodiment of the present technology. The semiconductor package 200 according to the third modification of the fourth embodiment is different from the semiconductor package 200 in the second modification of the fourth embodiment in that the logic circuit 525, the active part 526, and the wires 532 are embedded in sealing resin 560. In this manner, improvement of reliability and handling easiness of the semiconductor package 200 are achievable.

According to the third modification of the fourth embodiment of the present technology, as described above, the logic circuit 525 and the like are embedded in the sealing resin 560. Accordingly, improvement of reliability and handling easiness of the semiconductor package 200 are achievable.

Fourth Modification

While the glass 210 is disposed on the upper part of the light reception surface of the solid-state imaging element 220 in the second modification of the fourth embodiment described above, transparent resin can also be provided instead of the glass 210. The semiconductor package 200 according to a fourth modification of the fourth embodiment is different from the semiconductor package 200 in the second modification of the fourth embodiment in that the light reception surface of the solid-state imaging element 220 is protected by transparent resin.

FIG. 46 is a cross-sectional diagram depicting a configuration example of the semiconductor package 200 according to the fourth modification of the fourth embodiment of the present technology. The semiconductor package 200 according to the fourth modification of the fourth embodiment is different from the semiconductor package 200 in the second modification of the fourth embodiment in that transparent resin 570 is formed instead of the frame 510 and the glass 210.

The transparent resin 570 is transparent resin which protects the light reception surface of the solid-state imaging element 220. By protecting the light reception surface with the transparent resin 570, more size reduction of the semiconductor package 200 in the Z-axis direction (i.e., thickness) is achievable than that size in the case where the glass 210 is provided.

According to the fourth modification of the fourth embodiment of the present technology, as described above, the light reception surface of the solid-state imaging element 220 is protected through use of the transparent resin 570. Accordingly, further reduction of the thickness of the semiconductor package 200 is achievable.

Fifth Modification

While the glass 210 is disposed on the upper part of the solid-state imaging element 220 with the frame 510 interposed therebetween in the second modification of the fourth embodiment described above, the glass can also be disposed with ribs interposed therebetween. The semiconductor package 200 according to a fifth modification of the fourth embodiment is different from the semiconductor package 200 in the second modification of the fourth embodiment in that ribs and glass are provided.

Figure 47:
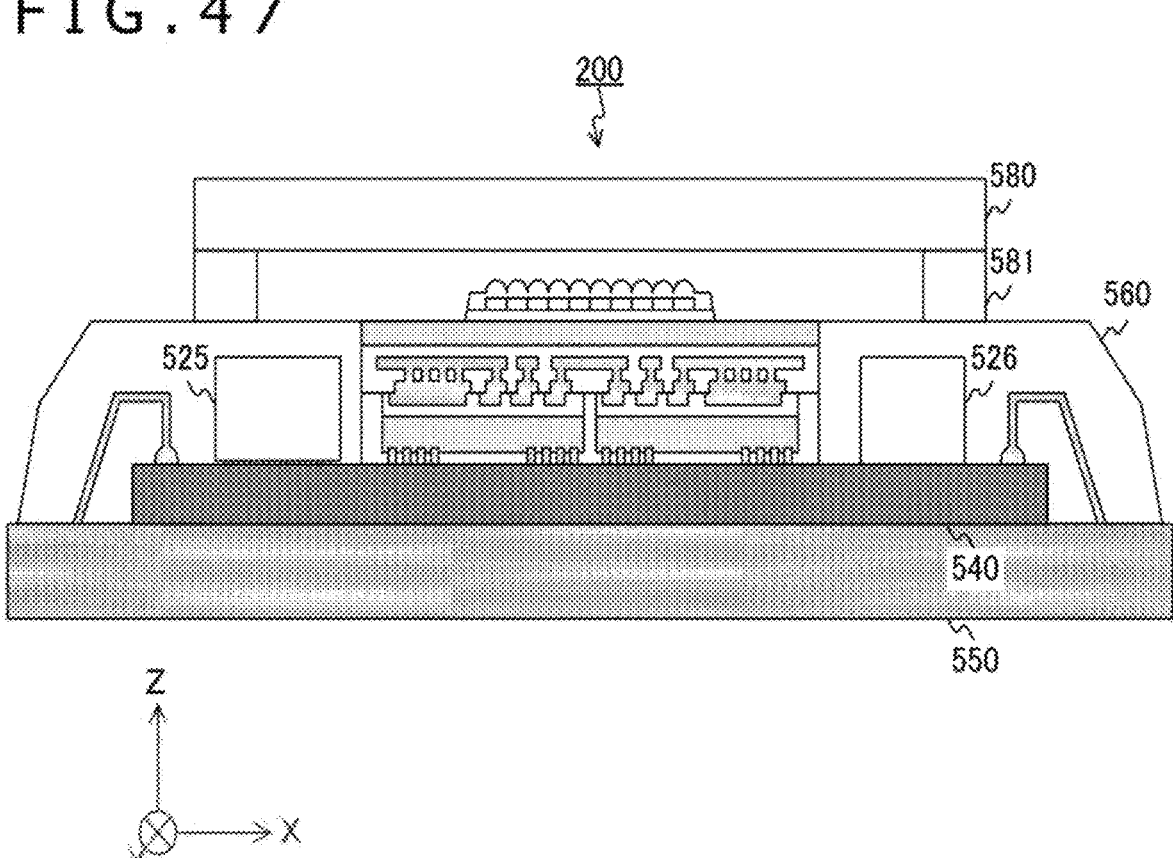

FIG. 47 is a cross-sectional diagram depicting a configuration example of the semiconductor package 200 according to the fifth modification of the fourth embodiment of the present technology. The semiconductor package 200 according to the fifth modification of the fourth embodiment is different from the semiconductor package 200 in the second modification of the fourth embodiment in that ribs 581 and AR (Anti Reflection)-coated seal glass 580 are provided instead of the frame 510 and the glass 210.

The ribs 581 are attached to the sealing resin 560. Moreover, the AR-coated seal glass 580 is connected to the sealing resin 560 with the ribs 581 interposed therebetween. The light reception surface of the solid-state imaging element 220 is protected by the AR-coated seal glass 580.

Note that the AR-coated seal glass 580 is an example of glass included in the claims.

According to the fifth modification of the fourth embodiment of the present technology, as described above, the AR-coated seal glass 580 is connected to the sealing resin 560 with the ribs 581 interposed therebetween. Accordingly, protection of the light reception surface of the solid-state imaging element 220 is achievable.

Application Example to Mobile Body

The technology according to the present disclosure (present technology) is applicable to various types of products. For example, the technology according to the present disclosure may be implemented in the form of a device mounted on a mobile body of any type such as a vehicle, an electric vehicle, a hybrid electric car, a motorcycle, a bicycle, a personal mobility, an airplane, a drone, a vessel, and a robot.

Figure 48:
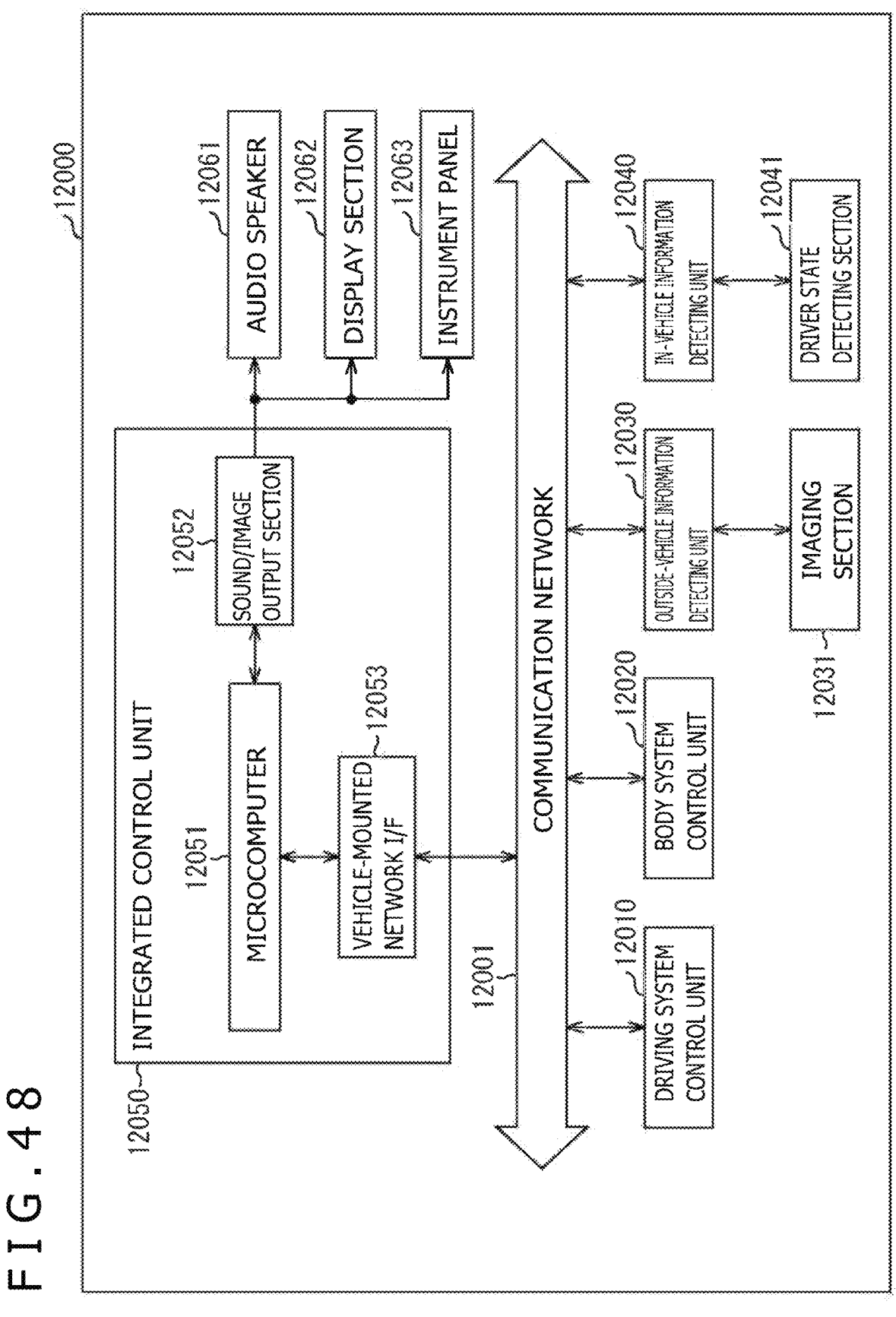

FIG. 48 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 48, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 48, an audio speaker 12061, a display section 12062, and an instrument panel 12063 are illustrated as the output device. The display section 12062 may, for example, include at least one of an on-board display and a head-up display.

Figure 49:
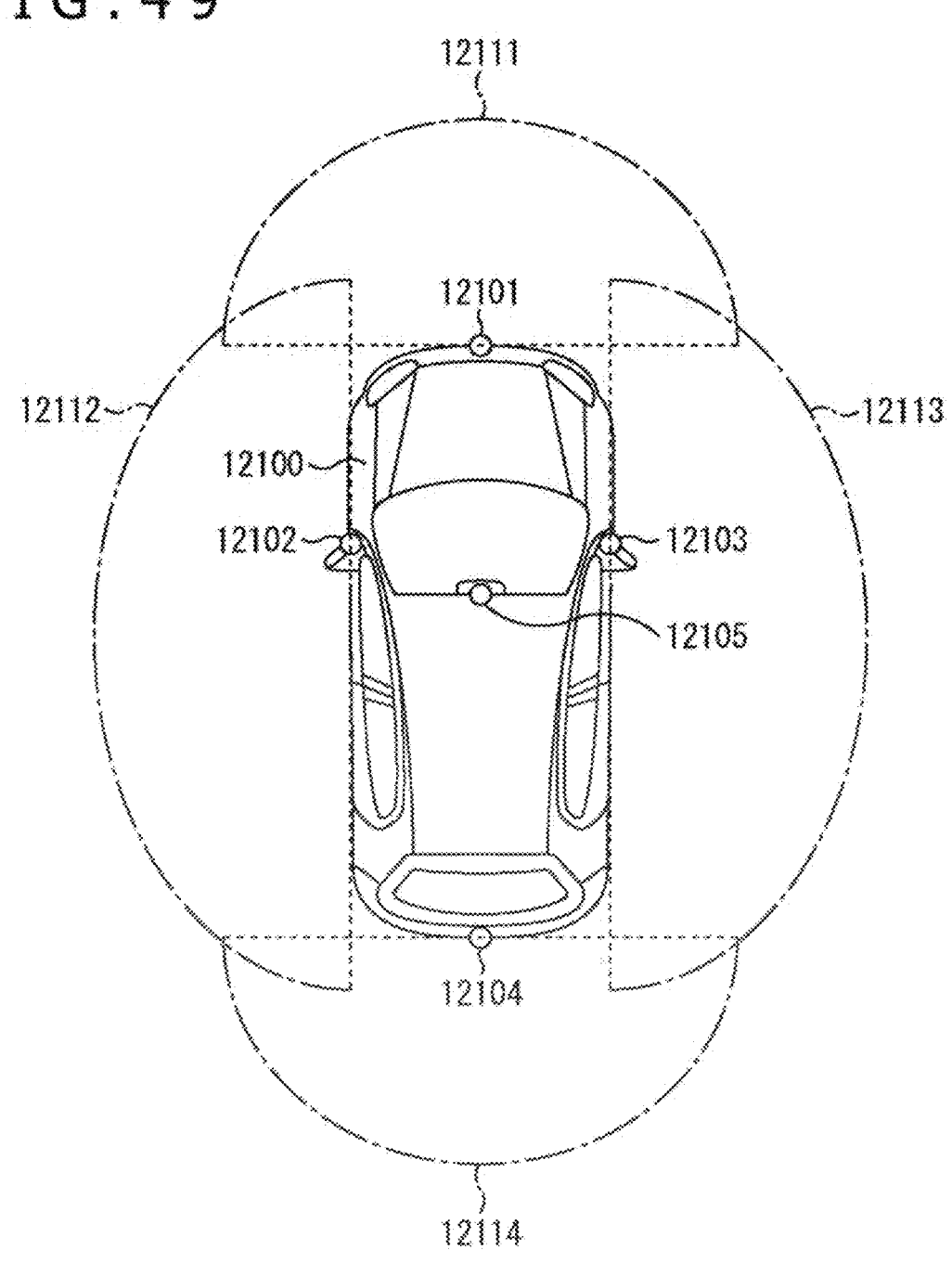

FIG. 49 is a diagram depicting an example of the installation position of the imaging section 12031.

In FIG. 49, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 49 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 in the configuration described above, for example. Specifically, the semiconductor package 200 in FIG. 2 is applicable to the imaging section 12031. A yield can be raised by applying the technology according to the present disclosure to the imaging section 12031. Accordingly, cost reduction of the system is achievable.

Note that the embodiments described above have been presented by way of example for a purpose of embodying the present technology. Accordingly, the matters described in the embodiments and the inventive specific matters included in the claims have correspondence relations with each other. Similarly, the inventive specific matters included in the claims, and the matters described in the embodiments of the present technology and having names identical to the names of the corresponding inventive specific matters have correspondence relations with each other. However, the present technology is not limited to the embodiments, but can be embodied by modifying the embodiments in various manners without departing from the subject matters of the present technology.

Moreover, the processing procedures described in the above embodiments may be considered as a method having a series of these procedures, or may be considered as a program under which a computer executes the series of the procedures, or as a recording medium storing this program. For example, a CD (Compact Disc), an MD (MiniDisc), a DVD (Digital Versatile Disc), a memory card, a Blu-ray Disc (Blu-ray (registered trademark) Disc), or the like may be employed as this recording medium.

Note that advantageous effects to be produced are not limited to those described in the present specification presented only by way of example. In addition, other advantageous effects may be produced.

Note that the present technology can have following configurations.

(1)

A semiconductor package including:

a solid-state imaging element which generates image data;

a circuit layer in which a signal processing circuit that performs predetermined signal processing on the image data is disposed;

a support substrate through which an output side via penetrates, one end of the output side via being connected to an external terminal; and a wiring layer disposed between the support substrate and the circuit layer and in which a signal line that connects the signal processing circuit and the other end of the output side via is wired.

(2)

The semiconductor package according to (1) described above, further including:

glass; and a resin dam formed in a light reception surface of the solid-state imaging element between a periphery of a pixel array unit and the glass.

(3)

The semiconductor package according to (1) described above, further including:

glass; and transparent resin filled between the solid-state imaging element and the glass.

(4)

The semiconductor package according to any one of (1) to (3) described above, in which the output side via is disposed in a surface of the support substrate in a region corresponding to the signal processing circuit and in a region not corresponding to the signal processing circuit.

(5)

The semiconductor package according to (1) described above, further including:

a ceramic substrate, in which the output side via penetrates the support substrate and the ceramic substrate.

(6)

The semiconductor package according to (1) described above, in which an embedded element is further disposed in the circuit layer, and an opening penetrating from a light reception surface of the solid-state imaging element to the embedded element is formed in the solid-state imaging element and the circuit layer.

(7)

A semiconductor package including:

a solid-state imaging element which generates image data and inputs the image data to one end of an input side via;

a wiring layer in which a signal line that connects a signal processing circuit performing predetermined signal processing on the image data and the other end of the input side via is wired; and a circuit layer disposed between the solid-state imaging element and the wiring layer and in which the input side via and the signal processing circuit are provided.

(8)

The semiconductor package according to (7) described above, further including:

a ceramic substrate through which an output side via one end of which is connected to an external terminal penetrates.

(9)

The semiconductor package according to (8) described above, in which the ceramic substrate and the wiring layer are connected to each other with a wire.

(10)

The semiconductor package according to (8) described above, in which the ceramic substrate and the wiring layer are connected to each other with a bump.

(11)

The semiconductor package according to (7) described above, further including:

glass;

spacer resin formed between a periphery of a pixel array unit of the solid-state imaging element and the glass; and an interposer, in which the interposer and the wiring layer are connected to each other with a wire.

(12)

The semiconductor package according to (7) described above, further including:

a rewiring layer in which a signal line that connects a bonding bump and an external terminal is wired, in which the wiring layer is connected to the rewiring layer with the bump.

(13)

The semiconductor package according to (7) described above, further including:

a frame; and an interposer bonded to the frame, in which the interposer and the wiring layer are connected to each other with a wire.

(14)

The semiconductor package according to (7) described above, in which an embedded element is further disposed in the circuit layer, and an opening penetrating from a light reception surface of the solid-state imaging element to the embedded element is formed in the solid-state imaging element and the circuit layer.

(15)

The semiconductor package according to (14) described above, further including:

a frame-attached substrate that has a frame on an outer circumference of the frame-attached substrate, in which the wiring layer and the frame-attached substrate are connected to each other with a wire.

(16)

The semiconductor package according to (14) described above, further including:

a ceramic substrate, in which the ceramic substrate and the wiring layer are connected to each other with a wire.

(17)

The semiconductor package according to (7) described above, further including:

an additional circuit provided on a light reception side surface of the wiring layer.

(18)

The semiconductor package according to (17) described above, in which the additional circuit is embedded in sealing resin.

(19)

The semiconductor package according to (18) described above, further including:

transparent resin which protects a light reception surface of the solid-state imaging element.

(20)

The semiconductor package according to (18) described above, further including:

glass connected to the sealing resin with a rib interposed between the sealing resin and the glass.

REFERENCE SIGNS LIST

100: Electronic device
110: Optical unit
120: DSP (Digital Signal Processing) circuit
130: Display unit
140: Operation unit
150: Bus
160: Frame memory
170: Storage unit
180: Power source unit
200: Semiconductor package
210: Glass
220: Solid-state imaging element
221: Pixel
222: On-chip lens
230: Circuit layer
231, 234: Input side via
232, 525: Logic circuit
233: Memory
240: Wiring layer
241, 243, 244, 245: Pad
242: Signal line
250: Support substrate
251, 254, 255, 321: Output side via
252, 322, 351: Rewiring
253, 365, 371: External terminal
261: Resin dam
262: Cavity
263, 570: Transparent resin
310: Sensor chip
320, 431: Ceramic substrate
331, 531, 532: Wire
341: Mold resin
342: Potting resin
343: Spacer resin
344: Adhesive
345: Interposer
352: Seal ring 353, 381: Bump
354: Rewiring layer
361, 363: Seal agent
362, 510: Frame
364: Ceramic interposer
410: Opening
411: Light emitting element
421: Frame-attached substrate
521, 522: LED
523, 524: Laser diode
526: Active part
540: Wiring-layer-attached support substrate
550: Package substrate
560: Sealing resin
580: AR-coated seal glass
581: Rib
12031: Imaging section

The invention claimed is:

1. A semiconductor package, comprising:

a solid-state imaging element configured to generate image data;

a circuit layer including a signal processing circuit, wherein the signal processing circuit is configured to process the image data;

a support substrate including an output side via, wherein the output side via penetrates through the support substrate, the output side via includes a first end and a second end, the first end is opposite to the second end, and the first end of the output side via is connected to an external terminal;

a wiring layer, including a signal line, between the support substrate and the circuit layer, wherein the signal line is configured to connect the signal processing circuit and the second end of the output side via; and a pad inside the wiring layer, wherein the second end of the output side via is connected, via the pad, to the signal line.

2. The semiconductor package according to claim 1, further comprising:

a glass on the solid-state imaging element, wherein the solid-state imaging element includes a light reception surface;

a pixel array unit on the solid-state imaging element; and a resin dam in the light reception surface of the solid-state imaging element, wherein the resin dam is between a periphery of the pixel array unit and the glass.

3. The semiconductor package according to claim 1, further comprising:

a glass; and a transparent resin between the solid-state imaging element and the glass.

4. The semiconductor package according to claim 1, wherein the support substrate includes a first region and a second region, the first region is associated with the signal processing circuit, the second region is outside the first region, and the output side via is in each of the first region and the second region.

5. The semiconductor package according to claim 1, further comprising a ceramic substrate, wherein the output side via penetrates the support substrate and the ceramic substrate.

6. The semiconductor package according to claim 1, wherein an embedded element is further in the circuit layer, and an opening penetrating from a light reception surface of the solid-state imaging element to the embedded element is in the solid-state imaging element and the circuit layer.

7. A semiconductor package, comprising:

a circuit layer including:

a signal processing circuit; and an input side via, wherein the input side via includes a first end and a second end, and the first end is opposite to the second end;

a solid-state imaging element configured to:

generate image data; and input the image data to the first end of the input side via; and a wiring layer including a signal line, wherein the second end of the input side via is connected, via the signal line, to the signal processing circuit, the signal processing circuit is configured to execute a signal processing operation on the image data, and the circuit layer is between the solid-state imaging element and the wiring layer.

8. The semiconductor package according to claim 7, further comprising a ceramic substrate through which an output side via one end of which is connected to an external terminal penetrates.

9. The semiconductor package according to claim 8, wherein the ceramic substrate and the wiring layer are connected to each other with a wire.

10. The semiconductor package according to claim 8, wherein the ceramic substrate and the wiring layer are connected to each other with a bump.

11. The semiconductor package according to claim 7, further comprising:

a glass;

a spacer resin between a periphery of a pixel array unit of the solid-state imaging element and the glass; and an interposer, wherein the interposer and the wiring layer are connected to each other with a wire.

12. The semiconductor package according to claim 7, further comprising a rewiring layer in which a signal line that connects a bonding bump and an external terminal is wired, wherein the wiring layer is connected to the rewiring layer with the bump.

13. The semiconductor package according to claim 7, further comprising:

a frame; and an interposer bonded to the frame, wherein the interposer and the wiring layer are connected to each other with a wire.

14. The semiconductor package according to claim 7, wherein an embedded element is further in the circuit layer, and an opening penetrating from a light reception surface of the solid-state imaging element to the embedded element is in the solid-state imaging element and the circuit layer.

15. The semiconductor package according to claim 14, further comprising a frame-attached substrate that has a frame on an outer circumference of the frame-attached substrate, wherein the wiring layer and the frame-attached substrate are connected to each other with a wire.

16. The semiconductor package according to claim 14, further comprising a ceramic substrate, wherein the ceramic substrate and the wiring layer are connected to each other with a wire.

17. The semiconductor package according to claim 7, further comprising an additional circuit on a light reception side surface of the wiring layer.

18. The semiconductor package according to claim 17, wherein the additional circuit is embedded in sealing resin.

19. The semiconductor package according to claim 18, further comprising a transparent resin which protects a light reception surface of the solid-state imaging element.

20. The semiconductor package according to claim 18, further comprising a glass connected to the sealing resin with a rib interposed between the sealing resin and the glass.

21. The semiconductor package according to claim 7, wherein the input side via penetrates a portion of the circuit layer, and the portion excludes the signal processing circuit.

* * * * *